(12) United States Patent
Ahmed et al.

(10) Patent No.: US 10,923,648 B2
(45) Date of Patent: Feb. 16, 2021

(54) MEMORY CELL, MEMORY ARRAY, METHOD OF FORMING AND OPERATING MEMORY CELL

(71) Applicant: Agency for Science, Technology and Research, Singapore (SG)

(72) Inventors: Karim Ali Abdeltawwab Ahmed, Singapore (SG); Sunny Yan Hwee Lua, Singapore (SG); Fei Li, Singapore (SG)

(73) Assignee: Agency for Science, Technology and Research, Singapore (SG)

( * ) Notice: Subject to any disclaimer, the term of this patent is extended or adjusted under 35 U.S.C. 154(b) by 0 days.

(21) Appl. No.: 16/478,195

(22) PCT Filed: Jan. 17, 2018

(86) PCT No.: PCT/SG2018/050027
§ 371 (c)(1),
(2) Date: Jul. 16, 2019

(87) PCT Pub. No.: WO2018/136003
PCT Pub. Date: Jul. 26, 2018

(65) Prior Publication Data
US 2019/0334080 A1 Oct. 31, 2019

(30) Foreign Application Priority Data
Jan. 17, 2017 (SG) ............... 10201700357U

(51) Int. Cl.
*G11C 11/00* (2006.01)
*H01L 43/02* (2006.01)
(Continued)

(52) U.S. Cl.
CPC ............ *H01L 43/02* (2013.01); *G11C 11/161* (2013.01); *G11C 11/1655* (2013.01);
(Continued)

(58) Field of Classification Search
CPC ... H01L 43/02; G11C 11/161; G11C 11/1655; G11C 11/1657
(Continued)

(56) References Cited

U.S. PATENT DOCUMENTS 6,985,385 B2 * 1/2006 Nguyen ................. B82Y 25/00
257/E43.004
7,078,244 B2 7/2006 Nickel et al.
(Continued)

FOREIGN PATENT DOCUMENTS

CN 104778966 A 7/2015
CN 104778967 A 7/2015
(Continued)

OTHER PUBLICATIONS

International Search Report for International Application No. PCT/SG2018/050027 dated Apr. 11, 2018, pp. 1-4.
(Continued)

*Primary Examiner* — Vu A Le
(74) *Attorney, Agent, or Firm* — Winstead PC

(57) ABSTRACT

Various embodiments may relate to a memory cell. The memory cell may include a first cell electrode, a first insulator layer and a first magnetic free layer between the first cell electrode and the first insulator layer. The memory cell may also include a second cell electrode, a second insulator layer, and a second magnetic free layer between the second cell electrode and the second insulator layer. A magnetic pinned layer may be between the first insulator layer and the second insulator layer. A direction of magnetization of the first magnetic free layer may be changeable in response to a current flowing between a first end and a second end of the first cell electrode. A direction of magnetization of the second magnetic free layer may be change-
(Continued)

able in response to a current flowing between a first end and a second end of the second cell electrode.

17 Claims, 55 Drawing Sheets

(51) Int. Cl.
| | |
|---|---|
| *G11C 11/16* | (2006.01) |
| *G11C 11/56* | (2006.01) |
| *H01F 10/32* | (2006.01) |
| *H01L 27/22* | (2006.01) |
| *H01L 43/12* | (2006.01) |
| *H01L 43/10* | (2006.01) |

(52) U.S. Cl.
CPC ...... *G11C 11/1657* (2013.01); *G11C 11/1659* (2013.01); *G11C 11/1673* (2013.01); *G11C 11/1675* (2013.01); *G11C 11/5607* (2013.01); *H01F 10/329* (2013.01); *H01F 10/3254* (2013.01); *H01L 27/228* (2013.01); *H01L 43/12* (2013.01); *H01L 43/10* (2013.01)

(58) Field of Classification Search
USPC .......................................................... 365/158
See application file for complete search history.

(56) References Cited

U.S. PATENT DOCUMENTS

| | | | |
|---|---|---|---|
| 7,120,049 B2* | 10/2006 | Nakamura | .............. G11C 11/15 365/171 |
| 8,625,337 B2 | 1/2014 | Wu et al. | |
| 9,105,343 B2 | 8/2015 | Zhou et al. | |
| 2002/0036331 A1 | 3/2002 | Nickel et al. | |
| 2008/0278994 A1* | 11/2008 | Katti | ................... G11C 11/1675 365/158 |
| 2012/0134200 A1 | 5/2012 | Khoueir et al. | |
| 2013/0037893 A1* | 2/2013 | Lee | ..................... G11C 11/5607 257/421 |
| 2015/0213866 A1 | 7/2015 | Wu et al. | |
| 2016/0042778 A1 | 2/2016 | Manipatruni et al. | |
| 2018/0114557 A1* | 4/2018 | Park | ........................ H01L 43/06 |
| 2019/0057731 A1* | 2/2019 | Lua | ......................... H01L 43/02 |
| 2019/0244646 A1* | 8/2019 | Lee | ..................... H01F 10/3254 |
| 2020/0075670 A1* | 3/2020 | Lin | ........................ H01L 43/08 |

FOREIGN PATENT DOCUMENTS

| | | |
|---|---|---|
| WO | 2014204492 A1 | 12/2014 |
| WO | 2015116415 A1 | 8/2015 |
| WO | 2016190879 A1 | 12/2016 |

OTHER PUBLICATIONS

Written Opinion of the International Searching Authority for International Application No. PCT/SG2018/050027 dated Apr. 11, 2018, pp. 1-6.

International Preliminary Report on Patentability for International Application No. PCT/SG2018/050027 dated Dec. 17, 2018, pp. 1-28.

Fukami et al., "A Sub-ns Three-Terminal Spin-Orbit Torque Induced Switching Device," Symposium on VLSI Technology Digest of Technical Papers, 2016, pp. 1-2.

Kim et al., "Multilevel Spin-Orbit Torque MRAMs," IEEE Transactions on Electron Devices, vol. 62, No. 2, Feb. 2015, pp. 561-568.

Wang et al., "Perpendicular-Anisotropy Magnetic Tunnel Junction Switched by Spin-Hall-Assisted Spin-Transfer Torque," Journal of Physics D: Applied Physics, vol. 48, 2015, pp. 1-7.

Fukami et al., "A Spin-Orbit Torque Switching Scheme with Collinear Magnetic Easy Axis and Current Configuration," Nature Nanotechnology, vol. 11, Jul. 2016, pp. 621-.626.

* cited by examiner (Prior Art)

2T1R Single Level Cell (SLC)

(Prior Art)

FIG. 6D

|     | Read | Write '0'/'1' to $MTJ_1$ | Write '0'/'1' to $MTJ_2$ |
|-----|------|--------------------------|--------------------------|
| $WL_a$ | 0 | $V_{DD}$ | 0 |
| $WL_b$ | $V_{DD}$ | 0 | $V_{DD}$ |
| $WL_c$ | 0 | 0 | $V_{DD}$ |
| SL | $I_{Read}$ | $V_{WR}/0$ | $V_{WR}/0$ |
| BL | 0 | $0/V_{WR}$ | $0/V_{WR}$ |

FIG. 10C

| Parameter | Values |
|---|---|
| FL Volume: (L*W*Tm) (nm) | (400*160*1.48) |
| HM:(WxLxt)(nm) | 1200 X 1200 X 3.3 |
| Polarization | 0.62 |
| Thermal Stability ($K_uV/K_BT$) | 45 |
| MgO Thickness(nm) | 0.85 |
| Magnetization Sat.(emu/cm$^3$) | 1114 (1.4T) |
| Resistance High/Low (kΩ) | 12/22(TMR=90%) |
| Damping constant | 0.03 |
| Spin Hall Angle | 0.08 |

FIG. 11D

|  | Read | Write '0'/'1' to MTJ$_{1\ or\ 2}$ |
|---|---|---|
| WL$_a$ | 0 | V$_{DD}$ |
| WL$_b$ | V$_{DD}$ | V$_{DD}$ |
| SL$_1$ | 0 | V$_{WR}$/0 |
| BL$_1$ | 0 | 0/V$_{WR}$ |
| SL$_2$ | 0 | V$_{WR}$/0 |
| BL$_2$ | I$_{Read}$ | 0/V$_{WR}$ |

FIG. 18D

|  | Read | Write '0'/'1' to $MTJ_1$ | Write '0'/'1' to $MTJ_2$ | Write '0'/'1' to $MTJ_3$ |
|---|---|---|---|---|
| $WL_a$ | 0 | $V_{DD}$ | 0 | 0 |
| $WL_b$ | $V_{DD}$ | 0 | $V_{DD}$ | $V_{DD}$ |
| $WL_c$ | 0 | 0 | 0 | $V_{DD}$ |
| SL | $V_{Read}$ | $V_{WR2}/0$ | $V_{WR1}/0$ | $V_{WR2}/0$ |
| BL | 0 | $0/V_{WR2}$ | $0/V_{WR1}$ | $0/V_{WR2}$ |

FIG. 23D

|  | Read | Write '0'/'1' to MTJ$_2$ | Write '0'/'1' to MTJ$_{1\ or\ 3}$ |
|---|---|---|---|
| WL$_a$ | 0 | 0 | V$_{DD}$ |
| WL$_b$ | V$_{DD}$ | V$_{DD}$ | V$_{DD}$ |
| SL$_1$ | 0 | 0 | V$_{WR2}$/0 |
| BL$_1$ | 0 | V$_{WR1}$/0 | 0/V$_{WR2}$ |
| SL$_2$ | 0 | 0 | V$_{WR2}$/0 |
| BL$_2$ | V$_{Read}$ | 0/V$_{WR1}$ | 0/V$_{WR2}$ |

$402\lambda^2 = 100.5F^2$

FIG. 31 flow a current between a first end and a second end of a first cell electrode to change a direction of magnetization of a first magnetic free layer between the first cell electrode and a first insulator layer

3102 flow a current between a first end and a second end of a second cell electrode to change a direction of magnetization of a second magnetic free layer between the second cell electrode and a second insulator layer

3104

MEMORY CELL, MEMORY ARRAY, METHOD OF FORMING AND OPERATING MEMORY CELL

CROSS-REFERENCE TO RELATED APPLICATION

This application claims the benefit of priority of Singapore application No. 10201700357U filed Jan. 17, 2017, the contents of it being hereby incorporated by reference in its entirety for all purposes.

TECHNICAL FIELD

Various aspects of this disclosure relate to a memory cell. Various aspects of this disclosure relate to a method of forming a memory cell. Various aspects of this disclosure relate to a method of operating a memory cell. Various aspects of this disclosure relate to a memory array.

BACKGROUND

Emerging non-volatile memories have been proposed to replace or co-exist with the leaky volatile complementary metal oxide semiconductor (CMOS) memories in order to address increasing static leakage power consumption. Magnetic memories, specifically magnetic tunnel junction (MTJ) based memories, have been identified as a promising solution due to their non-volatility, low power, high performance, high endurance, scalability, high density and CMOS compatibility.

Spin-orbit torque magnetic random access memory (SOT-MRAM), based on spin-orbit torque magnetic tunnel junction (SOT-MTJ), has been identified as a promising candidate. SOT-MTJ is a three-terminal device including a heavy metal (HM) electrode and a magnetic tunnel junction (MTJ) placed over the heavy metal (HM) electrode. The HM electrode may be made of tungsten. A charge current flowing in the HM electrode results in a spin accumulation via spin-orbit interaction in the free magnetic layer of the MTJ that is placed in-contact to the HM electrode, which in turn results in torques that assist in switching the MTJ resistance state. FIG. 1A shows a spin-orbit torque magnetic tunnel junction (SOT-MTJ). The SOT-MTJ may include a heavy metal (HM) electrode 102 and a magnetic tunnel junction (MTJ) 104 including a pinned layer, a free layer, and an oxide layer between the pinned layer and the free layer. The oxide layer may have a thickness denoted by $t_{ox}$. The heavy metal (HM) electrode 102 may have a length denoted by $L_{HM}$, a width denoted by $W_{HM}$, and a thickness denoted by $t_{HM}$. The MTJ has a length denoted by $L_{MTJ}$ and a width denoted by $W_{MTJ}$.

SOT-MTJ has advantages including separate read/write current paths, which permits a more optimised design; does not suffer from tunnel barrier breakdown reliability issues, as the write current passes through the electrode instead of the MTJ itself; and offers energy efficient and fast writing because of low critical current requirement and the passage of the write current by the low resistance electrode instead of the high resistance MTJ.

FIG. 1B shows a conventional 2 transistor 1 resistor (2T1R) single level cell (SLC) including the on spin-orbit torque magnetic tunnel junction (SOT-MTJ) shown in FIG. 1A. As shown in FIG. 1B, each SOT-MTJ is a three-terminal device and requires two access transistors 106a, 106b per cell, which may result in lower memory density.

SUMMARY

Various embodiments may relate to a memory cell. The memory cell may include a first cell electrode. The memory cell may also include a first insulator layer. The memory cell may further include a first magnetic free layer between the first cell electrode and the first insulator layer. The memory cell may also include a second cell electrode. The memory cell may further include a second insulator layer. The memory cell may additionally include a second magnetic free layer between the second cell electrode and the second insulator layer. The memory cell may also include a magnetic pinned layer between the first insulator layer and the second insulator layer. A direction of magnetization of the first magnetic free layer may be changeable in response to a current flowing between a first end and a second end of the first cell electrode. A direction of magnetization of the second magnetic free layer may be changeable in response to a current flowing between a first end and a second end of the second cell electrode. The magnetic pinned layer may have a fixed direction of magnetization.

Various embodiments may relate to a memory array including a plurality of memory cells as described herein.

Various embodiments may relate to a method of forming a memory cell. The method may include forming a first cell electrode. The method may also include forming a first insulator layer. The method may further include forming a first magnetic free layer between the first cell electrode and the first insulator layer. The method may additionally include forming a second cell electrode. The method may also include forming a second insulator layer. The method may further include forming a second magnetic free layer between the second cell electrode and the second insulator layer. The method may additionally include forming a magnetic pinned layer between the first insulator layer and the second insulator layer. A direction of magnetization of the first magnetic free layer may be changeable in response to a current flowing between the first end and the second end of the first cell electrode. A direction of magnetization of the second magnetic free layer may be changeable in response to a current flowing between the first end and the second end of the second cell electrode. The magnetic pinned layer may have a fixed direction of magnetization.

Various embodiments may relate to a method of operating a memory cell. The method may include flowing a current between a first end and a second end of a first cell electrode to change a direction of magnetization of a first magnetic free layer between the first cell electrode and a first insulator layer. The method may also include flowing a current between a first end and a second end of a second cell electrode to change a direction of magnetization of a second magnetic free layer between the second cell electrode and a second insulator layer. The memory cell also may include a magnetic pinned layer between the first insulator layer and the second insulator layer. The magnetic pinned layer may have a fixed direction of magnetization.

BRIEF DESCRIPTION OF THE DRAWINGS

The invention will be better understood with reference to the detailed description when considered in conjunction with the non-limiting examples and the accompanying drawings, in which:

FIG. 6D is a table summarizing the bias conditions for the three different word lines ($WL_a$, $WL_b$, $WL_c$), the source line (SL) and the bit line (BL) in order to read and write the memory cell according to various embodiments.

FIG. 10C is a table showing the parameters used in the modelling of the memory array according to various embodiments.

FIG. 11D is a table summarizing the bias conditions for the two different word lines ($WL_a$, $WL_b$), the two source lines (SL1, SL2) and the two bit lines (BL1, BL2) in order to read and write the memory cell according to various embodiments.

FIG. 18D is a table summarizing the bias conditions for the three different word lines ($WL_a$, $WL_b$, $WL_c$), the source line (SL) and the bit line (BL) in order to read and write the memory cell according to various embodiments.

FIG. 23D is a table summarizing the bias conditions for the two different word lines ($WL_a$, $WL_b$), the two source lines (SL1, SL2) and the two bit lines (BL1, BL2) in order to read and write the memory cell according to various embodiments.

FIG. 31 is a schematic showing a method of operating a memory cell according to various embodiments.

DETAILED DESCRIPTION

Figure 1A:
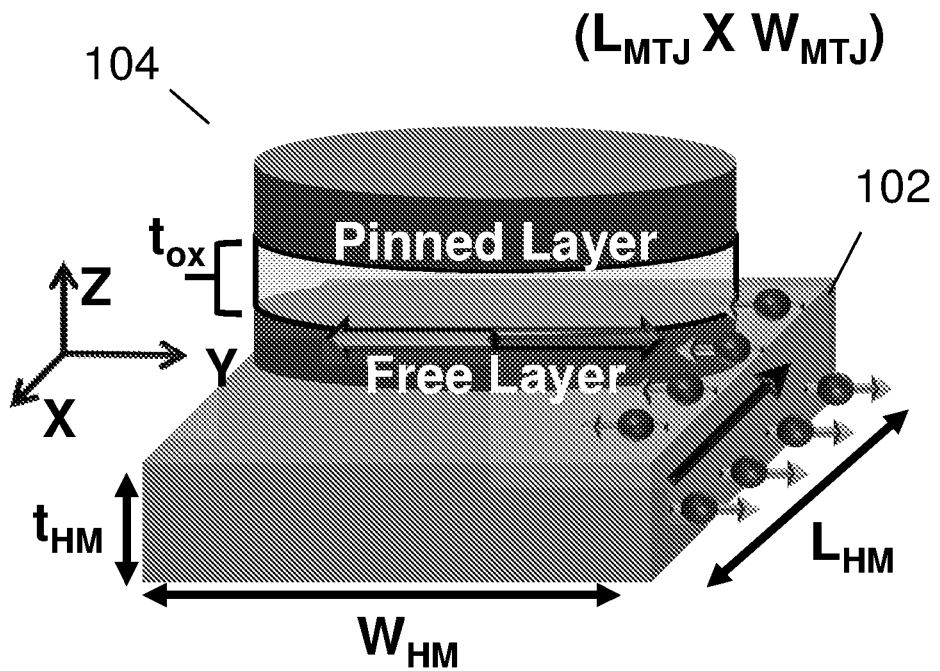
FIG. 1A shows a spin-orbit torque magnetic tunnel junction (SOT-MTJ).
Figure 1B:
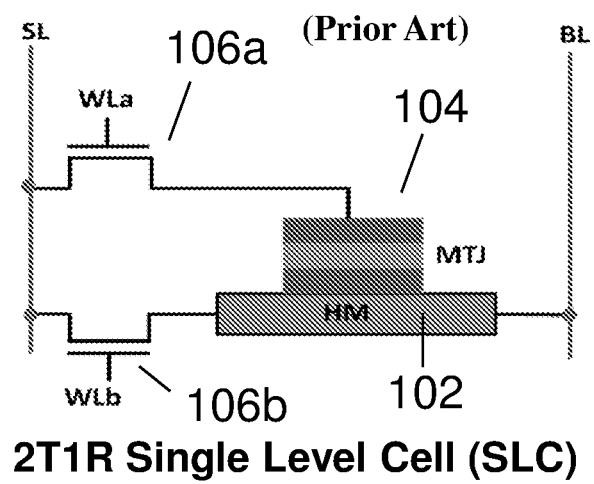
FIG. 1B shows a conventional 2 transistor 1 resistor (2T1R) single level cell (SLC) including the on spin-orbit torque magnetic tunnel junction (SOT-MTJ) shown in FIG. 1A.

The following detailed description refers to the accompanying drawings that show, by way of illustration, specific details and embodiments in which the invention may be practiced. These embodiments are described in sufficient detail to enable those skilled in the art to practice the invention. Other embodiments may be utilized and structural, and logical changes may be made without departing from the scope of the invention. The various embodiments are not necessarily mutually exclusive, as some embodiments can be combined with one or more other embodiments to form new embodiments.

Embodiments described in the context of one of the methods or memory cells/memory arrays are analogously valid for the other methods or memory cells/memory arrays. Similarly, embodiments described in the context of a method are analogously valid for a memory cell/memory array, and vice versa.

Features that are described in the context of an embodiment may correspondingly be applicable to the same or similar features in the other embodiments. Features that are described in the context of an embodiment may correspondingly be applicable to the other embodiments, even if not explicitly described in these other embodiments. Furthermore, additions and/or combinations and/or alternatives as described for a feature in the context of an embodiment may correspondingly be applicable to the same or similar feature in the other embodiments.

The word "over" used with regards to a deposited material formed "over" a side or surface, may be used herein to mean that the deposited material may be formed "directly on", e.g. in direct contact with, the implied side or surface. The word "over" used with regards to a deposited material formed "over" a side or surface, may also be used herein to mean that the deposited material may be formed "indirectly on" the implied side or surface with one or more additional layers being arranged between the implied side or surface and the deposited material. In other words, a first layer "over" a second layer may refer to the first layer directly on the second layer, or that the first layer and the second layer are separated by one or more intervening layers. Further, in the current context, a layer "over: or "on" a side or surface may not necessarily mean that the layer is above a side or surface. A layer "on" a side or surface may mean that the layer is formed in direct contact with the side or surface, and a layer "over" a side or surface may mean that the layer is formed in direct contact with the side or surface or may be separated from the side or surface by one or more intervening layers.

The memory cell/memory as array described herein may be operable in various orientations, and thus it should be understood that the terms "top", "bottom", etc., when used in the following description are used for convenience and to aid understanding of relative positions or directions, and not intended to limit the orientation of the memory cell/memory as array.

In the context of various embodiments, the articles "a", "an" and "the" as used with regard to a feature or element include a reference to one or more of the features or elements.

In the context of various embodiments, the term "about" or "approximately" as applied to a numeric value encompasses the exact value and a reasonable variance.

As used herein, the term "and/or" includes any and all combinations of one or more of the associated listed items.

Figure 2A:
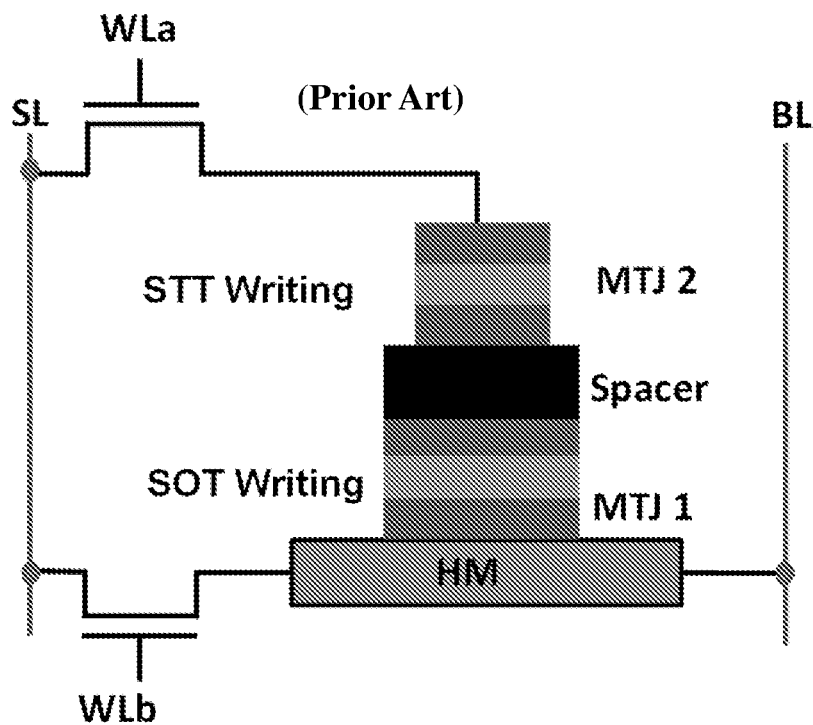
FIG. 2A shows a conventional series magnetic tunnel junction multi-level cell (S-MLC).
Figure 2B:
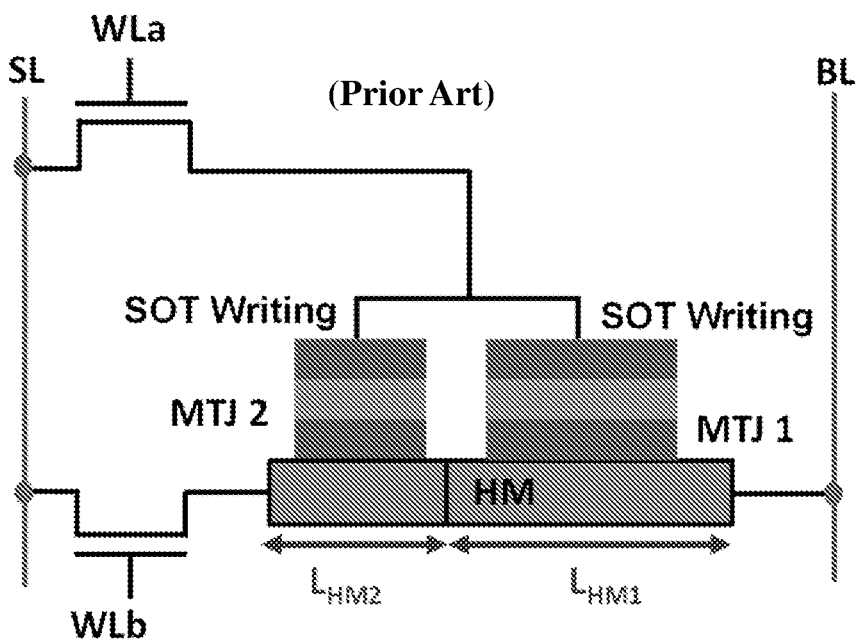
FIG. 2B shows a conventional parallel magnetic tunnel junction multi-level cell (P-MLC).

Multi-level cell SOT-MRAM (MLC-SOT MRAM) (i.e. 2 bits per cell) has been proposed to improve the integration density. Currently, there are two existing designs for MLC-SOT MRAM in the literature, i.e. series MTJs MLC (S-MLC) and parallel MTJs MLC (P-MLC). FIG. 2A shows a conventional series magnetic tunnel junction multi-level cell (S-MLC). FIG. 2B shows a conventional parallel magnetic tunnel junction multi-level cell (P-MLC).

S-MLC includes two in-series MTJs placed over an electrode made of heavy metal. The first MTJ ($MTJ_1$) in contact with the heavy metal electrode can be programmed by SOT effect, whilst the second MTJ (MTJ2) (stacked over MTJ$_1$) has to be programmed by conventional spin transfer torque (STT). S-MLC uses MTJs with different cross-sectional dimensions, which may result in a complex fabrication process. Furthermore, MTJ$_2$ has to be programmed before MTJ$_1$ to avoid a final state of write disturb failures for MTJ$_1$, which means that the programming for the two MTJs should be serial and cannot be simultaneous. The need for STT in programming MTJ$_2$ results in low energy efficiency as STT programming requires passing current through the high resistance MTJ stack, which demands high writing voltage in addition to a large critical current for STT switching (compared to SOT switching). In addition, passing a large current through the MTJ stack may reduce tunnel barrier reliability, which jeopardises one of the main advantages of using SOT-MRAM. Furthermore, low resistance MTJs employed in the stack, required for supplying enough current to achieve the STT switching, may result in a smaller minimum resistance difference ($\Delta R_{min}$) between the four distinct resistance states (i.e. smaller $\Delta R_{min}$ between the four possible resistances (R11, R10, R01, R00)). The reduced $\Delta R_{min}$ reduces the read margin for the S-MLC memory and thus leads to a longer reading delay.

P-MLC includes two MTJs in-parallel with both placed side-by-side over the heavy metal electrode. This allows programming both MTJs using SOT effect. However, both the MTJs should have a different switching current requirement. This can be achieved by having different dimensions for the two MTJs and their underlying electrodes. Therefore, P-MLC manufacturing may be challenging due to this imposed non-uniformity in the cell architecture. The imposed different current requirement would result in lower energy efficiency as one of the MTJs should switch with larger current amplitude compared to the other MTJ (under equivalent switching time assumption). Furthermore, as the two MTJs share the same writing path, the two MTJs have to be written serially. Moreover, the shared writing path may increase the write error rate because the write current has to pass through both the MTJs while writing any of the two MTJs. In addition, the in-parallel configuration of the two MTJs during reading results in reduced minimum difference between the various resistance states (and consequently reduced read margin compared to the in-series configuration), as the equivalent resistance for two parallel resistances is always smaller than the smallest resistance. For instance, if the parallel configuration resistance ($R_p$) of MTJ$_1$ ($R_{p1}$) is 7 kilo-ohms, $R_p$ of MTJ2 ($R_{p2}$) is 12 kilo-ohms, and anti-parallel configuration resistance ($R_{ap}$) of MTJ2 ($R_{ap2}$) is 22 kilo-ohms, the equivalent resistance for case 1 ($R_{p1}$, $R_{p2}$), i.e. $R_{tot1}$, is 4.4 kilo-ohms for in-parallel connected MTJs, and the equivalent resistance for case 2 ($R_{p1}$, $R_{ap2}$), i.e. $R_{tot2}$, is 5.3 kilo-ohms for in-parallel connected MTJs. That results in a minimum resistance difference ($\Delta R_{min}$) of 0.9 kilo-ohms only. $R_{tot1}$ is 19 kilo-ohms for in-series connected MTJs and $R_{tot2}$ is 29 kilo-ohms for in-series connected, which results in $\Delta R_{min}$ of 10 kilo-ohms. This example shows that in-series connection may result in 10 times larger $\Delta R_{min}$ and hence, higher read margin.

Various embodiments may seek to improve minimum resistance difference of the different states of the memory cell. Various embodiments may seek to improve the read margin. Various embodiments may seek to improve efficiency of the manufacturing process and/or decrease manufacturing costs. Various embodiments may provide a memory cell architecture that reduces or avoids the disadvantages of existing MLC SOT-MRAMs, which may be a step forward for the wide adoption of SOT-MRAMs.

Figure 3:
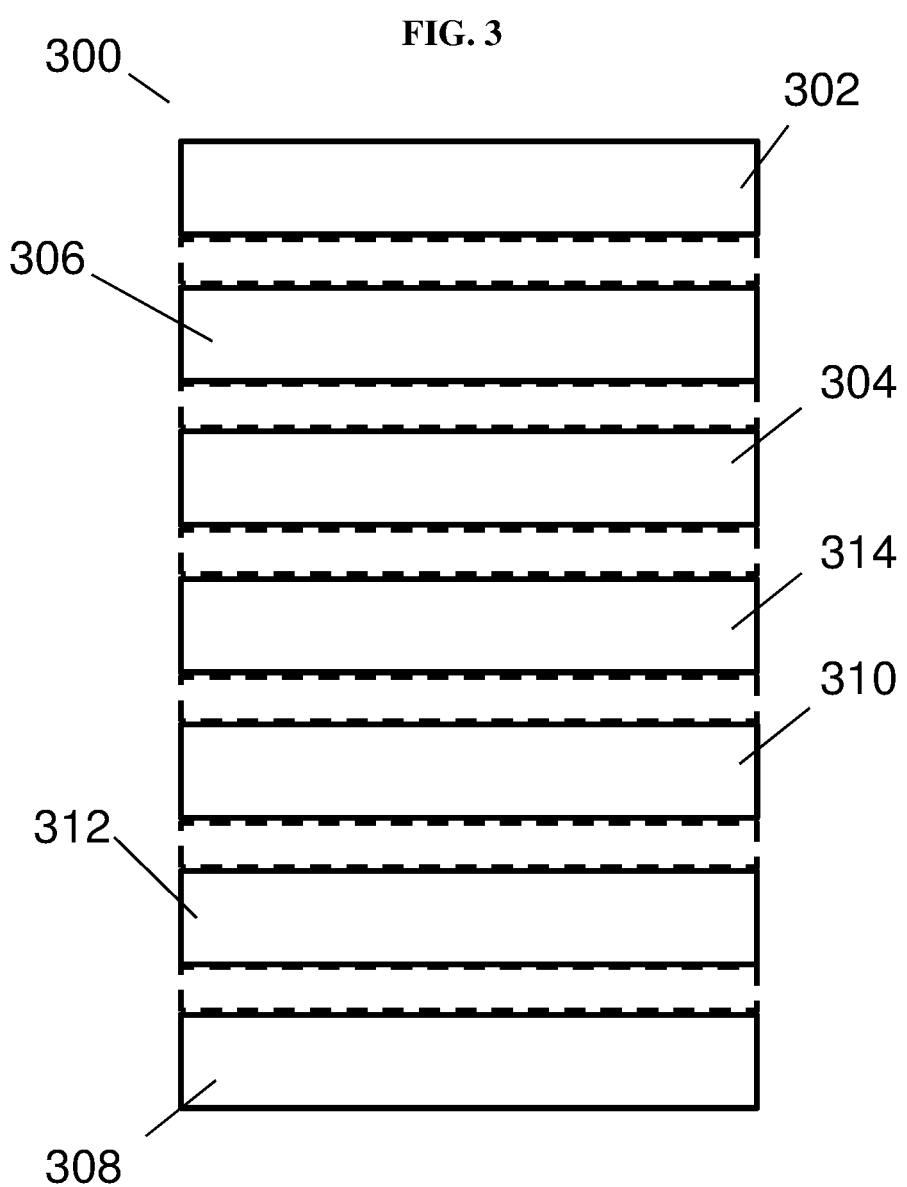
FIG. 3 shows a general illustration of a memory cell according to various embodiments.

FIG. 3 shows a general illustration of a memory cell 300 according to various embodiments. The memory cell 300 may include a first cell electrode 302. The memory cell 300 may also include a first insulator layer 304. The memory cell 300 may further include a first magnetic free layer 306 between the first cell electrode 302 and the first insulator layer 304. The memory cell 300 may also include a second cell electrode 308. The memory cell 300 may further include a second insulator layer 310. The memory cell 300 may additionally include a second magnetic free layer 312 between the second cell electrode 308 and the second insulator layer 310. The memory cell 300 may also include a magnetic pinned layer 314 between the first insulator layer 304 and the second insulator layer 310. A direction of magnetization of the first magnetic free layer 306 may be changeable in response to a current flowing between a first end and a second end of the first cell electrode 302. A direction of magnetization of the second magnetic free layer 312 may be changeable in response to a current flowing between a first end and a second end of the second cell electrode 308. The magnetic pinned layer 314 may have a fixed direction of magnetization.

The second magnetic free layer 312 may be over the second cell electrode 308, the second insulator layer 310 may be over the second magnetic free layer 312, the magnetic pinned layer 314 may be over the second insulator layer 310, the first insulator layer 304 may be over the magnetic pinned layer 314, the first magnetic free layer 306 may be over the first insulator layer 304, and the first cell electrode 302 may be over the first insulator layer 304.

The cell electrodes 302, 308 and layers 304, 306, 310, 312, 314 may form a vertically stacked arrangement. The dashed boxes between neighbouring electrodes and/or layers as shown in FIG. 3 may indicate one or more intervening layers between the neighbouring electrodes and/or layers in various embodiments, or may indicate no intervening layers between the neighbouring electrodes and/or layers in various other embodiments. For instance, in various embodiments, the memory cell 300 may include one or more intervening layers between the magnetic pinned layer 314 and the second insulator layer 310, while in various other embodiments, the magnetic pinned layer 314 may be in direct contact with the second insulator layer 310.

The layers between the cell electrodes 302, 308, such as layers 304, 306, 310, 312, 314 may be referred to as a memory stack or MTJ stack.

The cell electrodes 302, 308 may include a heavy metal such as tungsten and may alternatively be referred to as heavy metal (HM) electrodes. The first end and the second end of the first cell electrode 302 may be opposing ends. Similarly, the first end and the second end of the second cell electrode 308 may be opposing ends.

In various embodiments, the layers 304, 306, 310, 312, 314 may be of substantially the same length and of substantially the same width. The layers 304, 306, 310, 312, 314 may have substantially the same cross-sectional area.

In various embodiments, the direction of magnetization of the first magnetic free layer 306 may be changeable in response to the current flowing between the first end and the second end of the first cell electrode 302 due to spin-orbit torque (SOT) effect. The direction of magnetization of the second magnetic free layer 312 may be changeable in response to the current flowing between the first end and the second end of the second cell electrode 308 due to spin-orbit torque (SOT) effect.

In various embodiments, the first insulator layer 304 and/or the second insulator layer 310 may include an oxide such as magnesium oxide (MgO), aluminum oxide ($Al_2O_3$), titanium oxide ($TiO_x$), magnesium gallium oxide ($MgGa_2O_4$), or magnesium aluminum oxide ($MgAl_2O_4$). In various embodiments, the first insulator layer 304 and the second insulator layer 310 may have the same thickness, while in various other embodiments, the first insulator layer 304 and the second insulator layer 310 may have different thicknesses.

In the present context, an insulator layer included in the memory stack, such as layer 304 or layer 310 may also be referred to as tunnel barrier.

In the current context, a magnetic free layer may be a magnetic layer which direction of magnetization may vary in response to a current flowing through the free layer or in the vicinity of the free layer, e.g. through an electrode in contact or near the free layer. In contrast, a magnetic pinned layer may be a magnetic layer is invariant to a current flowing through the pinned layer or near the pinned layer.

In various embodiments, the first magnetic free layer 306, the second magnetic free layer 312, and/or the magnetic pinned layer 314 may include a suitable ferromagnetic material such as iron (Fe), nickel (Ni), cobalt (Co), or an alloy including iron, nickel, and/or cobalt such as cobalt iron boron (CoFeB) or a transition metal-rare earth ferrimagnetic alloy such as cobalt terbium ($Co_xTb_{1-x}$).

The memory cell 300 may be referred to as a multi-level cell (MLC) spin-orbit torque magnetic random access memory (SOT MRAM). The cell 300 may store more than 1 bit. In various embodiments, the cell 300 may store two bits, while in various other embodiments, the cell 300 may store three bits. A memory cell 300 storing three bits may be referred to as a triple-level cell (TLC) spin-orbit torque magnetic random access memory (SOT MRAM).

Various embodiments may include two, three or more MTJs between the first cell electrode 302 and the second cell electrode 308.

Various embodiments may include a memory array including a plurality of memory cells as described herein. The memory array may include a row decoder and a column decoder configured to select one memory cell out of the plurality of memory cells. In various embodiments, the memory array may further include a write circuit configured to write to the selected memory cell. In various embodiments, the memory array may include a read circuit to read from the selected memory cell. In various embodiments, e.g. in a serial or single port memory array, a write circuit including a single write drive per data channel may be used for serial or single port writing or programming. In various embodiments, e.g. in a simultaneous or dual port memory array, a write circuit including two separate write drives per data channel may be used for simultaneous or dual port writing or programming.

Figure 4A:
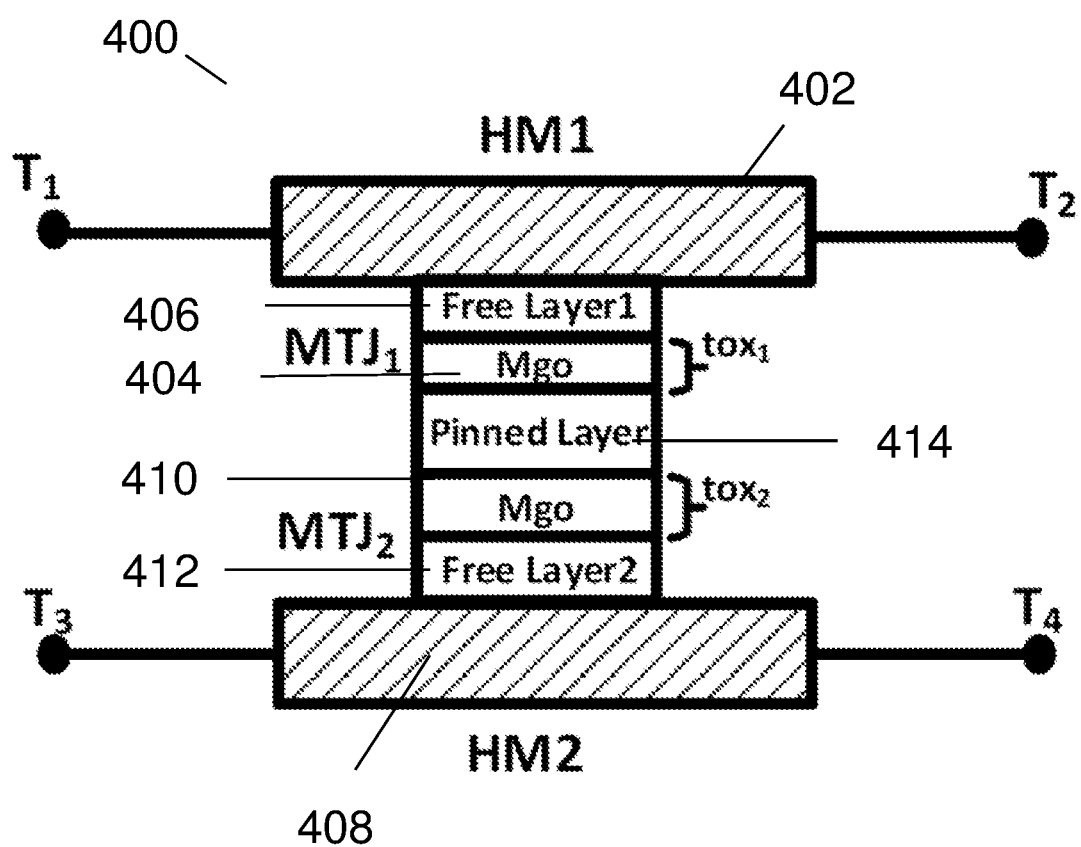
FIG. 4A shows a schematic of a memory cell according to various embodiments.

FIG. 4A shows a schematic of a memory cell 400 according to various embodiments. The memory cell 400 may include a first cell electrode 402. The memory cell 400 may also include a first insulator layer 404. The memory cell 400 may further include a first magnetic free layer 406 between the first cell electrode 402 and the first insulator layer 404. The memory cell 400 may also include a second cell electrode 408. The memory cell 400 may further include a second insulator layer 410. The memory cell 400 may additionally include a second magnetic free layer 412 between the second cell electrode 408 and the second insulator layer 410. The memory cell 400 may also include a magnetic pinned layer 414 between the first insulator layer 404 and the second insulator layer 410. A direction of magnetization of the first magnetic free layer 306 may be changeable in response to a current flowing between a first end and a second end of the first cell electrode 402. A direction of magnetization of the second magnetic free layer 412 may be changeable in response to a current flowing between a first end and a second end of the second cell electrode 408. The magnetic pinned layer 414 may have a fixed direction of magnetization.

As shown in FIG. 4A, the second magnetic free layer 412 may be on the second cell electrode 408, the second insulator layer 410 may be on the second magnetic free layer 412, the magnetic pinned layer 414 may be on the second insulator layer 410, the first insulator layer 404 may be on the magnetic pinned layer 414, the first magnetic free layer 406 may be on the first insulator layer 404, and the first cell electrode 402 may be on the first magnetic free layer 406.

The memory cell 400 may include a uniform memory stack (also referred to as MTJ stack) including the first magnetic free layer 406, the first insulator layer 404, the magnetic pinned layer 414, the second insulator layer 410, and the second magnetic free layer 412 between two heavy metal electrodes 402, 408. The uniform memory stack may have a cylindrical shape. The stack may include two magnetic tunnel junctions ($MTJ_1$, $MTJ_2$) sharing a common magnetic pinned layer 414. The first magnetic free layer 406, the first insulator layer 404, and the magnetic pinned layer 414 may form the first MTJ ($MTJ_1$). The magnetic pinned layer 414, the second insulator layer 410, and the second magnetic free layer 412 may form the second MTJ ($MTJ_2$). The first cell electrode 402 may be denoted as $HM_1$, and the second cell electrode 408 may be denoted as $HM_2$.

The free layer 406, 412 of each MTJ may be placed in direct-contact with the respective HM electrode 402, 408 to allow programming each of the two MTJs by the spin-orbit torque (SOT) effect. The two stacked MTJs may have a uniform cross-sectional area and different tunnel barrier thicknesses ($t_{ox1}$ and $t_{ox2}$). Different tunnel barrier thicknesses may permit achieving various resistance levels for the two MTJs in both parallel and anti-parallel configurations, which allows realizing four distinct stack resistance states.

The memory cell 400 may allow a simplified fabrication process due to the uniform-cross-sectional area of the two stacked MTJs. The whole stack may be processed in one flow, which may simplify the fabrication process. As shown in FIG. 4A, a first end of the first cell electrode 402 may be electrically coupled to terminal $T_1$, while a second end of the first cell electrode 402 opposite the first end may be electrically coupled to terminal $T_2$. Further, a first end of the second cell electrode 408 may be electrically coupled to terminal $T_3$, while a second end of the second cell electrode 408 opposite the first end may be electrically coupled to terminal $T_4$. The memory cell 400 may only require four terminals to successfully read and write the two bits per cell. On the other hand, single-level cell (SLC) SOT MRAMs, which are based on three terminal device SOT-MTJ, may require six terminals for two bits. Therefore, the fewer terminals of the memory cell 400 may simplify the manufacturing process and may result in additional area saving.

Further, due to the two heavy metal (HM) electrodes 402, 408, the two MTJs may be programmed by the energy efficient SOT effect. The HM electrodes may include a heavy metal such as tungsten (W), platinum (Pt), and/or tantalum (Ta).

In addition, as the two MTJs are connected in-series, the minimum resistance value difference ($\Delta R_{min}$) between the four distinct resistance states of the stack may be larger. A larger $\Delta R_{min}$ may indicate a larger read margin, and consequently shorter read delay.

As a result of the separate write paths for the two MTJs (i.e. $MTJ_1$ may be written through the first cell electrode 402, while $MTJ_2$ may be written through the second cell electrode 408), the probability of writing disturbance occurrence for one of the two MTJs while writing the other may be low. Furthermore, the two MTJs may be programmed within the same time span (i.e. simultaneously) while maintaining a low write error rate as well.

As the write current does not flow through the MTJ stack (instead it flows through the electrodes), thus, the MLC cell 400 may not suffer from tunnel barrier breakdown reliability issues.

The MLC cell 400 may be programmed using either serial (alternatively referred to as single port) or simultaneous (alternatively referred to as dual port) schemes. In the single port or serial scheme (i.e. single port MLC-SOT MRAM), the data may be programmed to the two MTJs at different time spans. On the other hand, in the dual port or simultaneous scheme (i.e. dual port MLC-SOT MRAM), the data may be programmed to the two MTJs within the same time span.

Figure 4B:
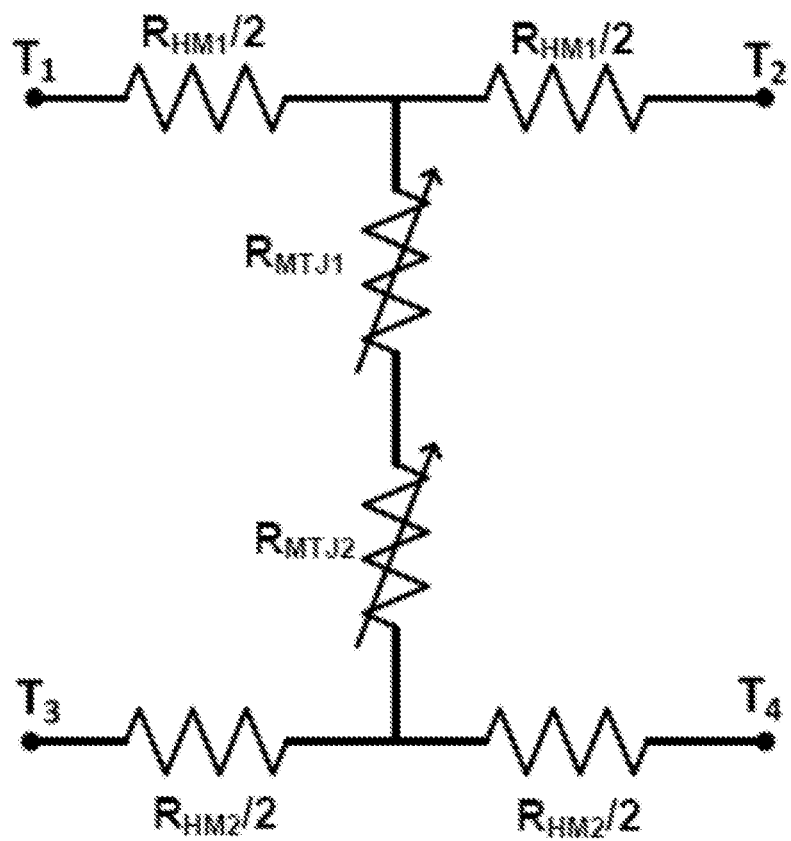
FIG. 4B shows the equivalent electrical model of the memory cell shown in FIG. 4A according to various embodiments.

FIG. 4B shows the equivalent electrical model of the memory cell 400 shown in FIG. 4A according to various embodiments. A resistive T-Model may be used to represent each of the two stacked SOT-MTJs, where each SOT-MTJ is modelled by three resistances. Two fixed resistances may model the total electrode (HM) resistance of a cell electrode, and one variable resistance may model the MTJ resistance value.

The electrical representation may be used to capture the electrical response of the cell 400 in an implemented SPICE compatible Verilog-A model. The Landau-Lifshitz-Gilbert (LLG) equation may be integrated into the model to emulate the magnetic response of the SOT-MTJ. The implemented Verilog-A model may be verified against experimental data and may be used in the validation of the memory cell.

Figure 5:
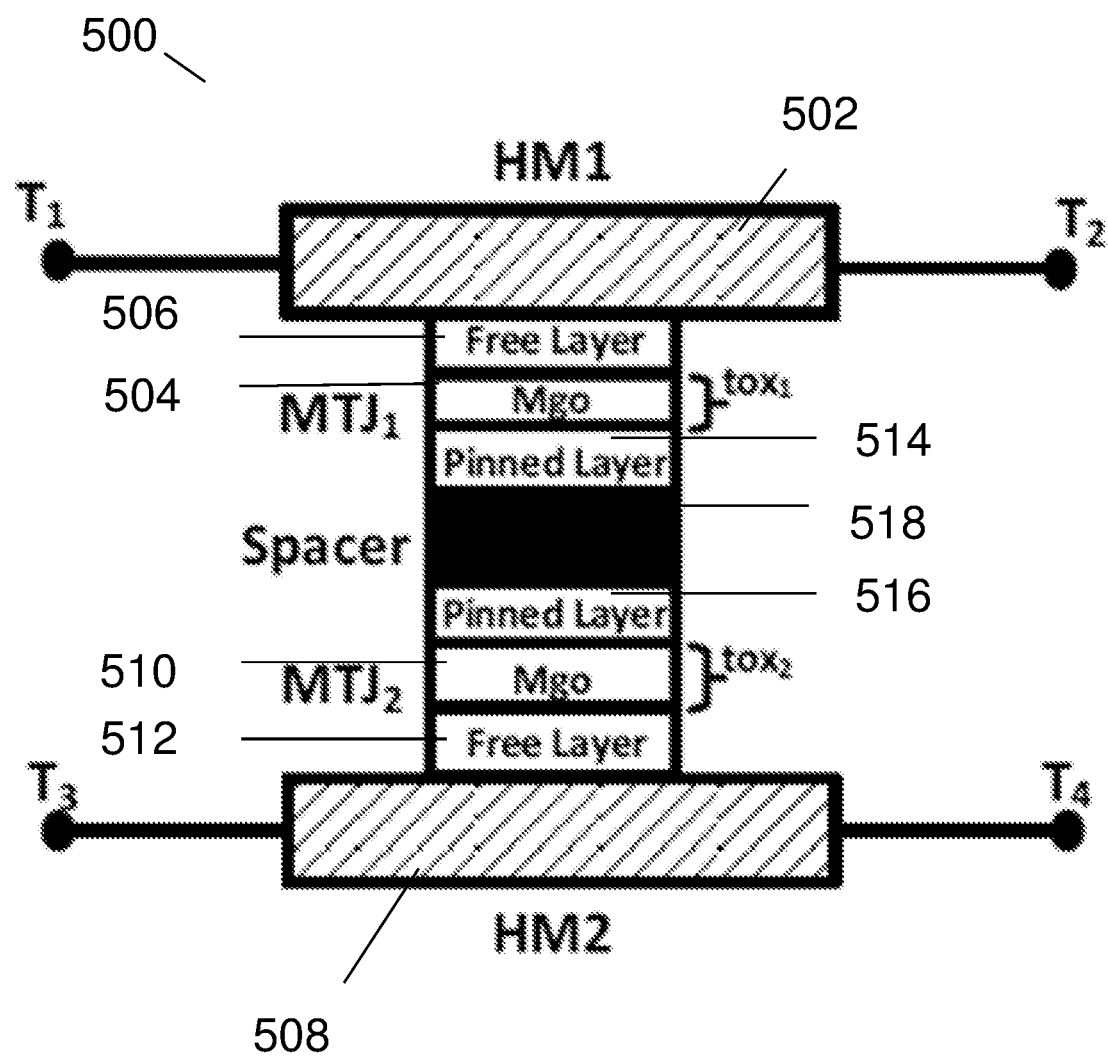
FIG. 5 shows a schematic of a memory cell according to various embodiments.

FIG. 5 shows a schematic of a memory cell 500 according to various embodiments. The memory cell 500 may include a first cell electrode 502. The memory cell 500 may also include a first insulator layer 504. The memory cell 500 may further include a first magnetic free layer 506 between the first cell electrode 502 and the first insulator layer 504. The memory cell 500 may also include a second cell electrode 508. The memory cell 500 may further include a second insulator layer 510. The memory cell 500 may additionally include a second magnetic free layer 512 between the second cell electrode 508 and the second insulator layer 510. The memory cell 400 may also include a magnetic pinned layer 514 between the first insulator layer 504 and the second insulator layer 510.

The memory cell 500 may further include a further magnetic pinned layer 516 between the first insulator layer 504 and the second insulator layer 510. The memory cell 500 may also include a spacer layer 518 between the magnetic pinned layer 514 and the further magnetic pinned layer 516. The magnetic pinned layer 514 may be between the first insulator layer 504 and the spacer layer 518, and the further magnetic pinned layer 516 may be between the second insulator layer 510 and the spacer layer 518. The magnetic pinned layer 514 may have a fixed direction of magnetization. The further magnetic pinned layer 516 may have a fixed direction of magnetization. The spacer layer 518 may include a metal, e.g. a metal selected from a group consisting of ruthenium (Ru), osmium (Os), rhenium (Re), chromium (Cr), rhodium (Rh), copper (Cu), tantalum (Ta), aluminum (Al), and tungsten (W).

A direction of magnetization of the first magnetic free layer 506 may be changeable in response to a current flowing between a first end and a second end of the first cell electrode 502. A direction of magnetization of the second magnetic free layer 512 may be changeable in response to a current flowing between a first end and a second end of the second cell electrode 508.

As shown in FIG. 5, the second magnetic free layer 512 may be on the second cell electrode 508, the second insulator layer 510 may be on the second magnetic free layer 512, the further magnetic pinned layer 516 may be on the second insulator layer 510, the spacer layer 518 may be on the further magnetic pinned layer 516, the magnetic pinned layer 514 may be on the spacer layer 518, the first insulator layer 504 may be on the magnetic pinned layer 514, the first magnetic free layer 506 may be on the first insulator layer 504, and the first cell electrode 502 may be on the first magnetic free layer 506.

The first magnetic free layer 506, the first insulator layer 504, and the magnetic pinned layer 514 may form the first MTJ ($MTJ_1$). The further magnetic pinned layer 516, the second insulator layer 510, and the second magnetic free layer 512 may form the second MTJ ($MTJ_2$). As shown in FIG. 5, each of $MTJ_1$ and $MTJ_2$ of cell 500 may include a magnetic pinned layer. $MTJ_1$ and $MTJ_2$ of cell 500 may not share a common magnetic pinned layer.

The MLC cell 500 may also be programmed using either single port or dual port schemes.

Figure 6A:
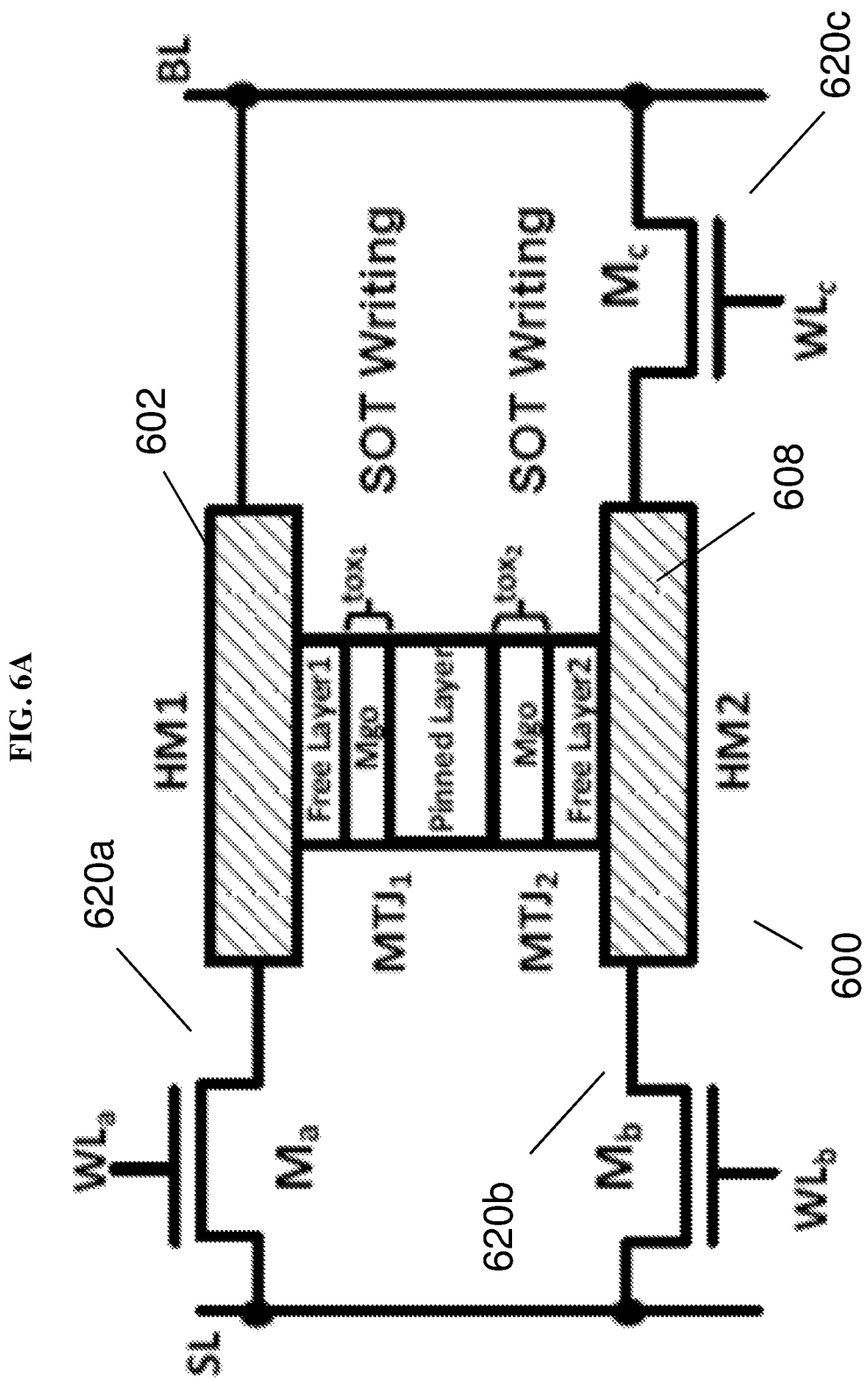
FIG. 6A shows a memory cell configured for single port programming or writing according to various embodiments.

FIG. 6A shows a memory cell 600 configured for single port programming or writing according to various embodiments. In various embodiments, the memory cell 600 have a similar structure as the memory cell 400 (as shown in FIG. 6A), while in various other embodiments, the memory cell 600 may have a similar structure as the memory cell 500. The memory cell 600 may be referred to as a single port MLC-SOT MRAM unit cell or a single port SOT-MLC.

The memory cell 600 may include two MTJs stacked in-series with a common pinned layer in-between two heavy metal (HM) electrodes 602, 608. The layers forming a stack between cell electrodes 602, 608 are not labelled in FIG. 6A to reduce clutter and improve clarity. The two electrodes 602, 608 may permit programming of the two MTJs using the energy efficient SOT effect with low write error rate, as each electrode 602, 608 may be responsible for programming only one MTJ. The two MTJs may have symmetrical cross-sectional dimensions (i.e. width and length) to simplify the manufacturing, while distinct resistances for $MTJ_1$ and $MTJ_2$ may be obtained by varying the MTJ tunnel oxide thickness ($t_{ox}$). Distinct parallel and antiparallel resistances levels for both the MTJs may be required to obtain four different resistance states (i.e. R11, R10, R01, R00). In addition, the memory cell 600 may include three access transistors 602a-c to avoid unintentional reading or writing of non-selected cells. The memory cell 600 may include a first transistor 620a (denoted as $M_a$) in electrical connection with an end portion of the first cell electrode 602. The memory cell 600 may also include a second transistor 620b (denoted as $M_b$) in electrical connection with an end portion of the second cell electrode 608. The memory cell 600 may further include a third transistor 620c (denoted as $M_c$) in electrical connection with a further end portion of the second cell electrode 608.

The first transistor 620a may include a control electrode, a first controlled electrode, and a second controlled electrode. The second transistor 620b may include a control electrode, a first controlled electrode, and a second controlled electrode. The third transistor 620c may include may include a control electrode, a first controlled electrode, and a second controlled electrode.

The control electrode of a transistor may also be referred to as a gate electrode. In various embodiments, the first controlled electrode of a transistor may be a source electrode while the second controlled electrode of the transistor may be a drain electrode. In various other embodiments, the first controlled electrode of a transistor may be a drain electrode while the second controlled electrode of the transistor may be a source electrode.

As shown in FIG. 6A, the first controlled electrode of the first transistor 620a may be in electrical connection with an end portion of the first cell electrode 602. The first controlled electrode of the second transistor 620b may be in electrical connection with an end portion of the second cell electrode 608. The first controlled electrode of the third transistor 620c may be in electrical connection with a further end portion of the second cell electrode 608.

The second controlled electrode of the first transistor 620a and the second controlled electrode of the second transistor 620b may be in electrical connection with a source line (denoted as SL). The second controlled electrode of the third transistor 620c may be in electrical connection with a bit line (denoted as BL). A further end portion of the first electrode 602 may be in electrical connection with the bit line (BL). The control electrode of the first transistor 620a may be in electrical connection with a first word line (denoted as $WL_a$), the control electrode of the second transistor 620b may be in electrical connection with a second word line (denoted as $WL_b$), and the control electrode of the third transistor 620c may be in electrical connection with a third word line (denoted as $WL_c$).

Figure 6B:
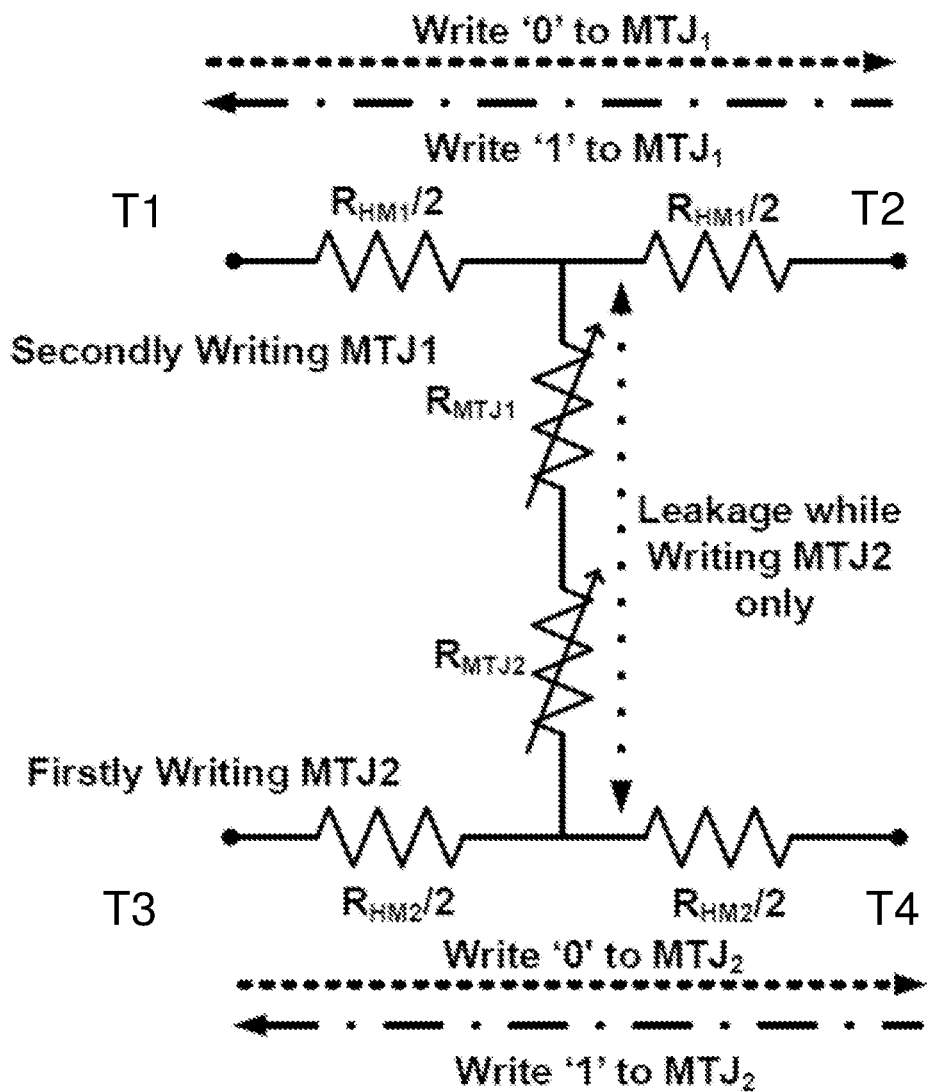
FIG. 6B shows the resistive model of the single port spin-orbit torque multi-level cell (SOT-MLC) in the writing mode according to various embodiments.

FIG. 6B shows the resistive model of the single port spin-orbit torque multi-level cell (SOT-MLC) in the writing mode according to various embodiments. A resistive T-model may be used to represent an MTJ. The cell has a separate write path for each MTJ. The current paths for writing the two MTJs are shown in FIG. 6B. The current may flow from T1 to T2 for $MTJ_1$, and from T3 to T4 for $MTJ_2$ in order to write '0'. On the other hand, the current may flow from T2 to T1 for $MTJ_1$, and from T4 to T3 for MTJ2 to write '1'. Thus, to write '0', SL may be raised high and BL may be pulled low. On the other hand, in order to write '1', SL may be pulled low and BL may be raised high. A writing current of 50 µA may be considered for SOT effect occurrence.

Writing $MTJ_2$ may require the activation of both transistor 620b ($M_b$) and 620c ($M_c$) (i.e. $WL_b=WL_c=VDD$) and the deactivation of transistor 620a ($M_a$) (i.e. $WL_a$='0') as shown in FIG. 6A. A leakage current may pass through $MTJ_1$.

Writing $MTJ_1$ may require turning transistor 620a ($M_a$) on (i.e. $WL_a=VDD=_1.2$ volts (V)), while turning 620b ($M_b$) and 620c ($M_c$) off (i.e. $WL_b=WL_c=0$ V). Thus, all the current may flow through cell electrode 602 ($HM_1$) with no leakage current flowing through $MTJ_2$. Therefore, to write the two MTJs with no write-disturb failure, $MTJ_2$ may have to be programmed first, followed by the leakage free writing for $MTJ_1$.

It is worth mentioning that the leakage current flowing through $MTJ_1$ while programming $MTJ_2$ may be insignificant as the writing current may prefer to flow in the low resistance cell electrode 608 ($HM_2$) than to flow in the high resistance MTJ stack.

The resistance value of cell electrode 608 ($HM_2$) may be in the range of hundreds of ohms and the resistance of MTJ stack may be in the range of at least tens of kilo-ohms (as discussed later). Accordingly, the leakage current may be in the range of a few µA (e.g. any value from 1 µA to 5 µA, depending on the ratio between the values of cell electrode resistance and the stack resistance) for a writing current of (50 µA). The magnitude of 5 µA may be much smaller than the critical current of spin transfer torque (STT) switching of a SOT-MTJ. Moreover, the free-layers of the SOT-MTJs may have a damping constant ($\alpha$) that is relatively large. Therefore, this leakage current may not cause any write-disturb failure via STT-switching and the impact of the leakage current on the memory cell 600 may be insignificant.

Figure 6C:
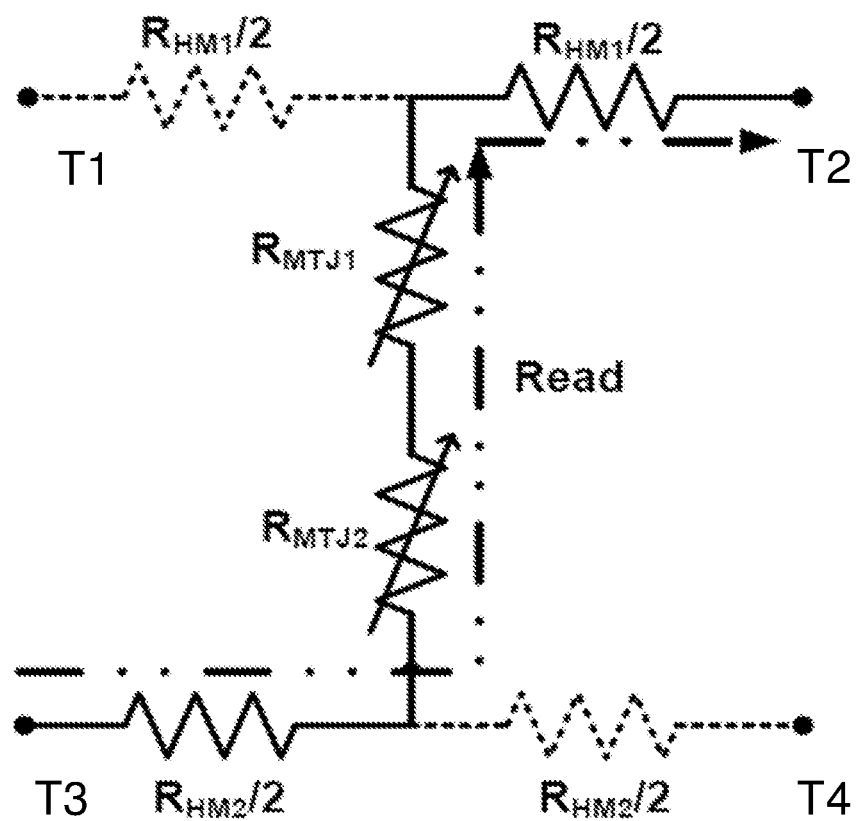
FIG. 6C shows the resistive model of the single port spin-orbit torque multi-level cell (SOT-MLC) in the reading mode according to various embodiments.

FIG. 6C shows the resistive model of the single port spin-orbit torque multi-level cell (SOT-MLC) in the reading mode according to various embodiments. The current path for determining the state of the memory cell by reading the stack resistance is shown in FIG. 6C. The read current may have to pass through the whole MTJ stack to be able to sense the existing resistance state. In order to read only the selected memory cell, both transistor 620a ($M_a$) and transistor 620c ($M_c$) may be deactivated for all memory cells of the array (i.e. $WL_a=WL_c=0$ V), while $M_b$ may be activated (i.e. $WL_b$=VDD) for the selected memory cell only. There may be no access transistor that can control BL from $HM_1$ side. As such, BL may be pulled down to '0' during the reading. The read current (Lead) may be supplied from the SL which is controlled by transistor 620b ($M_b$). Deactivating transistor 620b ($M_b$) for the non-selected cells may allow the read current to only flow through the selected memory cell (i.e. cell with activated $M_b$) to reading the resistance of the stack, thereby determining the state of the selected memory cell.

FIG. 6D is a table summarizing the bias conditions for the three different word lines ($WL_a$, $WL_b$, $WL_c$), the source line (SL) and the bit line (BL) in order to read and write the memory cell 600 according to various embodiments. It is noteworthy that same write voltage ($V_{WR}$) may be used to write both the MTJs. $V_{WR}$ may be $V_{DD}$.

Figure 7A:
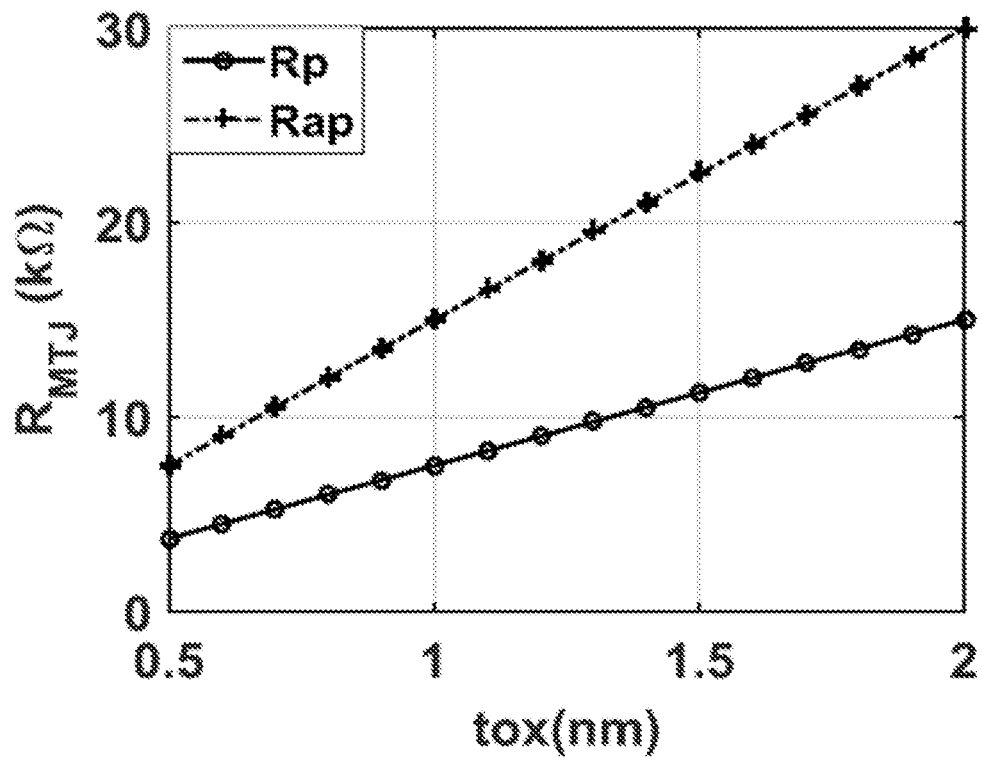
FIG. 7A shows a plot of resistance $R_{MTJ}$ (in kilo-ohms or kΩ) as a function of oxide thickness $t_{ox}$ (in nanometers or nm) illustrating the effect of the tunnel barrier thickness on the resistance of a magnetic tunnel junction for the parallel (Rp) configuration and anti-parallel configuration (Rap) according to various embodiments.
Figure 7B:
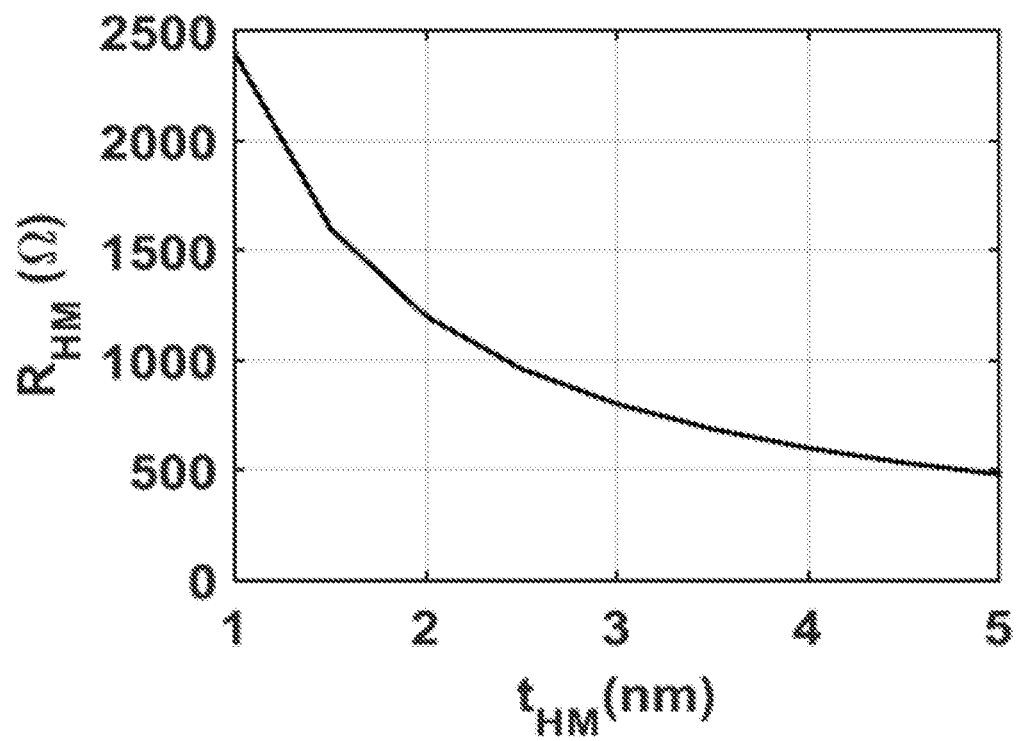
FIG. 7B shows a plot of resistance $R_{HM}$ (in ohms or Ω) as a function of cell electrode thickness $t_{HM}$ (in nanometers or nm) illustrating the effect of the cell electrode thickness on the electrode resistance according to various embodiments.

FIG. 7A shows a plot of resistance $R_{MTJ}$ (in kilo-ohms or k$\Omega$) as a function of oxide thickness $t_{ox}$ (in nanometers or nm) illustrating the effect of the tunnel barrier thickness on the resistance of a magnetic tunnel junction for the parallel (Rp) configuration and anti-parallel configuration (Rap) according to various embodiments. FIG. 7B shows a plot of resistance $R_{HM}$ (in ohms or $\Omega$) as a function of cell electrode thickness $t_{HM}$ (in nanometers or nm) illustrating the effect of the cell electrode thickness on the electrode resistance according to various embodiments. FIG. 7A and FIG. 7B show that the magnetic tunnel junction resistance (in tens of kilo-ohms) may be about two orders higher than the cell electrode resistance (in hundreds of ohms).

Figure 8:
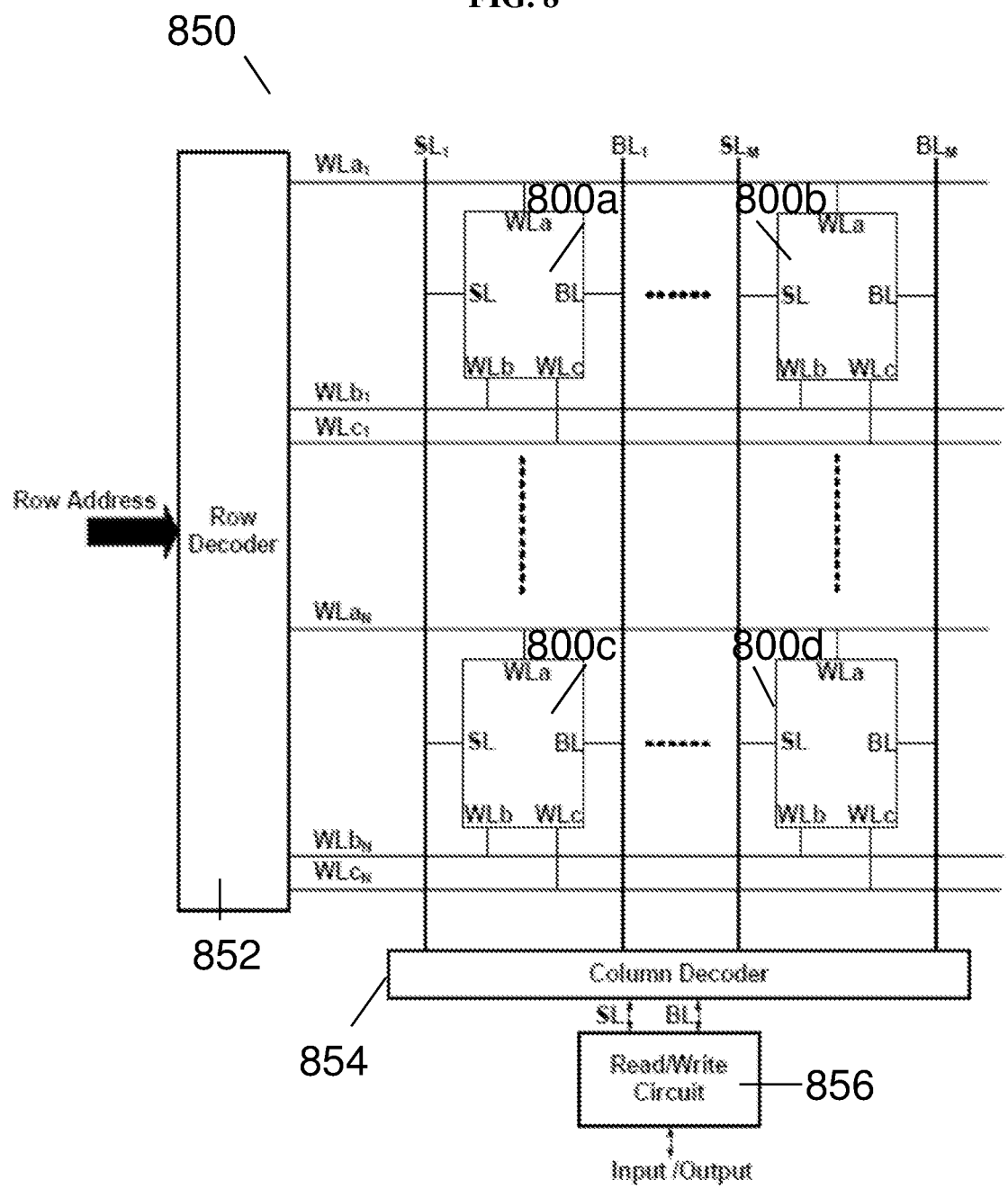
FIG. 8 shows a memory array including a plurality of memory cells according to various embodiments.

FIG. 8 shows a memory array 850 including a plurality of memory cells 800a-d according to various embodiments. The memory array 850 may also include a row decoder 852. The memory array 850 may further include a column decoder 854. The plurality of memory cells 800a-d may be arranged in N rows and M columns (N×M array). The column decoder and the row decoder may be configured to selected one memory cell out of the plurality of memory cells for reading and/or writing. The row decoder may select the row that includes the desired memory cell, while the column decoder may select the desired cell from the row selected by the row decider to either write or read the data.

The memory array may further include a read/write circuit 856 for reading and/or writing to the selected memory cell. The memory array or read/write circuit may include a write circuit configured to write to the selected memory cell, and a read circuit configured to read from the selected memory cell. For a single port MLC SOT MRAM, only one write driver per data channel and one column decoder may be enough to write each bit (within the cell) in different time spans.

Figure 9:
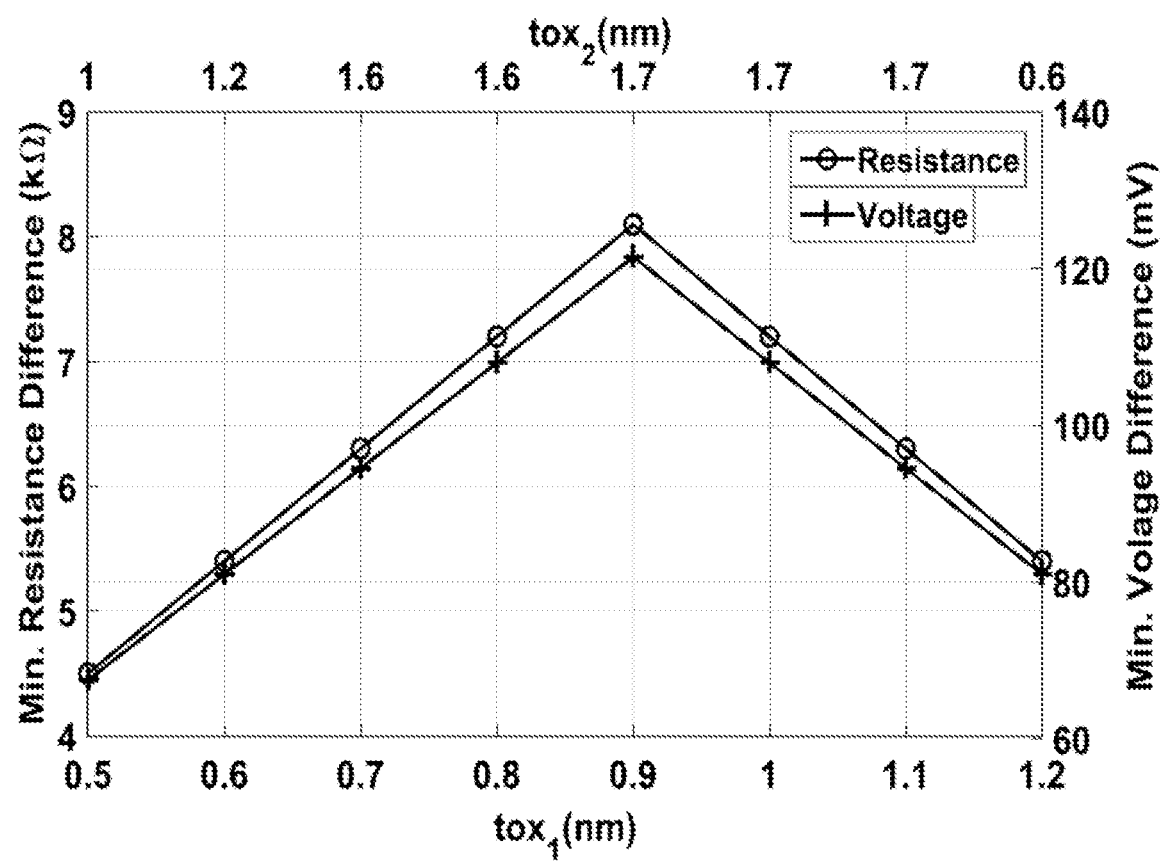
FIG. 9 is a plot of minimum resistance difference $\Delta R_{min}$ (in kilo-ohms or Ω)/minimum voltage difference (in milli-volts or mV) as a function of oxide thicknesses $tox_1$, $tox_2$ (in nanometers or nm) illustrating the minimum difference in resistance between the four states of the multi-level spin-orbit torque (MLC SOT) memory cell according to various embodiments based on the respective oxide thicknesses, as well as the corresponding minimum voltage difference $\Delta V_{min}$ for a read current of 15 µA.

FIG. 9 is a plot of minimum resistance difference $\Delta R_{min}$ (in kilo-ohms or k$\Omega$) /minimum voltage difference (in millivolts or mV) as a function of oxide thicknesses t$ox_1$, t$ox_2$ (in nanometers or nm) illustrating the minimum difference in resistance between the four states of the multi-level spin-orbit torque (MLC SOT) memory cell according to various embodiments based on the respective oxide thicknesses, as well as the corresponding minimum voltage difference $\Delta V_{min}$ for a read current of 15 µA.

$\Delta V_{min}$ and $\Delta R_{min}$ may be related by the equation:

$$\Delta V_{min} = I_{read} \times \Delta R_{min} \quad (1)$$

where $I_{read}$ is the read current.

The $\Delta R_{min}$ may be proportional to the read margin (RM), as $\Delta R_{min}$ corresponds to the worst-case difference between the resistance states. Hence, the greater the $\Delta R_{min}$, the broader the worst-case difference between the stack resistance and the used reference resistance, and the greater the RM. The graph in FIG. 9 may be based on the modelling equation for the resistance value of the MTJ for both parallel and anti-parallel configurations. The resistance of the parallel configuration $R_p$ may be provided by:

$$R_p = \frac{t_{ox}}{F * \varphi^{\frac{1}{2}} * \text{area}} * \exp\left(\frac{2(2me\varphi)^{\frac{1}{2}}}{h} * t_{ox}\right) \quad (2)$$

wherein $t_{ox}$ represents the thickness of the tunnelling barrier, h is the Planck constant, e is the electronic charge, m is the mass of an electron, F is a fitting parameter, and $\varphi$ is potential barrier height of the insulator layer, e.g. MgO. The resistance of the MTJ $R_{MTJ}$ may be provided by:

$$R_{MTJ} = \frac{1 + \left(\frac{V}{V_h}\right)^2 + TMR_0}{1 + \left(\frac{V}{V_h}\right)^2 + \frac{TMR_0(1 + \cos\theta)}{2}} \quad (3)$$

where V represents the applied voltage, $TMR_0$ is the tunnel magneto-resistance ratio (TMR) of MTJ under zero bias, $V_h$ is the bias voltage at which TMR is halved (i.e. divided by two), and $\theta$ is the angle between the free layer magnetization and the easy axis.

The graph may aid in choosing the appropriate tunnel barrier thickness of both MTJs to achieve larger read margin. From the graph, the greatest RM may be for $t_{ox1}$=0.9 nm and $t_{ox2}$=1.7 nm, which may result in approximately $\Delta R_{min}$=8 k$\Omega$.

Figure 10A:
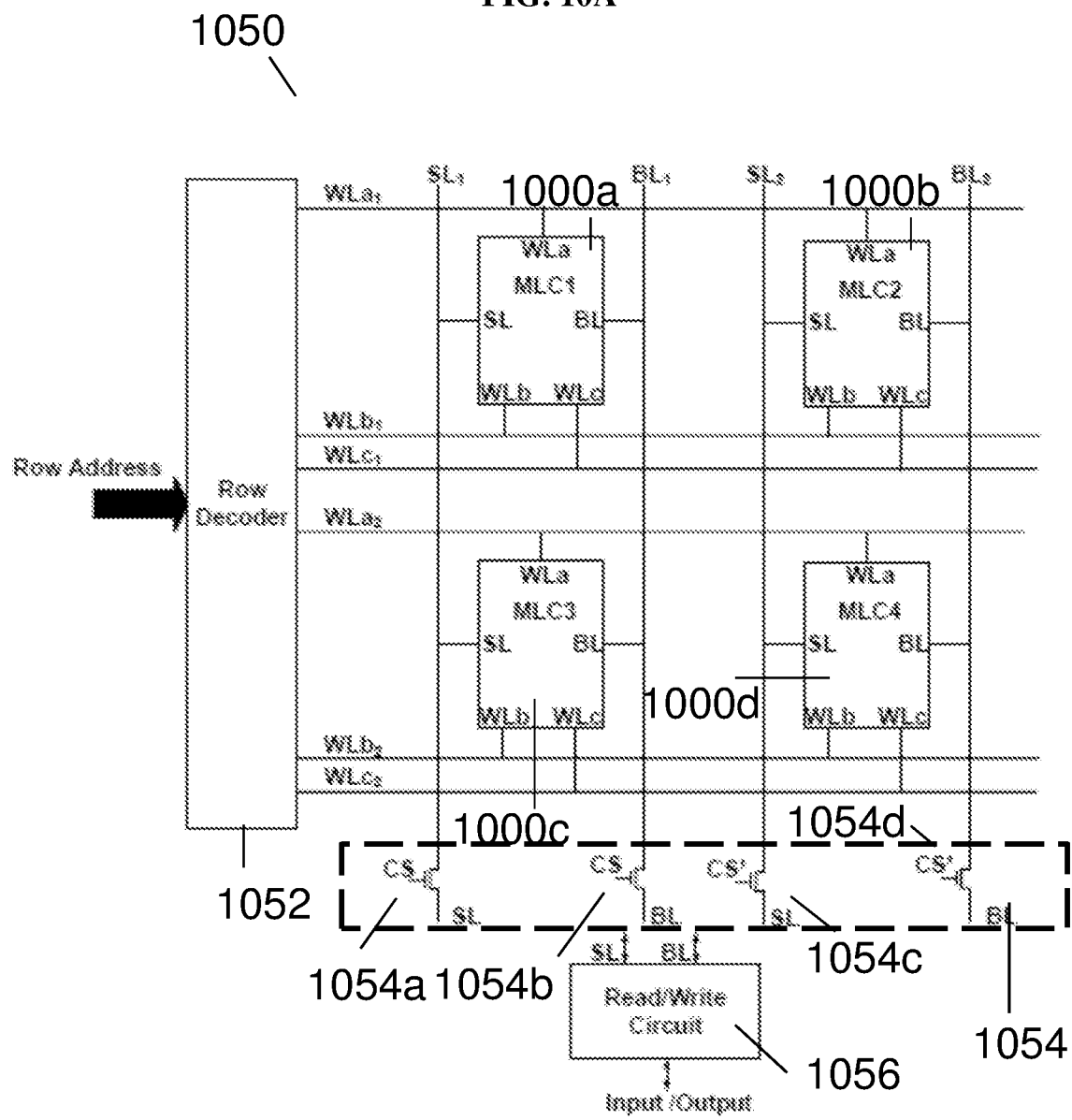
FIG. 10A shows a 2×2 single port spin-orbit torque multi-level cell (SOT-MLC) memory array for validation according to various embodiments.

FIG. 10A shows a 2×2 single port spin-orbit torque multi-level cell (SOT-MLC) memory array 1050 for validation according to various embodiments. The array 1050 may include memory cells 1000*a-d*. The array 1050 may also include a 1-bit row decoder 1052 and a 1-bit column decoder 1054 including column selector transistors 1054*a-d*. The 1-bit row decoder 1052 may be used to select one of two rows, and the 1-bit column decoder may be used to select one of two columns. The array 1050 may additionally include a read/write circuit 1056, which may include a write driver and read circuitry. Only one write driver may be required as the data is programmed serially.

Figure 10B:
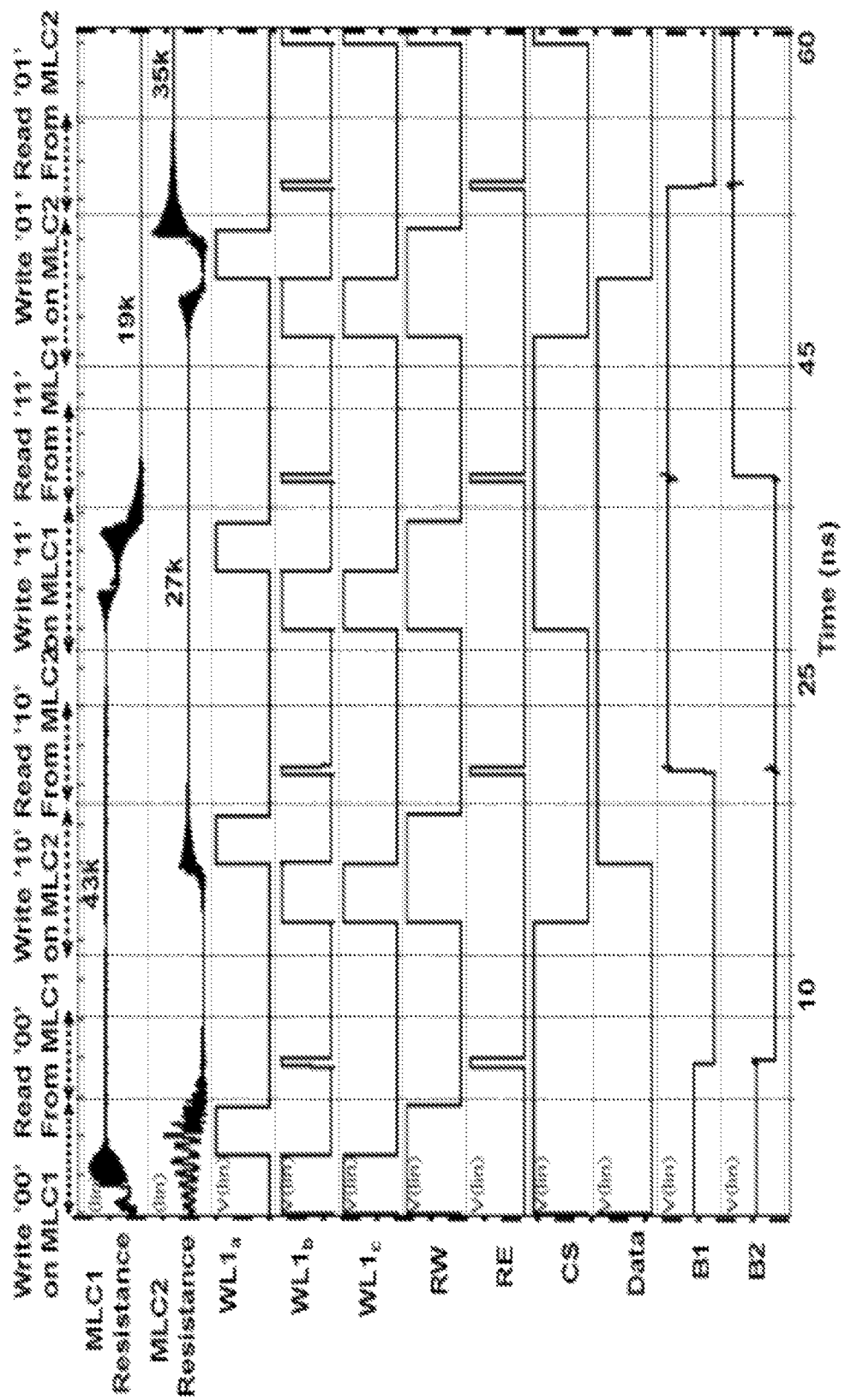
FIG. 10B shows a plot of resistance and various voltage signals as a function of time (in nanoseconds or ns) showing the validation of the programming or reading of the memory array shown in FIG. 10A according to various embodiments.

FIG. 10B shows a plot of resistance and various voltage signals as a function of time (in nanoseconds or ns) showing the validation of the programming or reading of the memory array 1050 shown in FIG. 10A according to various embodiments. FIG. 10C is a table showing the parameters used in the modelling of the memory array according to various embodiments. The memory cell 1000*a* $MC_1$ and the memory cell 1000*b* $MC_2$ may be used to perform the program/read operations. As such, only Row 1 may be activated for read/program operations. The read/program operation for $MLC_1$ may occur when the column selector signal CS='1', while for $MLC_2$ may occur when CS='0'. The data may be serially programmed.

The writing of $MTJ_1$ and $MTJ_2$ may occur at different time spans. FIG. 10B shows that $MLC_1$ may be first selected (i.e. CS='1') for programming "00", which is equivalent to a resistance state of 43 k$\Omega$, when the RW signal is raised high while the world line signals are activated to program each MTJ at a different time span. Thereafter, the data stored in $MLC_1$ may be read during a high RE signal. FIG. 10B demonstrates that the two bits are read correctly with B1='0' and B2='0'.

$MLC_2$ may then be selected (i.e. CS='0') for programming "10" (i.e. resistance state of 27 k$\Omega$), which is followed by reading $MLC_2$ stored data, resulting in having B1 as '1' and B2 as '0'. Subsequently, $MLC_1$ may be selected to program with "11" (i.e. resistance state of 19 k$\Omega$), followed by a read of $MLC_1$ that generates B1 as '1' and B2 as '1'. Finally, $MLC_2$ may be selected to program '01' (i.e. resistance state of 35 k$\Omega$), followed by a read of $MLC_2$ that generates B1 as '0' and B2 as '1'. FIG. 10B demonstrates that the data can be programmed to or read from the single port MLC-SOT MRAM.

Figure 11A:
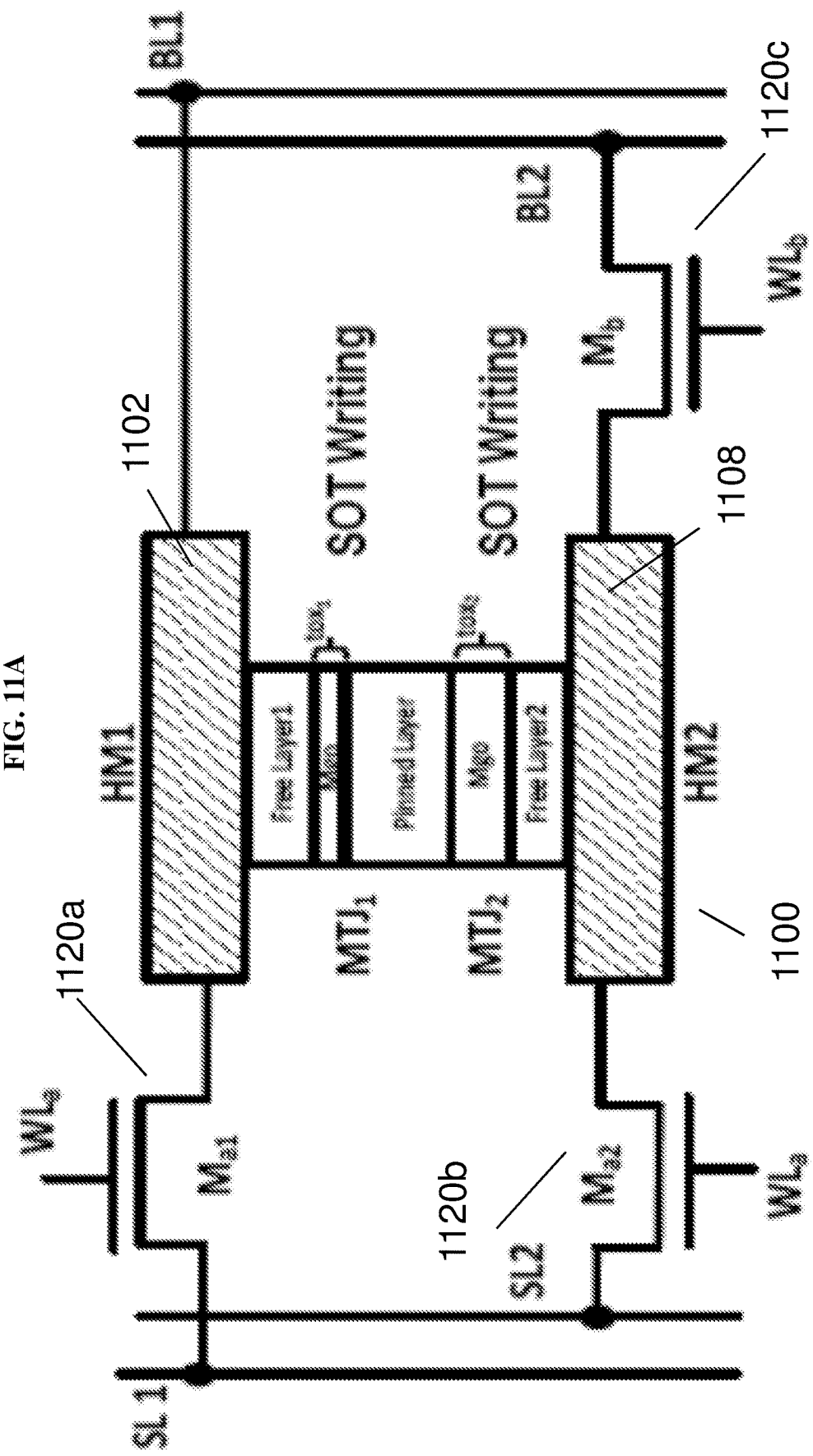
FIG. 11A shows a memory cell configured for dual port programming or writing according to various embodiments.

FIG. 11A shows a memory cell 1100 configured for dual port programming or writing according to various embodiments. In various embodiments, the memory cell 1100 have a similar structure as the memory cell 400 (as shown in FIG. 11A), while in various other embodiments, the memory cell 600 may have a similar structure as the memory cell 500. The memory cell 1100 may be referred to as a dual port MLC-SOT MRAM unit cell or a dual port SOT-MLC.

In a dual port MLC-SOT MRAM unit cell or a dual port SOT-MLC, the two MTJs in a memory cell may be written simultaneously, i.e. within the same time span. A first bit may be written to the first MTJ, and a second bit may be written to the second MTJ within the same time span. The layers forming a stack between cell electrodes 1102, 1108 are not labelled in FIG. 11A to reduce clutter and improve clarity.

The memory cell 1100 may include three access transistors 1120*a-c*. The memory cell 1100 may include a first transistor 1120*a* in electrical connection with an end portion of the first cell electrode 1102. The memory cell 1100 may also include a second transistor 1120*b* in electrical connection with an end portion of the second cell electrode 1108. The memory cell 1100 may further include a third transistor 1120*c* in electrical connection with a further end portion of the second cell electrode 1108.

The first transistor 1120*a* may include a control electrode, a first controlled electrode, and a second controlled electrode. The second transistor 1120*b* may include a control electrode, a first controlled electrode, and a second controlled electrode. The third transistor 1120c may include a control electrode, a first controlled electrode, and a second controlled electrode. The first controlled electrode of the first transistor 1120a may be in electrical connection with an end portion of the first cell electrode 1102. The first controlled electrode of the second transistor 1120b may be in electrical connection with an end portion of the second cell electrode. The first controlled electrode of the second transistor 1120c may be in electrical connection with a further end portion of the second cell electrode 1108.

The second controlled electrode of the first transistor 1120a may be in electrical connection with a first source line (SL1). The second controlled electrode of the second transistor 1120b may be in electrical connection with a second source line (SL2), the second source line (SL2) different from the first source line (S1).

A further end of the first cell electrode may be in electrical connection with a first bit line (BL1). The second controlled electrode of the third transistor 1120c may be in electrical connection with a second bit line (BL2), the second bit line different from the first bit line (BL1).

The control electrode of the first transistor 1120a ($M_{a1}$) and the control electrode of the second transistor 1120b ($M_{a2}$) may be in electrical connection with a first word line ($WL_a$). The control electrode of the third transistor 1120c ($M_b$) may be in electrical connection with a second word line ($WL_b$).

The dual port MLC-SOT MRAM unit cell may be different from the single port MLC-SOT unit cell. Firstly, the dual port MLC-SOT MRAM unit cell may have two separate paths to program each of the MTJs by using two bit lines (BL1, BL2) and two source lines (SL1, SL2) to program the two MTJs in-parallel to each other.

Secondly, the transistor 1120a ($M_{a1}$) and the transistor 1120b ($M_{a2}$) may be connected to achieve smaller area, while maintaining the correct functionality. The reason is that $M_{a1}$ and $M_{a2}$ may require the same input signal for both program and read operations.

Figure 11B:
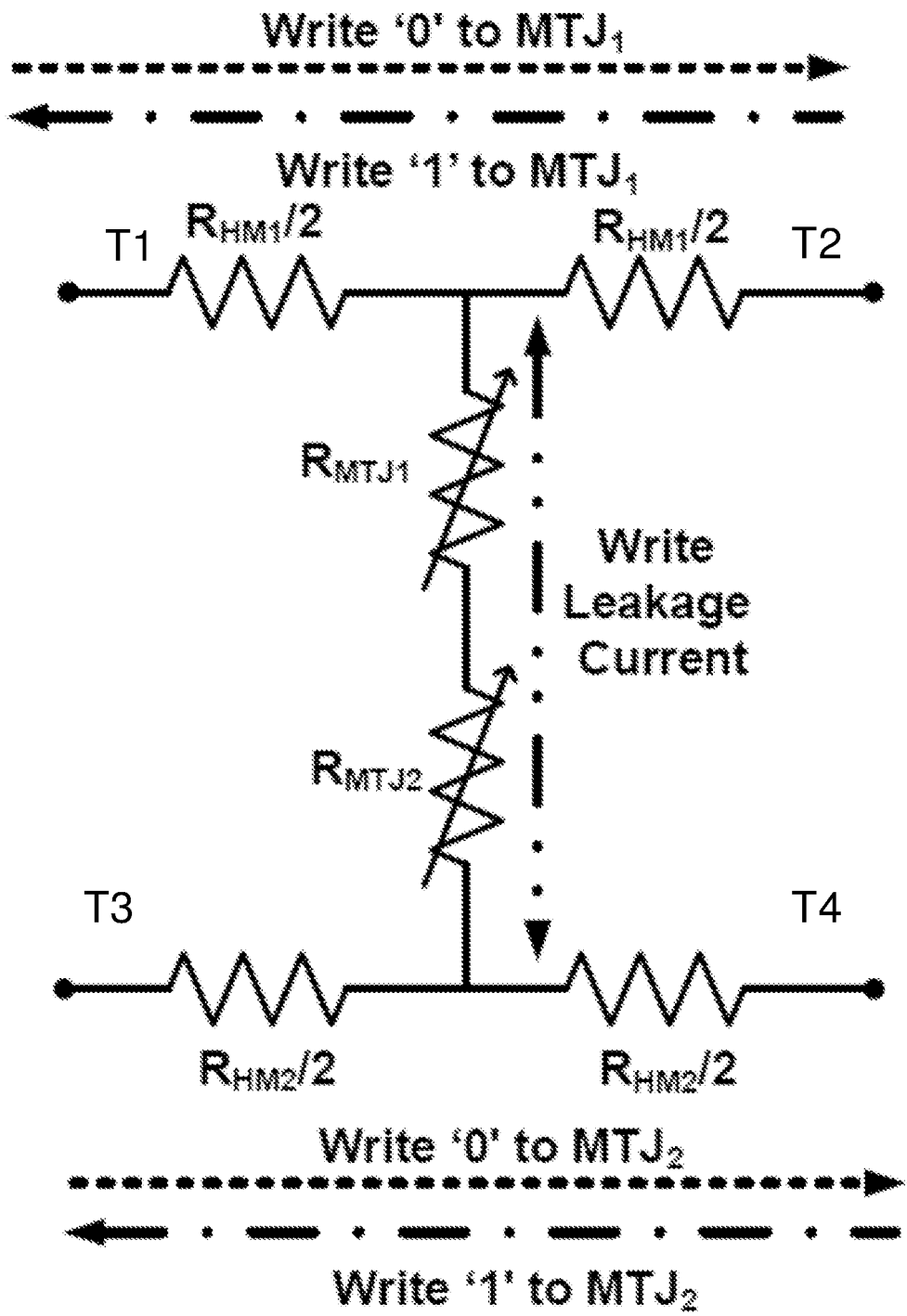
FIG. 11B shows the resistive model of the dual port spin-orbit torque multi-level cell (SOT-MLC) in the writing mode according to various embodiments.

FIG. 11B shows the resistive model of the dual port spin-orbit torque multi-level cell (SOT-MLC) in the writing mode according to various embodiments. A resistive T-model may be used to represent an MTJ. The cell 1100 may have a separate write path for each MTJ. The current paths for writing the two MTJs are shown in FIG. 11B. The current may flow from T1 to T2 for $MTJ_1$, and from T3 to T4 for $MTJ_2$ in order to write '0'. On the other hand, the current may flow from T2 to T1 for $MTJ_1$, and from T4 to T3 for $MTJ_2$ in order to write '1'. Consequently, in order to write '0' to one of the MTJs, SL of the MTJ may be pulled high and the BL of the MTJ pulled low. On the other, hand in order to write '1' to one of the MTJs, the SL of the MTJ may be pulled low and the BL of the MTJ may be pulled high. SL1 may be pulled high and BL1 may be pulled low to write '0' to $MTJ_1$. Similarly, SL2 may be pulled high and BL2 may be pulled low to write '0' to $MTJ_2$. Conversely, SL1 may be pulled low and BL1 may be pulled high to write '1' to $MTJ_1$. SL2 may be pulled low and BL2 may be pulled high to write '1' to $MTJ_2$.

A writing current of 50 µA may cause SOT effect occurrence.

In dual port programming, both the MTJs may be written in-parallel (i.e. within the same time span), with the aid of two bit lines, two source lines, two write drivers and one column decoder per bank. One column decoder may enable both the BL-SL pairs of the selected memory cell, and the two write drivers may determine the current flow to program the required data to the corresponding MTJ. Programming the two MTJs in-parallel may require activating all the access transistors 1120a-c of the memory cell 1100 (i.e. $WL_a=WL_b=VDD$). During the programming, a leakage current may flow through the MTJ stack. The leakage current may be insignificant, as the writing current may prefer to flow through the low resistance electrodes 1102, 1108 than flowing in the high resistance MTJ stack. The resistance value of the cell electrodes may be in the range of hundreds of ohms and the resistance of MTJ stack may be in the range of tens of kilo-ohms. The leakage current may be in the range of a few µA (e.g. any value from 1 to 5 µA, depending on the ratio between the values of cell electrode resistance and the stack resistance) for a writing current of 50 µA. The magnitude of 5 µA may be much smaller than the critical current of STT switching of an SOT-MTJ. Also, the free-layer of the SOT-MTJ may have damping constant α that is relatively large. Subsequently, the write leakage current may have an insignificant impact on the MTJs in terms of write-disturb failure via STT-switching, especially if the leakage current has been taken into consideration during the cell design.

Figure 11C:
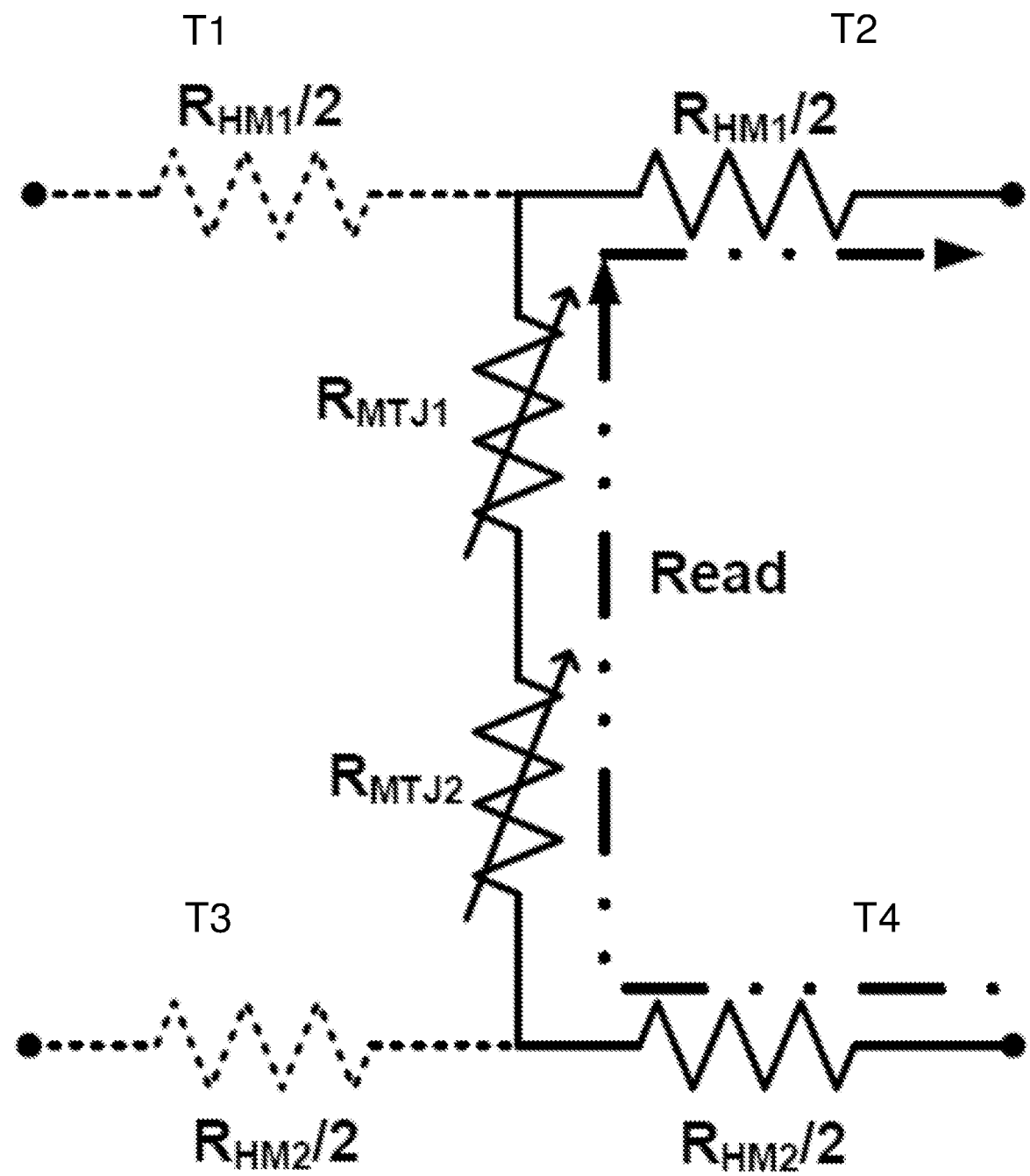
FIG. 11C shows the resistive model of the dual port spin-orbit torque multi-level cell (SOT-MLC) in the reading mode according to various embodiments.

FIG. 11C shows the resistive model of the dual port spin-orbit torque multi-level cell (SOT-MLC) in the reading mode according to various embodiments. The read current may have to pass through the whole MLC MTJ stack to be able to sense the existing resistance level. In order to ensure that only the selected cell is being read, $M_{a1}$ and $M_{a2}$ may be deactivated (i.e. $WL_a$='0') for all the cells, whilst $M_b$ may be activated (i.e. $WL_b$=VDD) for the selected cell only. In addition, the read current may have to be supplied from the BL2 terminal, while all the other source lines and the bit lines may be set to '0'. The reason is that BL2 is controlled by $M_b$, hence, deactivating $M_b$ for the non-selected cells may permit the read current to only flow through the selected cell only (i.e. cell with activated $M_b$) and successfully reading the stack resistance state.

FIG. 11D is a table summarizing the bias conditions for the two different word lines ($WL_a$, $WL_b$), the two source lines (SL1, SL2) and the two bit lines (BL1, BL2) in order to read and write the memory cell 1100 according to various embodiments. It is noteworthy that same write voltage ($V_{WR}$) may be used to write both the MTJs.

Figure 12A:
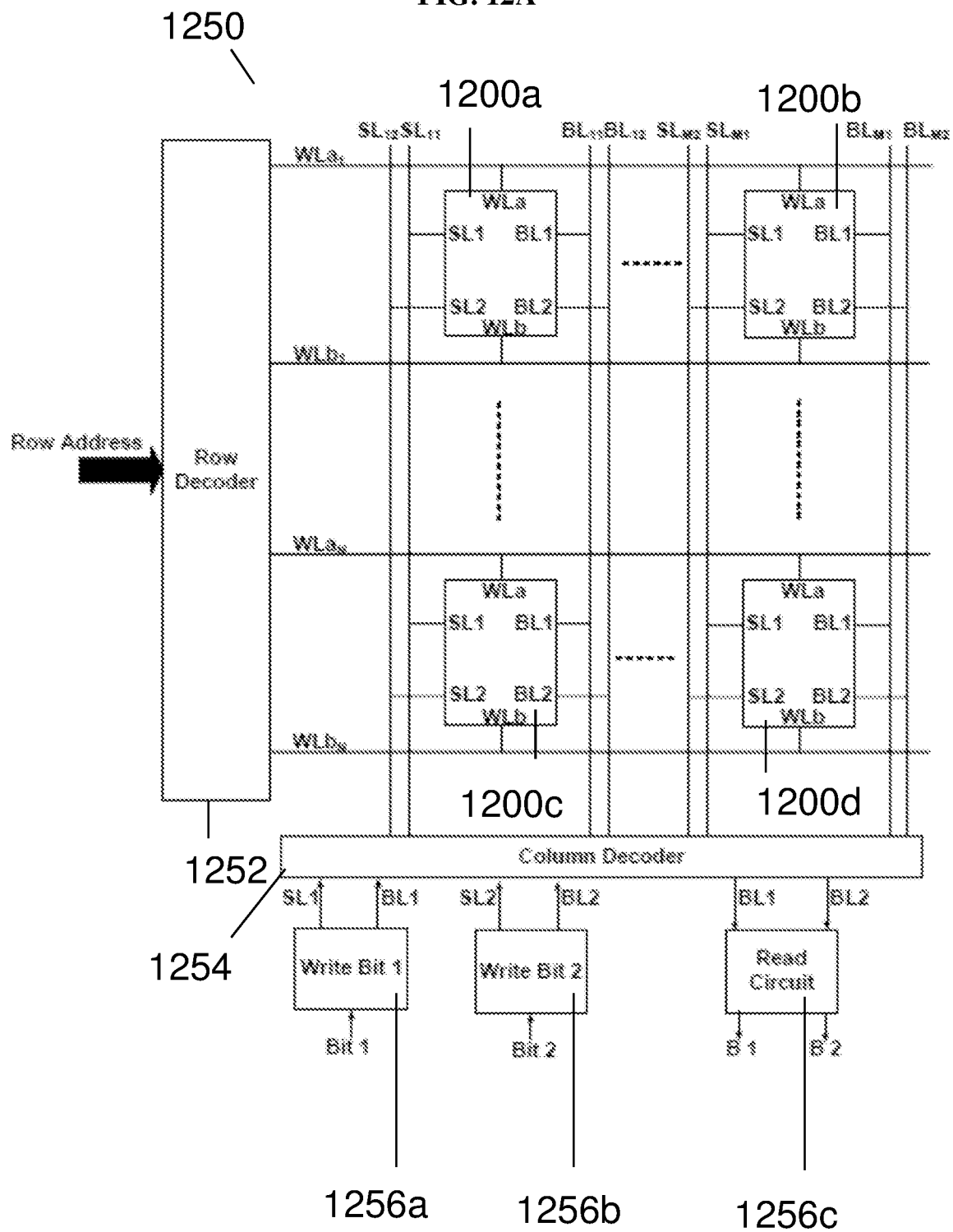
FIG. 12A shows a memory array including a plurality of memory cells according to various embodiments.

FIG. 12A shows a memory array 1250 including a plurality of memory cells 1200a-d according to various embodiments. The memory array 1250 may also include a row decoder 1252. The memory array 1250 may further include a column decoder 1254. The plurality of memory cells 1200a-d may be arranged in N rows and M columns (N×M array). The column decoder 1252 and the row decoder 1254 may be configured to select one memory cell out of the plurality of memory cells 1200a-d for reading and/or writing. The row decoder 1252 may select the row that includes the desired memory cell, while the column decoder 1254 may select the desired cell from the row selected by the row decider to either write or read the data.

The memory array 1250 may also include two write drivers 1256a, 1256b. The two write drivers 1256a, 1256b may form a write circuit configured to write to the selected memory cell. For a dual port MLC-SOT MRAM, two write drivers may be required to be able to program the two MTJs in-parallel. The column select switches that connect BL-SL to write drivers may be doubled, compared to the single port MLC-SOT MRAM, so as to be able to control the second bit line and second source line per column. The memory array 1250 may also include a read circuit or read driver 1256c configured to read from a selected memory cell.

Figure 12B:
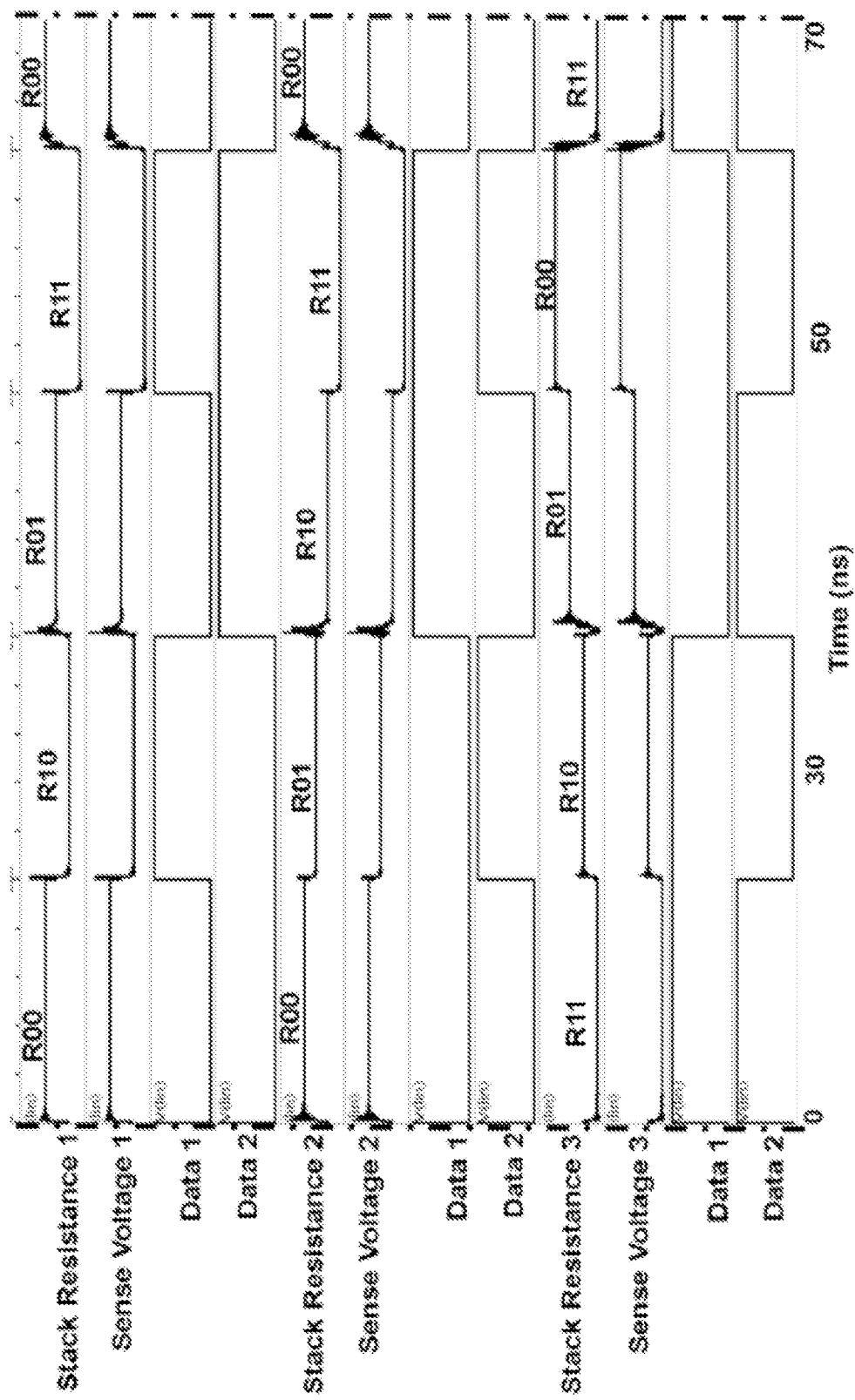
FIG. 12B shows a plot of stack resistance and sense and write voltage signals as a function of time (in nanoseconds or ns) showing the successful writing of simultaneous spin-orbit torque multi-level cell (SOT-MLC) with various data according to various embodiments.

FIG. 12B shows a plot of stack resistance and sense and write voltage signals as a function of time (in nanoseconds or ns) showing the successful writing of dual port spin-orbit torque multi-level cell (SOT-MLC) with various data according to various embodiments. The resistance may change from one state to another during only a single write pulse as both the MTJs are written in parallel. The resistance may change from one state to another in a controlled and repeatable manner regardless of the previous state of the MTJ stack.

Figure 13A:
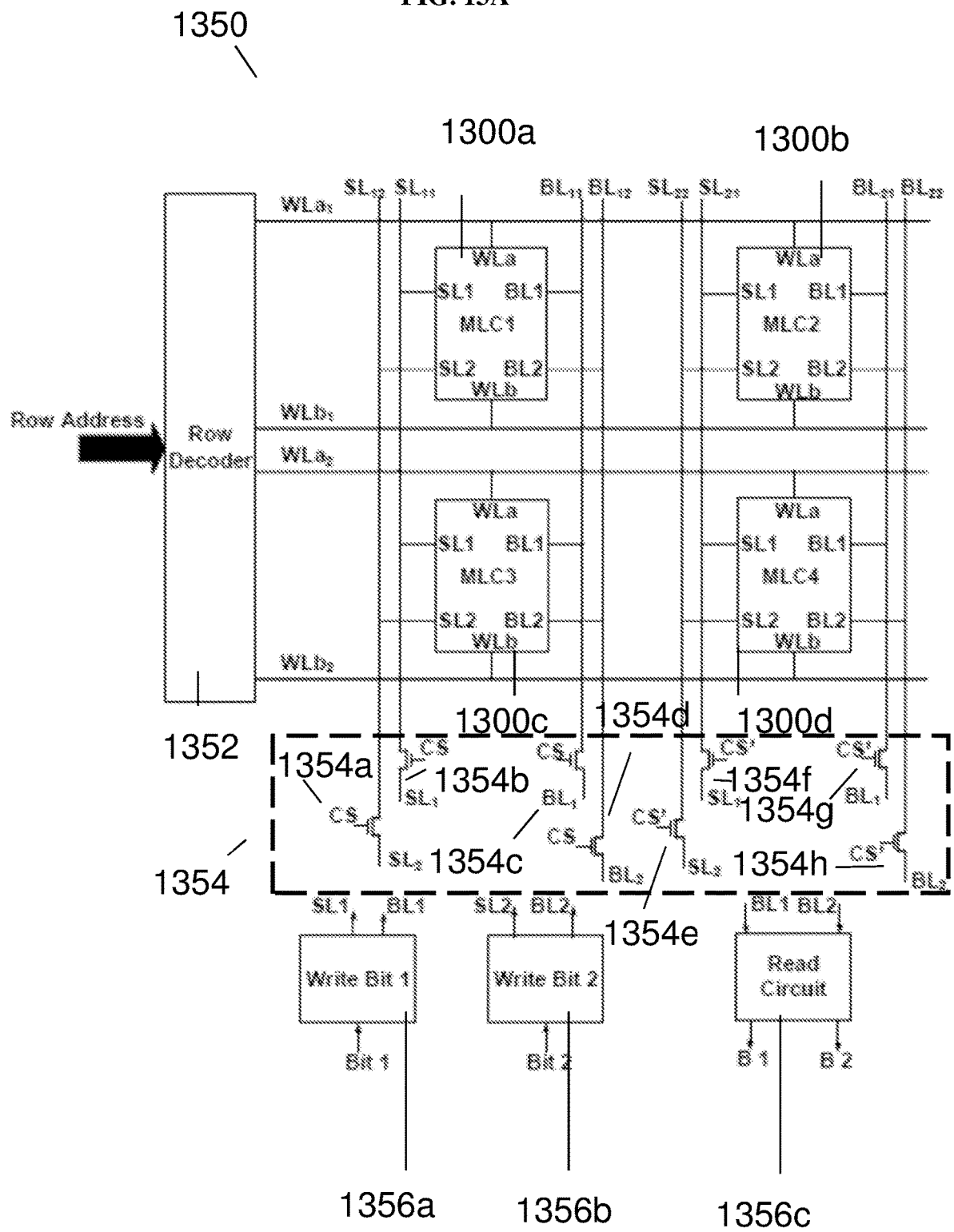
FIG. 13A shows a 2×2 dual port spin-orbit torque multi-level cell (SOT-MLC) memory array for validation according to various embodiments.

FIG. 13A shows a 2×2 dual port spin-orbit torque multi-level cell (SOT-MLC) memory array 1350 for validation according to various embodiments. The memory cell may include a read circuitry 1356c, two write drivers 1356a, 1356b, a 1-bit row decoder 1352 to select one of the two rows and a 1-bit column decoder 1354. A single column decoder 1354 may be enough to select the two bit lines and two source lines for each column as they share the same address. The column select switches 1354a-h may be doubled (compared to the single port MLC-SOT MRAM) so as to be able to control the second BL and second SL. Two write drivers 1356a, 1356b which determine the current flow directions in the HM electrodes, may be required for programming the two MTJs in parallel (i.e. within the same time span).

Figure 13B:
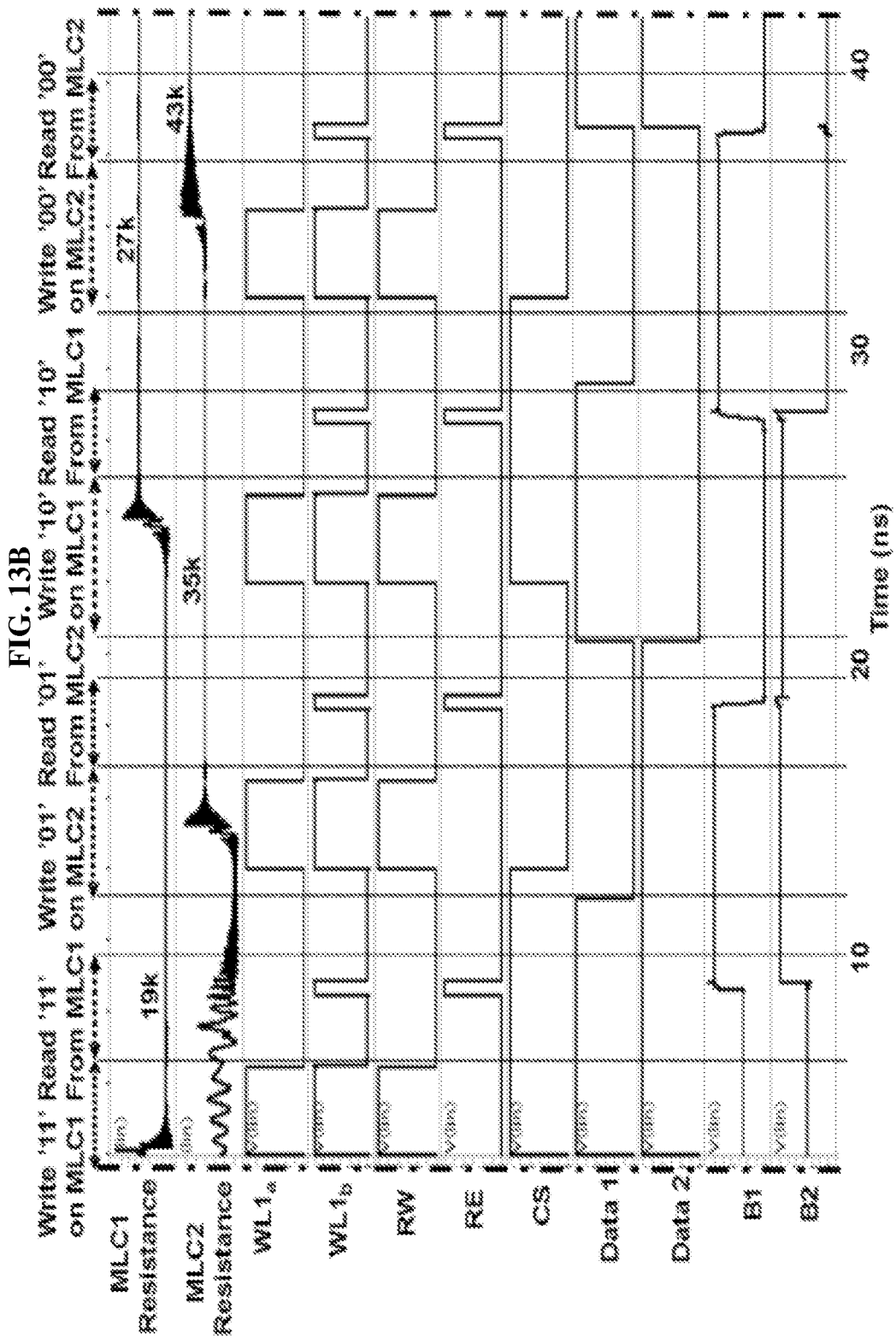
FIG. 13B shows a plot of resistance and various voltage signals as a function of time (in nanoseconds or ns) showing the validation of the programming or reading of the memory array shown in FIG. 13A according to various embodiments.

FIG. 13B shows a plot of resistance and various voltage signals as a function of time (in nanoseconds or ns) showing the validation of the programming or reading of the memory array 1350 shown in FIG. 13A according to various embodiments. The memory cell 1300a $MLC_1$ and the memory cell 1300b $MLC_2$ may be used to perform the program/read operations. As such, only Row 1 may be activated for read/program operations. The read/program operations for the memory cell 1300a $MLC_1$ may occur when the column selector signal (CS)='1', while for $MLC_2$ occurs when CS='0'. The two bits may be programmed simultaneously; hence, $MTJ_1$ and $MTJ_2$ writing may occur at the same time span.

FIG. 13B shows that $MLC_1$ is firstly selected (i.e. CS='1') for programming "11", which may be equivalent to a resistance state of 19 k$\Omega$ when the write (RW) signal is raised high while the world line signals are activated to program the two MTJs at the same time span (i.e. simultaneously). Thereafter, the data stored in $MLC_1$ may be sensed during a high read (RE) signal. FIG. 13B demonstrates that the two bits are read correctly with B1='1' and B2='1'.

Subsequently, $MLC_2$ may be selected (i.e. CS='0') for programming "01" (i.e. resistance state of 35 k$\Omega$), which is followed by reading $MLC_2$ stored data, resulting in changing of B1 to '0', while B2 remains '1'. Then, $MLC_1$ may be selected to program "10" (i.e. resistance state of 27 k$\Omega$), followed by a read for $MLC_1$ that changes B1 to '1' and B2 to '0'. Finally, $MLC_2$ may be selected to program '00' (i.e. resistance state of 43 k$\Omega$), followed by a read for $MLC_2$, which changes B1 to '0' and B2 remains '0'. In conclusion, FIG. 13B demonstrates that the data may be programmed to or read from a dual port MLC-SOT MRAM.

Figure 14A:
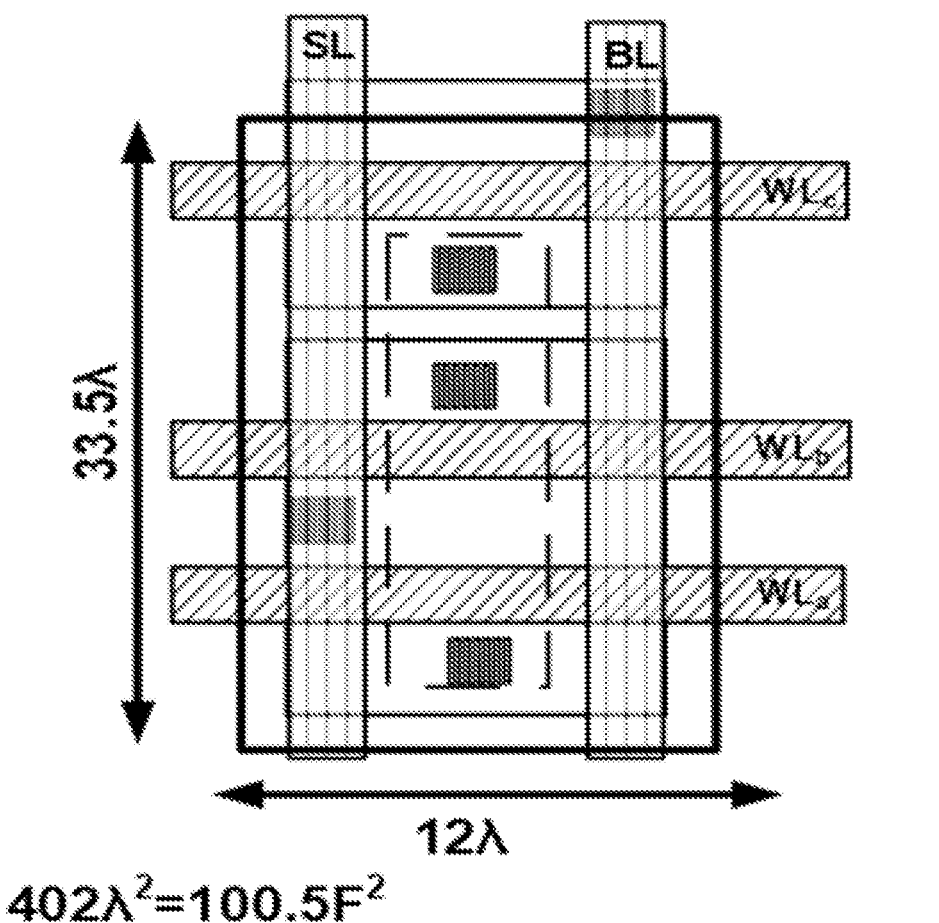
FIG. 14A is a schematic showing the layout of a single port spin-orbit torque multi-level cell (SOT-MLC) memory cell according to various embodiments.

FIG. 14A is a schematic showing the layout of a single port spin-orbit torque multi-level cell (SOT-MLC) memory cell according to various embodiments. The layout shows the access transistors of the MLC memory cell, the bit line and source line that are on different front-end of line (FEOL) metal layers and back-end of line (BEOL) metal layers. The memory cell may require three access transistors with three different poly gates that may increase the cell area. However, $M_a$ and $M_b$ may have a common terminal (i.e. connected to SL), which may help to decrease the overall area of the cell.

Figure 14B:
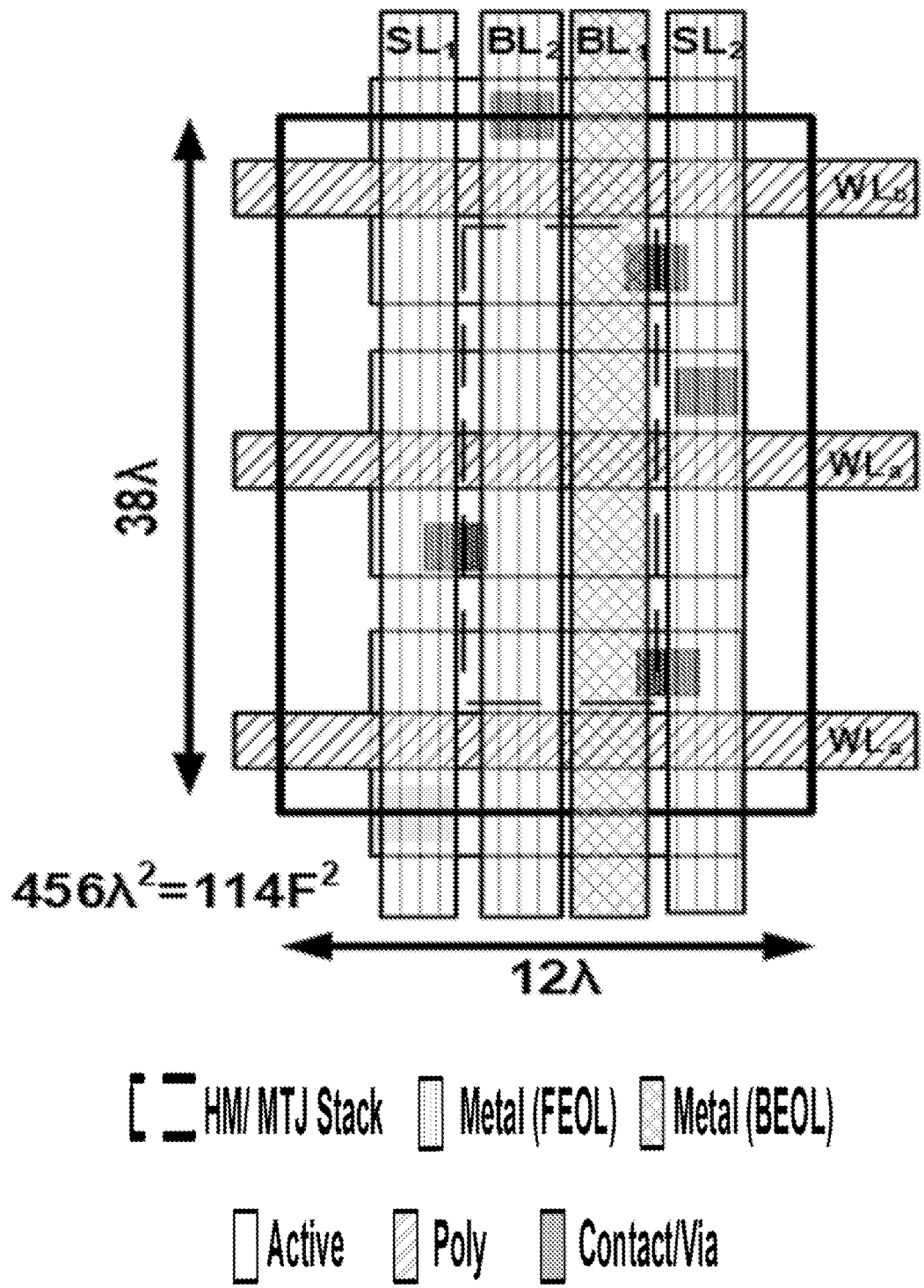
FIG. 14B is a schematic showing the layout of a dual port spin-orbit torque multi-level cell (SOT-MLC) memory cell according to various embodiments.

FIG. 14B is a schematic showing the layout of a dual port spin-orbit torque multi-level cell (SOT-MLC) memory cell according to various embodiments. The layout shows the three access transistors of the memory cell, the bit lines and source lines that are on the different front-end of line (FEOL) metal layers and back-end of line (BEOL) metal layers. As the terminals of transistors $M_{a1}$ and $M_{a2}$ are now connected to different signals (i.e. $M_{a1}$ source connected to SL1, while $M_{a2}$ source connected to SL2), an extra active spacing may be added between $M_{a1}$ and $M_{a2}$ source terminals, which may result in increasing the cell area from 100.5 $F^2$ (single port MLC area) to 114$F^2$ (i.e. 38$F^2$ 1-bit effective area).

Figure 15:
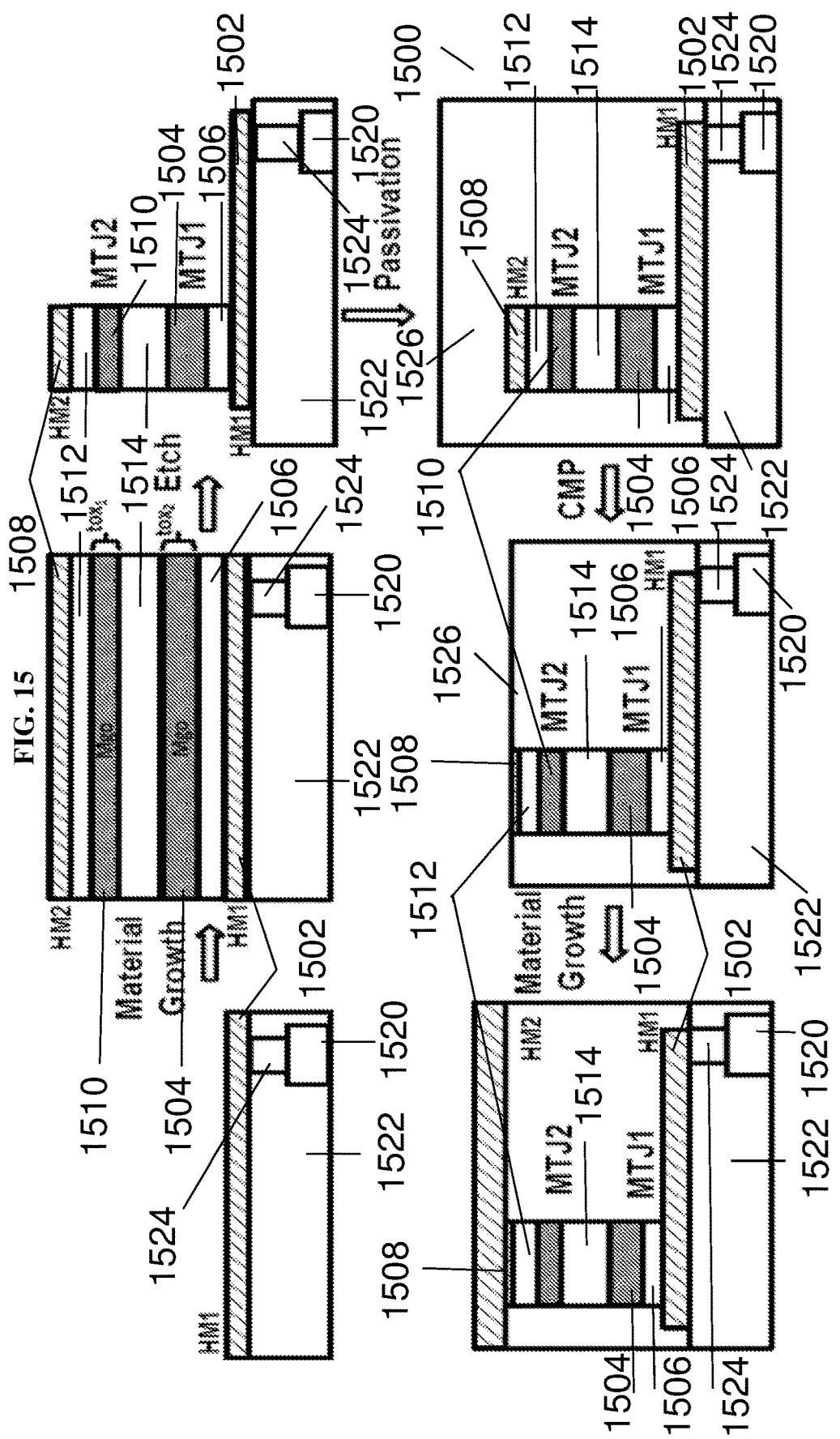
FIG. 15 shows a schematic illustrating a method of forming a memory cell according to various embodiments.

FIG. 15 shows a schematic illustrating a method of forming a memory cell 1500 according to various embodiments. The memory cell 1500 may correspond to the memory cell 400 shown in FIG. 4A. The transistors 1520 may be formed on a substrate 1522 based on the standard complementary metal oxide semiconductor (CMOS) processes in the front-end of line (FEOL). Thereafter, metal contacts 1524, such as lines or vias, may be formed on the substrate 1522 before forming the first cell electrode 1502 ($HM_1$). The metal contacts 1524 may provide interconnection between the transistors 1520 and the first cell electrode 1502 ($HM_1$). The memory stack (also referred to as MTJ stack) may then be grown in a layer by layer manner by physical vapour deposition (PVD) technique. A first magnetic free layer 1506 may be formed on the first cell electrode 1502, and a first insulator layer 1504, such as a MgO layer, may be formed on the first magnetic free layer 1506. A magnetic pinned layer 1514 may be formed on the first insulator layer 1504, and a second insulator layer 1510, such as a MgO layer, may be formed on a magnetic pinned layer 1514. A second magnetic free layer 1512 may be formed on the second insulator layer 1510. A second cell electrode layer 1508 may be formed on the second magnetic free layer. A structure including two MTJs and two cell electrodes 1502, 1508 may be formed in such a manner.

The thickness of the tunnel barrier of each MTJ may be controlled during the PVD process. After depositing all the layers, the stack may be patterned to the required dimensions by subsequent lithography and etching processes. As the cell design employs MTJs with similar length and width, the etching process may be carried out in a single process step.

An insulation layer 1526 may be formed to cover the memory stack. The insulation layer 1526 may be formed by deposition of an insulator material, e.g. by using by plasma enhanced chemical vapour deposition (PECVD), over the memory stack and the cell electrodes 1502, 1508 for electric protection.

Thereafter, chemical mechanical polishing (CMP) may be executed to smoothen the insulation layer surface and reveal the cell electrode 1508 ($HM_2$). Finally, more heavy metal material may be deposited, e.g. via PVD, to extend the cell electrode 1508 ($HM_2$), which may be followed by insulation formation and contact formation to create an interconnection between $HM_2$ and the backend of line (BEOL) metal layers.

Various embodiments may be a four terminal SOT-MLC structure with two separate write paths. Various embodiments may include three access transistors per 2 bits (i.e. equivalent to a 3-transistors 2-resistors (3T2R) cell. Various embodiments may involve SOT writing of both MTJs per unit cell. Various embodiments may include dual write ports for simultaneous programming. Various embodiments may have a uniform MTJ or memory stack cross-section.

Figure 16A:
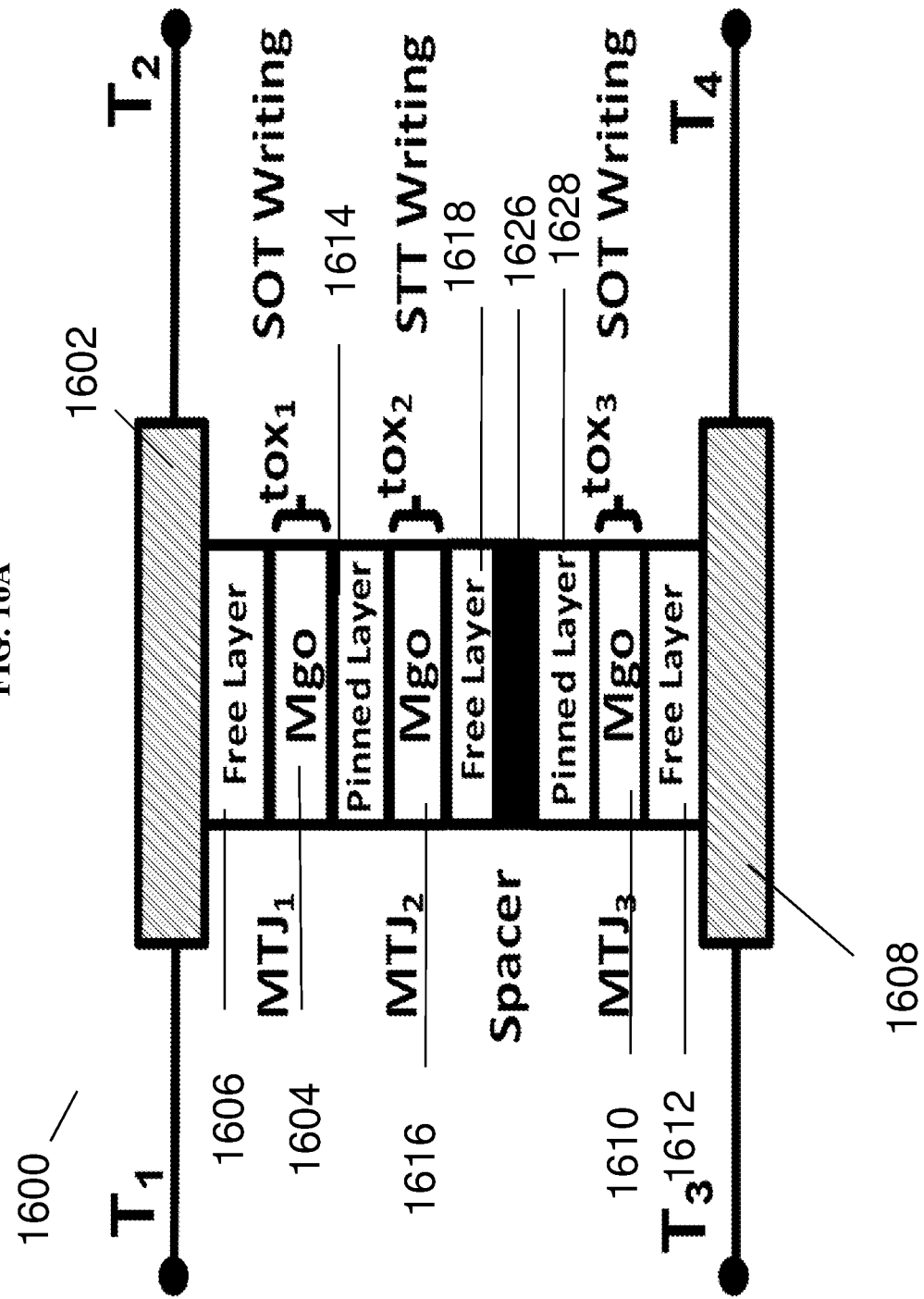
FIG. 16A shows a schematic of a memory cell according to various embodiments.

FIG. 16A shows a schematic of a memory cell 1600 according to various embodiments. The memory cell 1600 may include a first cell electrode 1602. The memory cell 1600 may also include a first insulator layer 1604. The memory cell 1600 may further include a first magnetic free layer 1606 between the first cell electrode 1602 and the first insulator layer 1604. The memory cell 1600 may also include a second cell electrode 1608. The memory cell 1600 may further include a second insulator layer 1610. The memory cell 1600 may additionally include a second magnetic free layer 1612 between the second cell electrode 1608 and the second insulator layer 1610. The memory cell 1600 may also include a magnetic pinned layer 1614 between the first insulator layer 1604 and the second insulator layer 1610.

The memory cell 1600 may also include a third insulator layer 1616, a third magnetic free layer 1618, a spacer layer 1626, and a further pinned layer 1628 between the pinned layer 1614 and the second insulator layer 1610.

The third insulator layer 1616 may be between the pinned layer 1614 and the third magnetic free layer 1618. The further pinned layer 1628 may be between the spacer layer 1626 and the second insulator layer 1610. The spacer layer 1626 may be between the third magnetic free layer 1618 and the further pinned layer 1628. The third magnetic free layer 1618 may be between the spacer layer 1626 and the third insulator layer 1616.

A direction of magnetization of the first magnetic free layer 1606 may be changeable in response to a current flowing between a first end and a second end of the first cell electrode 1602. A direction of magnetization of the second magnetic free layer 1612 may be changeable in response to a current flowing between a first end and a second end of the second cell electrode 1608. The magnetic pinned layer 1614 may have a fixed direction of magnetization.

A direction of magnetization of the third magnetic free layer 1618 may be (independently) changeable in response to a current flowing through the third magnetic free layer 1618. The further magnetic pinned layer 1628 may have a fixed direction of magnetization.

The direction of magnetization of the first magnetic free layer 1606 may be changeable in response to the current flowing between the first end and the second end of the first cell electrode 1602 due to spin-orbit torque (SOT) effect. The direction of magnetization of the second magnetic free layer 1612 may be changeable in response to the current flowing between the first end and the second end of the second cell electrode 1608 due to spin-orbit torque (SOT) effect.

The direction of magnetization of the third magnetic free layer 1618 may be changeable in response to the current flowing through the third magnetic free layer 1618 due to spin-transfer torque (STT) effect.

The current flowing through the third magnetic free layer 1618 may be substantially perpendicular to the current flowing through the first cell electrode 1602, or the current flowing through the second cell electrode 1608.

The second magnetic free layer 1612 may be on the second cell electrode 1608, the second insulator layer 1610 may be on the second magnetic free layer 1612, the further magnetic pinned layer 1628 may be on the second insulator layer 1610, the spacer layer 1626 may be on the further magnetic pinned layer 1628, the third magnetic free layer 1618 may be on the spacer layer 1626, the third insulator layer 1616 may be on the third magnetic free layer 1618, the magnetic pinned layer 1614 may be on the third insulator layer 1616, the first insulator layer 1604 may be on the magnetic pinned layer 1614, the first magnetic free layer 1606 may be on the first insulator layer 1604, and the first cell electrode 1602 may be on the first magnetic free layer 1606. The first magnetic free layer 1606, the first insulating layer 1604, and the magnetic pinned layer 1614 may form the first MTJ (MTJ$_1$), which may be referred to as a first SOT-MTJ. The magnetic pinned layer 1614, the third insulating layer 1616, and the third magnetic free layer 1618 may form the second MTJ (MTJ$_2$), which may be referred to as a STT-MTJ. The further magnetic pinned layer 1628, the second insulating layer 1610, and the second magnetic free layer 1612 may form the third MTJ (MTJ$_3$), which may be referred to as a second SOT-MTJ.

The memory cell may include a uniform stack placed in-between two cell or heavy metal electrodes (HM$_1$ and HM$_2$). The stack may include three MTJs (MTJ$_1$, MTJ$_2$ and MTJ$_3$). The top two MTJs (MTJ$_1$, MTJ$_2$) may share a common pinned layer 1614. A spacer layer 1626 may be placed between the free layer 1618 of MTJ2 and the pinned layer 1628 of the bottom MTJ$_3$. The free layer 1606 of the top MTJ (MTJ$_1$) and the free layer of the bottom MTJ (MTJ$_3$) MTJs may be placed in direct contact with the respective HM electrode 1602, 1608 such that these two MTJs may be programmed by the spin-orbit torque (SOT) effect. These two MTJs may be programmed independently and simultaneously as they have different write paths. The middle MTJ (MTJ$_2$) may be written independently using spin-transfer torque (STT) programming, wherein the STT write current may only affect the state of MTJ$_2$ without affecting the states of MTJ$_1$ and MTJ$_3$, due to the significantly larger STT coefficient of MTJ$_2$ compared to MTJ$_1$ and MTJ$_3$. The stacked MTJs may have a uniform cross-sectional area, but may have different tunnel barrier thicknesses (tox$_1$, tox$_2$ and tox$_3$). Different tunnel barrier thicknesses may permit achieving various dedicated resistance levels for each MTJ in both parallel and anti-parallel configurations, which may allow the realization of eight distinct stack resistance states for the three MTJs in series. The memory cell 1600 may be referred to as a triple-level cell (TLC) spin-orbit torque (SOT) memory cell.

The memory cell 1600 may be formed by a simplified process flow. Due to the uniform cross-sectional area of the three stacked MTJs, the whole stack may be processed in a single flow, which may simplify the fabrication process. In addition, the memory cell 1600 may only require four terminals (T1 to T4 in FIG. 16A) to successfully read and write the three bits per cell. On the other hand, three bits of single-level cell (SLC) SOT MRAM, which is based on three-terminal device SOT-MTJ, has nine terminals. Therefore, the TLC cell 1600 may require fewer terminals, which may simplify the manufacturing process and may result in additional area saving.

Various embodiments may have high energy efficiency. Due to the two heavy metal (HM) electrodes 1602, 1608, two of the three MTJs may be programmed by the energy efficient SOT effect.

As the three MTJs are connected in-series, the minimum resistance value difference ($\Delta R_{min}$) between the eight distinct resistance states of the stack may be larger compared to connecting the MTJs in parallel. A larger $\Delta R_{min}$ may indicate larger read margin, and consequently shorter read delay.

The existence of the two HM electrodes 1602, 1608 may permit writing the top MTJ (MTJ$_1$) and bottom MTJ (MTJ$_3$) independently using SOT effect. Moreover, the middle MTJ (MTJ$_2$) may be written independently through STT effect without affecting the states of the top and bottom MTJs due to the significantly larger STT coefficient of MTJ$_2$. The separate write paths for the three MTJs (i.e. MTJ$_1$ may be written through HM$_1$, MTJ$_3$ may be written through HM$_2$, while MTJ$_2$ may be written independently by flowing current through the MTJ stack (STT writing)) may reduce the probability of writing disturbance occurrence for one of the three MTJs while writing the other.

The memory cell 1600 may permit having both single port and dual port architectures.

Figure 16B:
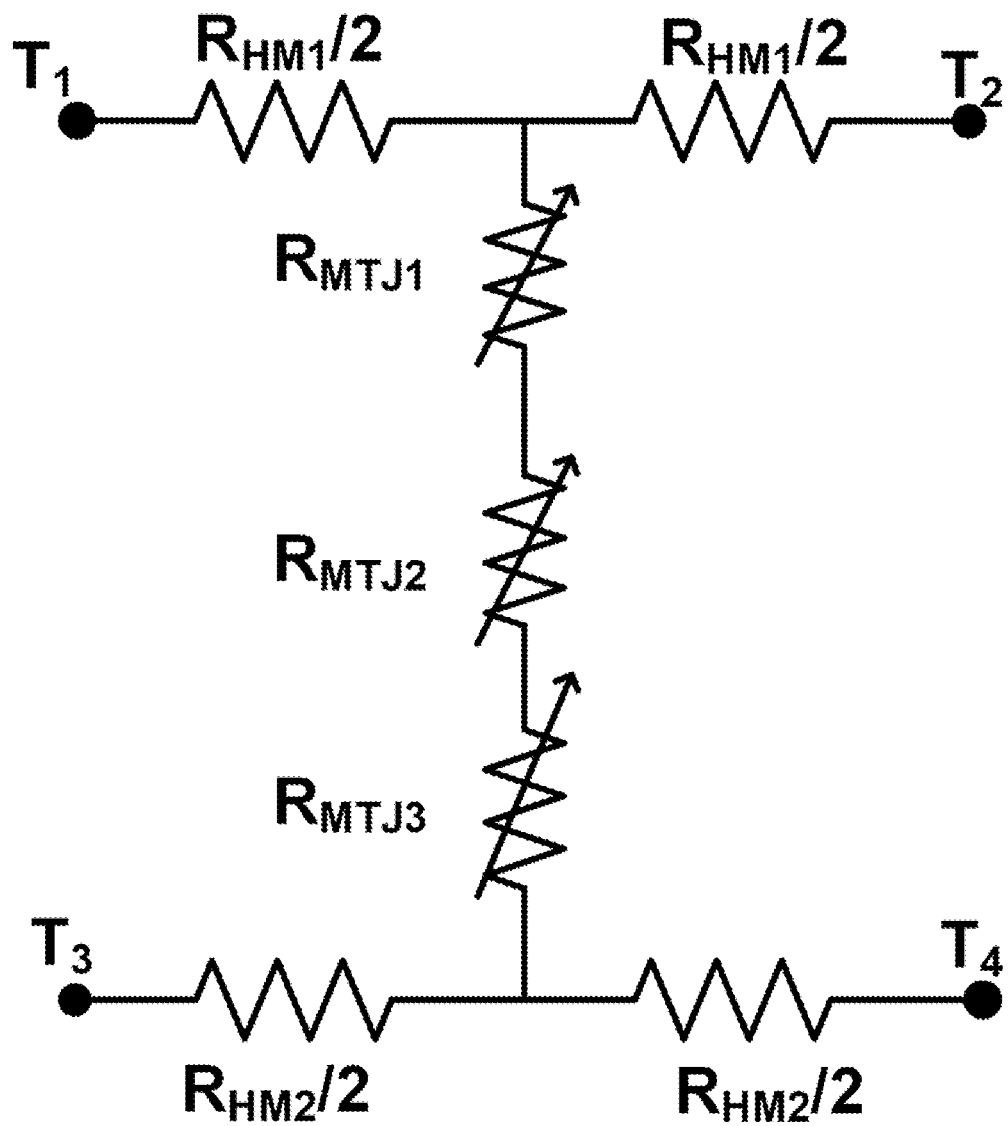
FIG. 16B shows the equivalent electrical model of the memory cell shown in FIG. 16A according to various embodiments.

FIG. 16B shows the equivalent electrical model of the memory cell 1600 shown in FIG. 16A according to various embodiments. A resistive T-Model may be used to represent each of the two SOT-MTJs, wherein each SOT-MTJ may be modelled by three resistances. Two fixed resistances may model the cell electrode (HM electrode) resistance and one variable resistance may model the MTJ resistance value. The middle STT-MTJ may be modeled by one variable resistance. The electrical representation may be used to capture the electrical response of the TLC cell in an implemented SPICE compatible Verilog-A model. Moreover, the LLG equation may be integrated into the model to emulate the magnetic response of the SOT-MTJs and the STT-MTJ. The implemented Verilog-A model may be verified against experimental data.

Figure 17:
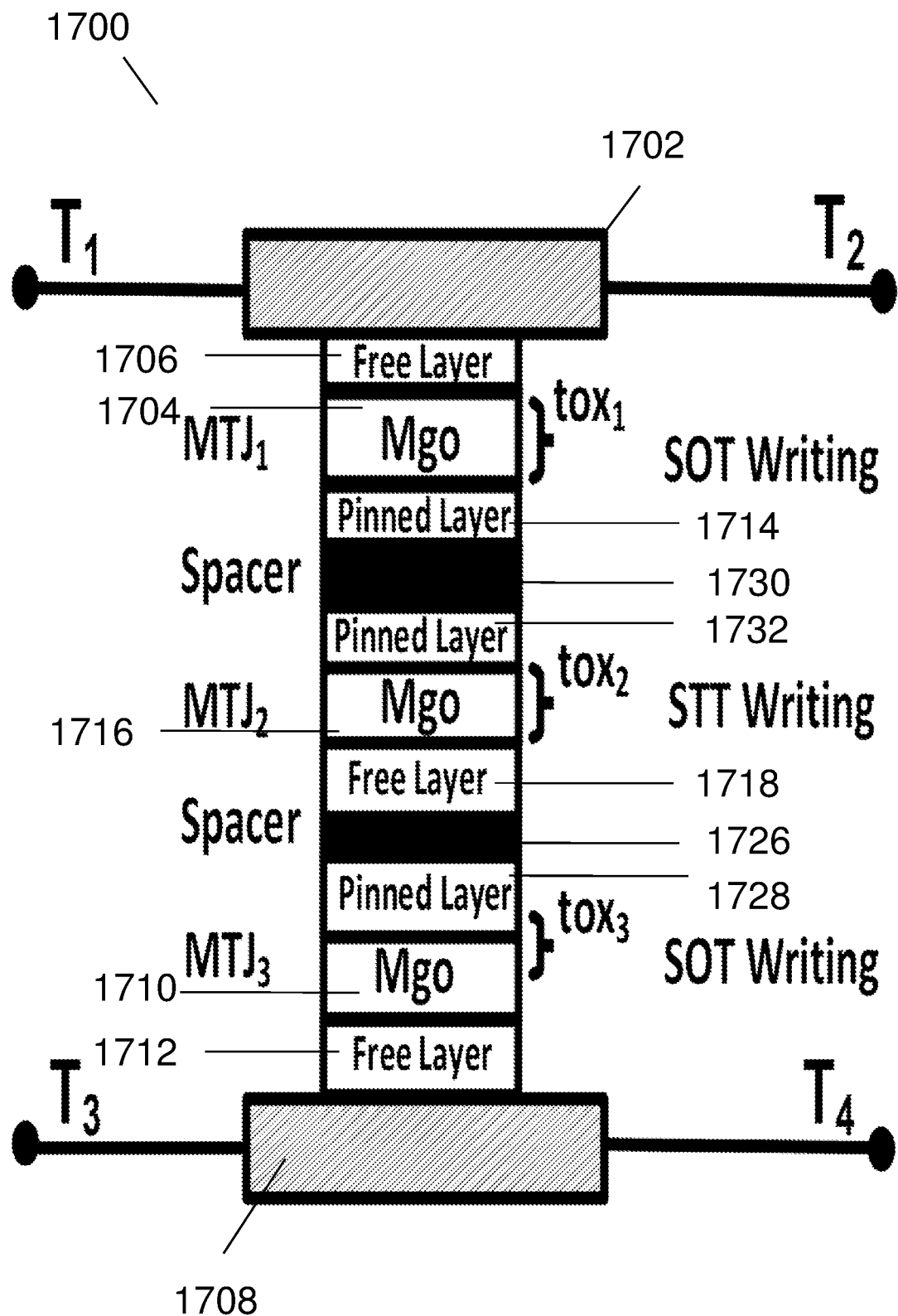
FIG. 17 shows a schematic of a memory cell according to various embodiments.

FIG. 17 shows a schematic of a memory cell 1700 according to various embodiments. The memory cell 1700 may include a first cell electrode 1702. The memory cell 1700 may also include a first insulator layer 1704. The memory cell 1700 may further include a first magnetic free layer 1706 between the first cell electrode 1702 and the first insulator layer 1704. The memory cell 1700 may also include a second cell electrode 1708. The memory cell 1700 may further include a second insulator layer 1710. The memory cell 1700 may additionally include a second magnetic free layer 1712 between the second cell electrode 1708 and the second insulator layer 1710. The memory cell 1700 may also include a magnetic pinned layer 1714 between the first insulator layer 1704 and the second insulator layer 1710.

The memory cell 1700 may also include a third insulator layer 1716, a third magnetic free layer 1718, a spacer layer 1726, and a further magnetic pinned layer 1728 between the magnetic pinned layer 1714 and the second insulator layer 1710.

The third insulator layer 1716 may be between the magnetic pinned layer 1714 and the third magnetic free layer 1718. The further magnetic pinned layer 1728 may be between the spacer layer 1726 and the second insulator layer 1710. The spacer layer 1726 may be between the third magnetic free layer 1718 and the further magnetic pinned layer 1728. The third magnetic free layer 1718 may be between the spacer layer 1726 and the third insulator layer 1716.

The memory cell 1700 may further include a further spacer layer 1730 and another pinned layer 1732 between the magnetic pinned layer 1714 and the third insulator layer 1716.

The further spacer layer 1730 may be between the magnetic pinned layer 1714 and the other magnetic pinned layer 1732. The other magnetic pinned layer 1732 may be between the further spacer layer 1730 and the third insulator layer 1716.

A direction of magnetization of the first magnetic free layer 1706 may be changeable in response to a current flowing between a first end and a second end of the first cell electrode 1702. A direction of magnetization of the second magnetic free layer 1712 may be changeable in response to a current flowing between a first end and a second end of the second cell electrode 1708. The magnetic pinned layer 1714 may have a fixed direction of magnetization.

A direction of magnetization of the third magnetic free layer 1718 may be changeable in response to a current flowing through the third magnetic free layer 1718. The further magnetic pinned layer 1728 may have a fixed direction of magnetization. The other magnetic pinned layer 1732 may have a fixed direction of magnetization.

The direction of magnetization of the first magnetic free layer 1706 may be changeable in response to the current flowing between the first end and the second end of the first cell electrode 1702 due to spin-orbit torque (SOT) effect. The direction of magnetization of the second magnetic free layer 1712 may be changeable in response to the current flowing between the first end and the second end of the second cell electrode 1708 due to spin-orbit torque (SOT) effect.

The direction of magnetization of the third magnetic free layer 1718 may be changeable in response to the current flowing through the third magnetic free layer 1718 due to spin-transfer torque (STT) effect.

The second magnetic free layer 1712 may be on the second cell electrode 1708, the second insulator layer 1710 may be on the second magnetic free layer 1712, the further magnetic pinned layer 1728 may be on the second insulator layer 1710, the spacer layer 1726 may be on the further magnetic pinned layer 1728, the third magnetic free layer 1718 may be on the spacer layer 1726, the third insulator layer 1716 may be on the third magnetic free layer 1718, the other magnetic pinned layer 1732 may be on the third insulator layer 1716, the further spacer layer 1730 may be on the other magnetic pinned layer 1732, the magnetic pinned layer 1714 may be on the further spacer layer 1730, the first insulator layer 1704 may be on the magnetic pinned layer 1714, the first magnetic free layer 1706 may be on the first insulator layer 1704, and the first cell electrode 1702 may be on the first magnetic free layer 1706.

The first magnetic free layer 1706, the first insulator layer 1704, and the magnetic pinned layer 1714 may form the first MTJ (MTJ$_1$), which may be referred to as a first SOT-MTJ. The other magnetic pinned layer 1732, the third insulator layer 1716, and the third magnetic free layer 1718 may form the second MTJ (MTJ$_2$), which may also be referred to as a STT MTJ. The further magnetic pinned layer 1728, the second insulating layer 1710, and the second magnetic free layer 1712 may form the third MTJ (MTJ$_3$), which may be referred to as a second SOT-MTJ.

The memory cell 1700 may have three magnetic pinned layers 1714, 1728, 1732, with a spacer layer 1726 between MTJ$_2$ and MTJ$_3$, and a further spacer layer 1730 between MTJ$_1$ and MTJ$_2$. The memory cell 1700 may also be programmed using either single port or dual port schemes.

In the single port architecture (i.e. single port TLC-SOT MRAM), the data may be programmed to each of the three MTJs at different time spans. On the other hand, in the dual port scheme (i.e. dual port TLC-SOT MRAM), the data may be programmed to the two SOT-MTJs within the same time span, while the STT-MTJ may be programmed at a time span different from the time span in which the two SOT-MTJs are programmed.

Figure 18A:
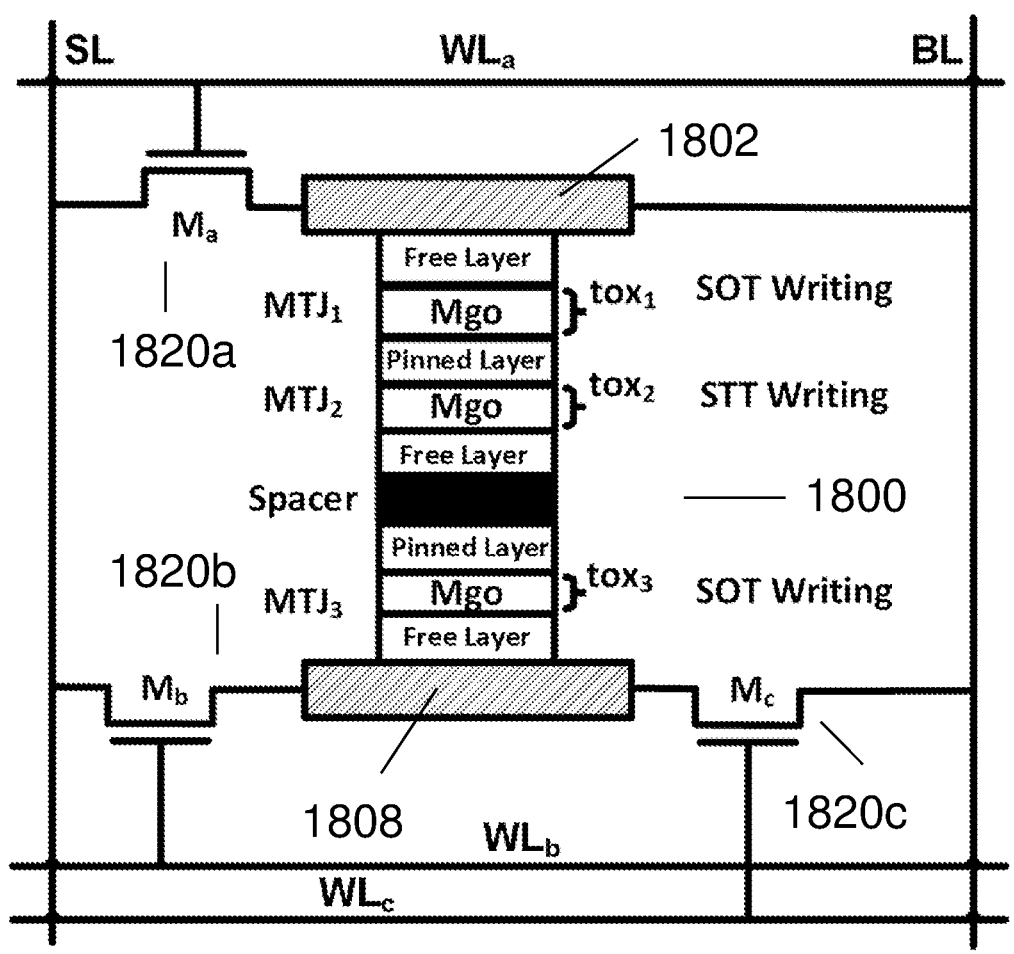
FIG. 18A shows a memory cell configured for single port programming or writing according to various embodiments.

FIG. 18A shows a memory cell 1800 configured for serial programming or writing according to various embodiments. In various embodiments, the memory cell 1800 have a similar structure as the memory cell 1600 (as shown in FIG. 18A), while in various other embodiments, the memory cell 1800 may have a similar structure as the memory cell 1700. The memory cell 1800 may be referred to as a single port TLC-SOT MRAM unit cell or a single port SOT-TLC.

The layers forming a stack between cell electrodes 1802, 1808 are not labelled in FIG. 6A to reduce clutter and improve clarity. The TLC cell 1800 may include three MTJs stacked in-series in-between two heavy metal (HM) electrodes 1802, 1808. The top two MTJs (MTJ$_1$ and MTJ$_2$) may share a common pinned layer. A spacer layer may be placed between the middle MTJ$_2$ and bottom MTJ$_3$ to separate MTJ$_2$ free layer from MTJ$_3$ pinned layer.

The two electrodes 1802, 1808 may permit programming the top and bottom MTJs using the energy efficient SOT effect with low write error rate, as each electrode 1802, 1808 may be responsible for programming only one MTJ.

The middle MTJ$_2$ may be programmed independently by STT programming. MTJ$_2$ may have a significantly larger STT coefficient compared to the two other SOT-MTJs (MTJ$_1$ and MTJ$_3$), which may allow the charge current flowing through the memory stack to only affect the state of MTJ$_2$ without affecting the states of MTJ$_1$ and MTJ$_3$ within the STT write pulse duration. The larger STT coefficient of MTJ$_2$ may be due to the significantly smaller damping coefficient ($\alpha$) of the STT-MTJ$_2$ (e.g. 0.005) compared to that of the SOT-MTJs, i.e. MTJ$_1$, MTJ$_3$ (e.g. 0.012). In various embodiments, the second MTJ may be configured to be programmed by spin-transfer torque (STT) effect. In various embodiments, the second MTJ may have a smaller damping coefficient ($\alpha$) compared to a damping coefficient of the first MTJ or the third MTJ.

The MTJ switching current due to STT effect may be directly proportional to $\alpha$, whereas the switching current due to SOT effect may be independent of $\alpha$.

The MTJ switching current due to STT, $J_{c,STT}$, may be provided by:

$$J_{c,STT} = \frac{2e\alpha M_s t_{FL}}{\hbar P}(H_k + 2\pi M_s) \quad (4)$$

wherein $\alpha$ is the damping coefficient, $M_s$ is the saturation magnetization, $H_k$ is the anisotropy field, e is the electronic charge, $t_{FL}$ is the thickness of the magnetic free layer, $\hbar$ is the reduced Planck's constant, and P is the STT-MTJ spin polarization.

The MTJ switching current due to SOT, $J_{c,SOT}$, may be provided by:

$$J_{c,SOT} = \frac{2eM_s t_{FL}}{\hbar \theta_{SHE}}\left(\frac{H_{k,eff}}{2} - \frac{H_x}{\sqrt{2}}\right) \quad (5)$$

wherein $M_s$ is the saturation magnetization, $H_{k,eff}$ is the effective anisotropy field, e is the electronic charge, $t_{FL}$ is the thickness of the magnetic free layer, $\hbar$ is the reduced Planck's constant, $H_x$ is the external applied field, and $\theta_{SHE}$ is the spin hall angle.

Thus, the STT switching current requirement of SOT-MTJs (MTJ$_1$ and MTJ$_3$) having large $\alpha$ may be significantly higher than the needed STT switching current for the STT-MTJ$_2$. Accordingly, MTJ$_2$ may be written using a switching current without affecting the SOT-MTJs, i.e. MTJ$_1$, MTJ$_3$. The high speed low SOT switching current requirement of the SOT-MTJs may not be affected.

The three MTJs may have the same or symmetrical cross-sectional dimensions (i.e. width and length) to simplify the manufacturing, while distinct resistances for MTJ$_1$, MTJ$_2$ and MTJ$_3$ may be obtained by varying corresponding MTJ tunnel oxide thicknesses ($t_{ox}$). Distinct parallel and antiparallel resistance levels for the three MTJs may be required to obtain eight different resistance states (i.e. $R_{111}$, $R_{110}$, $R_{101}$, $R_{100}$, $R_{011}$, $R_{010}$, $R_{001}$, $R_{000}$). In addition, the cell 1800 may require only three transistors 1820a, 1820b, 1820c to access the three bits while avoiding unintentional reading or writing for non-selected cells.

The memory cell 1800 may include a first transistor 1820a in electrical connection with an end portion of the first cell electrode 1802. The memory cell 1800 may also include a second transistor 1820b in electrical connection with an end portion of the second cell electrode 1808. The memory cell 1800 may further include a third transistor 1820c in electrical connection with a further end portion of the second cell electrode 1808.

The first transistor 1820a may include a control electrode, a first controlled electrode, and a second controlled electrode. The second transistor 1820b may include a control electrode, a first controlled electrode, and a second controlled electrode. The third transistor 1820c may include a control electrode, a first controlled electrode, and a second controlled electrode.

The first controlled electrode of the first transistor 1820a may be in electrical connection with an end portion of the first cell electrode 1802. The first controlled electrode of the second transistor 1820b may be in electrical connection with an end portion of the second cell electrode 1808. The first controlled electrode of the third transistor 1820c may be in electrical connection with a further end portion of the second cell electrode 1808.

The second controlled electrode of the first transistor 1820a and the second controlled electrode of the second transistor 1820b may be in electrical connection with a source line (SL). The second controlled electrode of the third transistor 1820c may be in electrical connection with a bit line (BL). A further end portion of the first cell electrode may be in electrical connection with the bit line (BL). The control electrode of the first transistor 1820a may be in electrical connection with a first word line (WL$_a$). The control electrode of the second transistor 1820b may be in electrical connection with a second word line (WL$_b$). The control electrode of the third transistor 1820c may be in electrical connection with a third word line (WL$_c$).

Figure 18B:
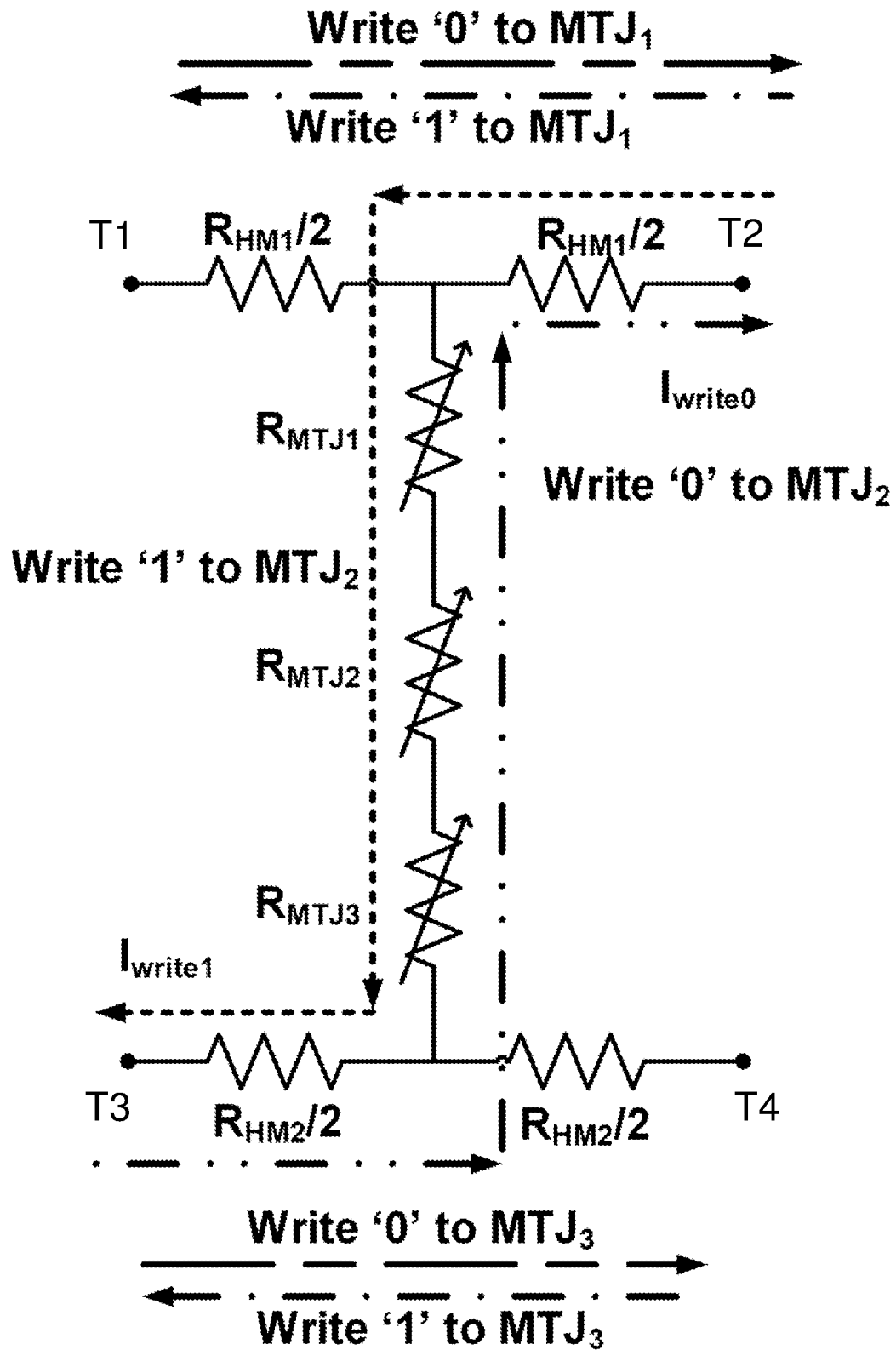
FIG. 18B shows the resistive model of the single port spin-orbit torque triple-level cell (SOT-TLC) in the writing mode according to various embodiments.

FIG. 18B shows the resistive model of the single port spin-orbit torque triple-level cell (SOT-TLC) in the writing mode according to various embodiments. A resistive T-Model may be used to represent an SOT-MTJ and a variable resistance may be used to represent the STT-MTJ. The memory cell may have a separate write path for each MTJ. The current paths for writing the three MTJs are shown in FIG. 18B. The current may flow through HM$_1$ to program MTJ$_1$ via SOT, and the current may flow through HM$_2$ to program MTJ$_3$ via SOT. The current may flow from T1 to T2 in order to write '0' to MTJ$_1$, and the current may flow from T3 to T4 in order to write '0' to MTJ$_2$. On the other hand, the current may flow from T2 to T1 to write '1' to MTJ$_1$, and the current may flow from T4 to T3 in order to write '1' to MTJ$_2$. Thus, to write '0', SL may be raised high and BL may be pulled low. On the other hand, in order to write '1', SL may be pulled low and BL may be raised high. For the STT-MTJ$_2$, the current flows through the memory or MTJ stack from HM$_2$ to HM$_1$ to write '0' and from HM$_1$ to HM$_2$ to write '1'. Hence, writing a '0' to MTJ$_2$ may require asserting the SL to high and the BL to low, whereas writing a '1' may require raising the BL to high and pulling SL to low. A writing current of 40 µA may be used for both SOT and STT effects occurrence.

In order to write MTJ$_2$, both transistor 1820a M$_a$ and transistor 1820c M$_c$ may be deactivated (i.e. WL$_a$=WL$_c$='0'), while 1820b M$_b$ may be tuned on (i.e. WL$_b$=V$_{DD}$), permitting the write current to flow completely through the MTJ stack with no leakage in order to program the state of MTJ$_2$ only without affecting the states of MTJ$_1$ and MTJ$_3$. This is due to the significantly large STT critical current (I$_{C,STT}$) required for writing SOT-MTJ$_1$ and SOT-MTJ$_3$. This large I$_{C,STT}$ required for MTJ$_1$ and MTJ$_3$ may permit the charge write current flowing through the MTJ stack to only write to MTJ$_2$ (with small I$_{C,STT}$ required) without disturbing or affecting the state of MTJ$_1$ and the state of MTJ$_3$. The supplied current to program MTJ$_2$ may be larger than the I$_{C,STT}$ required for MTJ$_2$. and may be smaller than the I$_{C,STT}$ required for MTJ$_1$ or the I$_{C,STT}$ required for MTJ$_3$.

Writing MTJ$_1$ requires turning M$_a$ on (i.e. WL$_a$=V$_{DD}$) while turning M$_b$ and M$_c$ off (i.e. WL$_b$=WL$_c$='0'). As such, the current may flows through HM$_1$ with no leakage through the MTJ stack, resulting in SOT switching of MTJ$_1$. Writing MTJ$_3$ may require activating both M$_b$ and M$_c$ (i.e. WL$_b$=WL$_c$=V$_{DD}$) while deactivating M$_a$ (i.e. WL$_a$='0') such that the write current mainly flows through HM$_2$ with a small leakage current passing through the MTJ or memory stack. The leakage current that flows through the MTJ stack while programming MTJ$_3$ may be insignificant as the writing current prefers to flow through the low resistance electrode (HM$_2$) compared to the high resistance MTJ stack. The resistance value of HM electrode may be in the range of hundreds of ohms and the resistance value of the MTJ stack may be in the range of at least tens of kilo-ohms. The leakage current may be in the range of a few μA (any value from 1 μA to 3 μA, depending on the ratio between the values of HM electrode resistance and the MTJ stack resistance) for a writing current of 40 μA.

A writing current of 3 μA may be much smaller than the critical current of STT switching of any of the MTJs, including MTJ$_2$. Therefore, this leakage current may not even cause any write-disturb failure via STT-switching, and the impact of the leakage current may be insignificant. It is important to emphasize that the order in writing any of the three MTJs may not be important as the three MTJs may be written independently. This is due to the availability of the separate HM electrodes for programming MTJ$_1$ and MTJ$_3$, in addition to the ability to program MTJ$_2$ by STT writing without affecting the states of MTJ$_1$ and MTJ$_3$ as aforementioned.

Figure 18C:
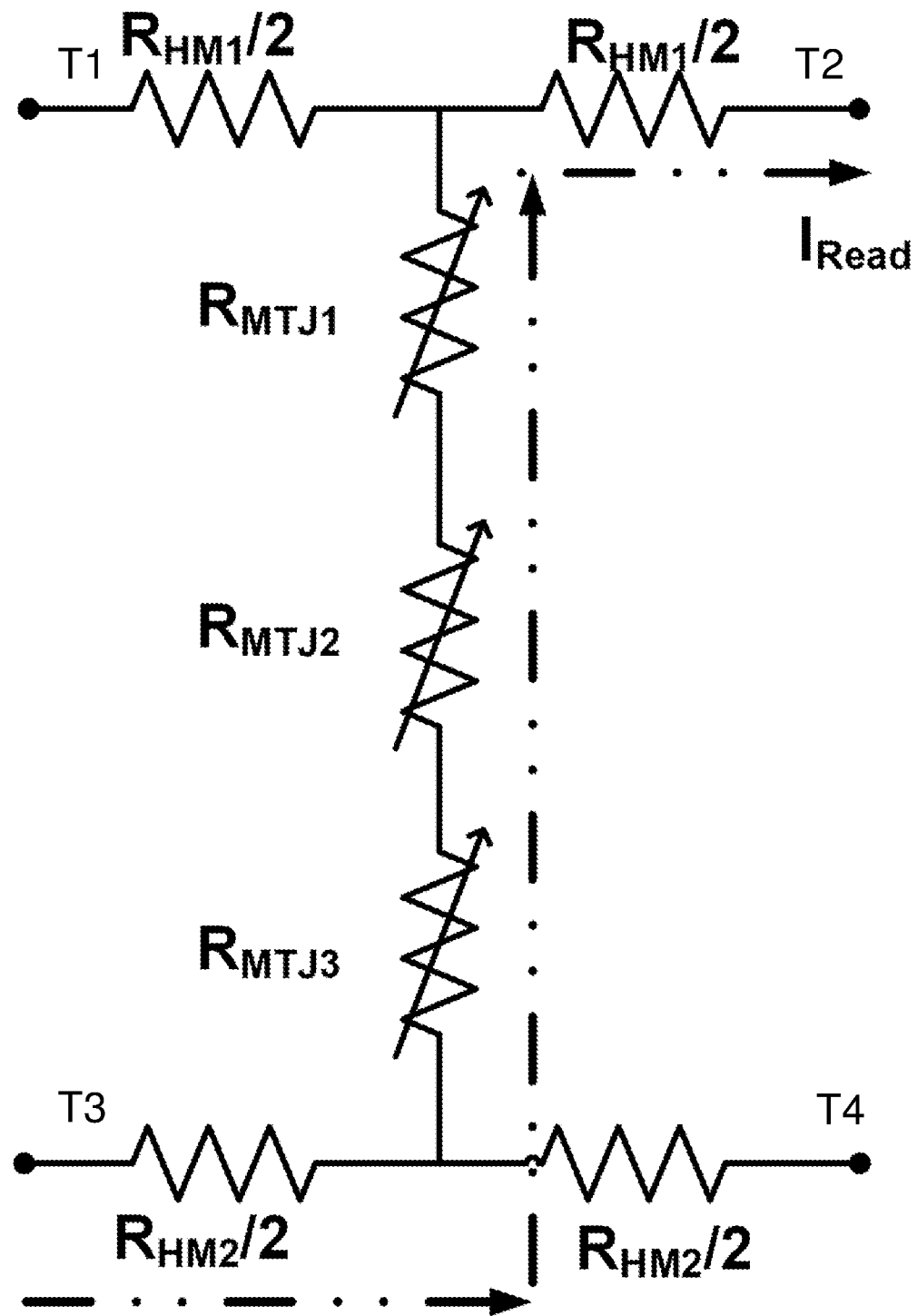
FIG. 18C shows the resistive model of the single port spin-orbit torque triple-level cell (SOT-TLC) in the reading mode according to various embodiments.

FIG. 18C shows the resistive model of the single port spin-orbit torque triple-level cell (SOT-TLC) in the reading mode according to various embodiments. The current path for reading the resistance state of the memory stack is shown in FIG. 18C. The read current may have to pass through the entire memory or MTJ stack to be able to sense the existing resistance state of the memory cell. In order to read the selected memory cell only, both M$_a$ and M$_c$ may be deactivated for all cells (i.e. WL$_a$=WL$_c$='0'), while M$_b$ may be activated (i.e. WL$_b$=V$_{DD}$) for the selected cell only. There is no access transistor that can control BL from HM$_1$ side. As such, BL may be pulled down to '0' during the reading. The read current (I$_{read}$) may be supplied from the SL, which may be controlled by M$_b$. Deactivating M$_b$ for the non-selected cells may allow the read current to only flow in the selected cell (i.e. cell with activated M$_b$) and successfully reading the resistance state of the memory state of the selected memory cell.

FIG. 18D is a table summarizing the bias conditions for the three different word lines (WL$_a$, WL$_b$, WL$_c$), the source line (SL) and the bit line (BL) in order to read and write the memory cell 1800 according to various embodiments.

Figure 19A:
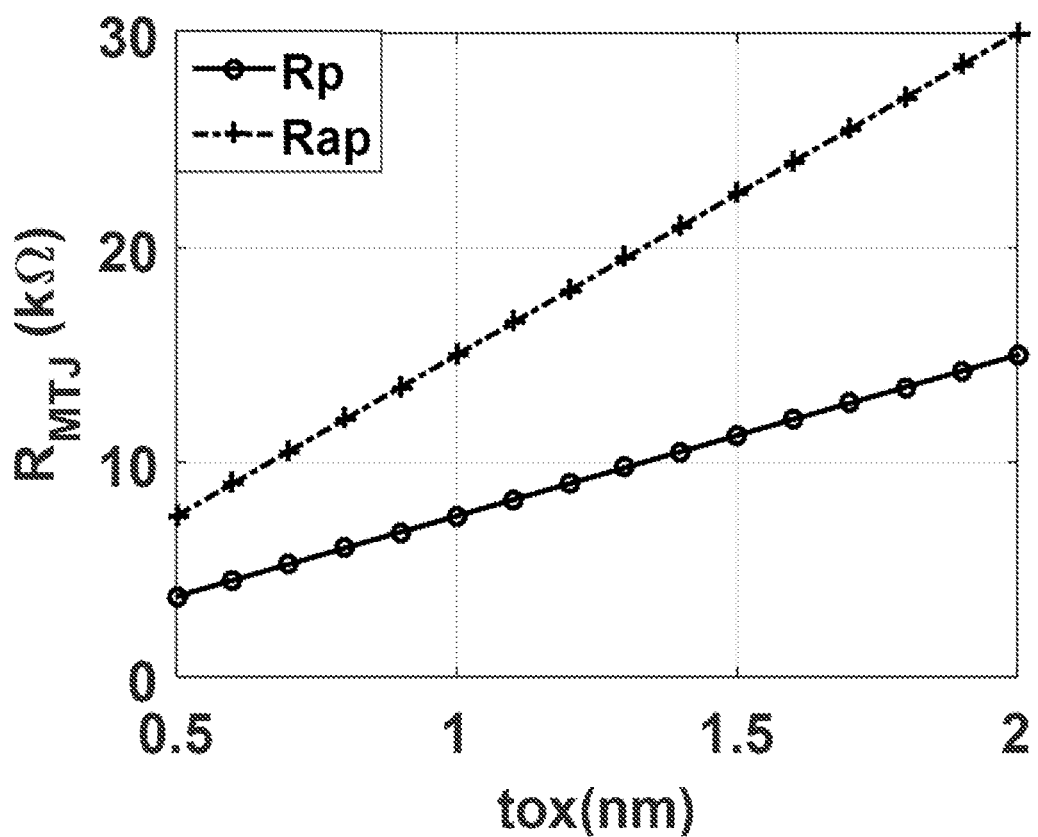
FIG. 19A shows a plot of resistance $R_{MTJ}$ (in kilo-ohms or kΩ) as a function of oxide thickness $t_{ox}$ (in nanometers or nm) illustrating the effect of the tunnel barrier thickness on the resistance of a magnetic tunnel junction for the parallel (Rp) configuration and anti-parallel configuration (Rap) according to various embodiments.
Figure 19B:
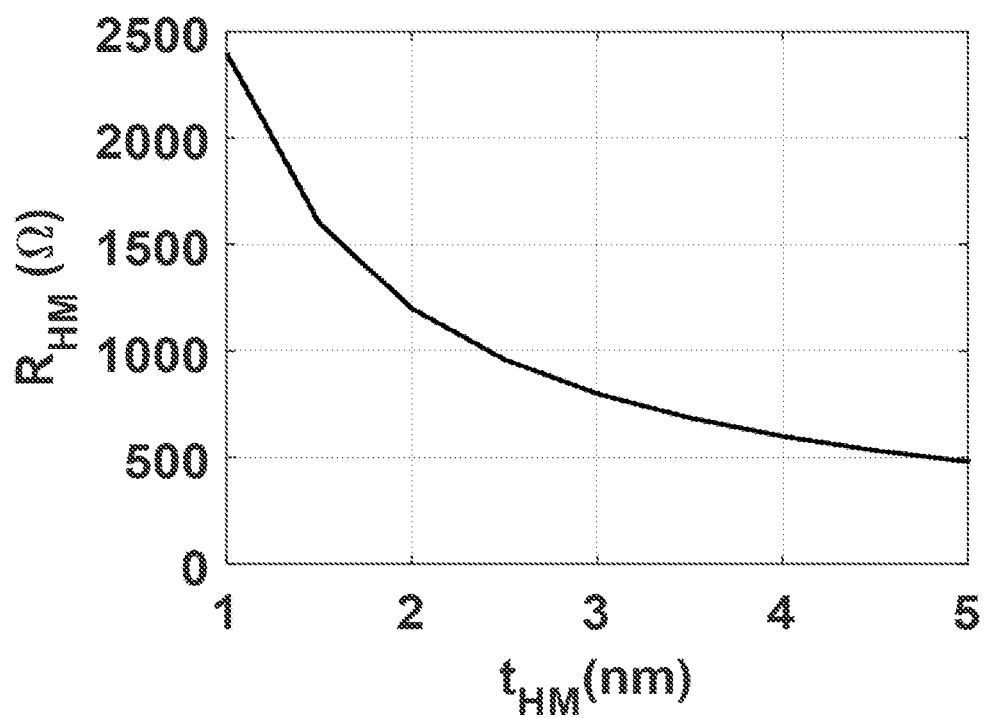
FIG. 19B shows a plot of resistance $R_{HM}$ (in ohms or Ω) as a function of cell electrode thickness $t_{HM}$ (in nanometers or nm) illustrating the effect of the cell electrode thickness on the electrode resistance according to various embodiments.

FIG. 19A shows a plot of resistance R$_{MTJ}$ (in kilo-ohms or kΩ) as a function of oxide thickness t$_{ox}$ (in nanometers or nm) illustrating the effect of the tunnel barrier thickness on the resistance of a magnetic tunnel junction for the parallel (Rp) configuration and anti-parallel configuration (Rap) according to various embodiments. FIG. 19B shows a plot of resistance R$_{HM}$ (in ohms or Ω) as a function of cell electrode thickness t$_{HM}$ (in nanometers or nm) illustrating the effect of the cell electrode thickness on the electrode resistance according to various embodiments. FIGS. 19A-B demonstrate that the MTJ resistance (R$_{MTJ}$ is in the range of tens of kilo-ohms) may be about two orders higher than the electrode resistance (R$_{HM}$ is in the range of hundreds of ohms).

Figure 20:
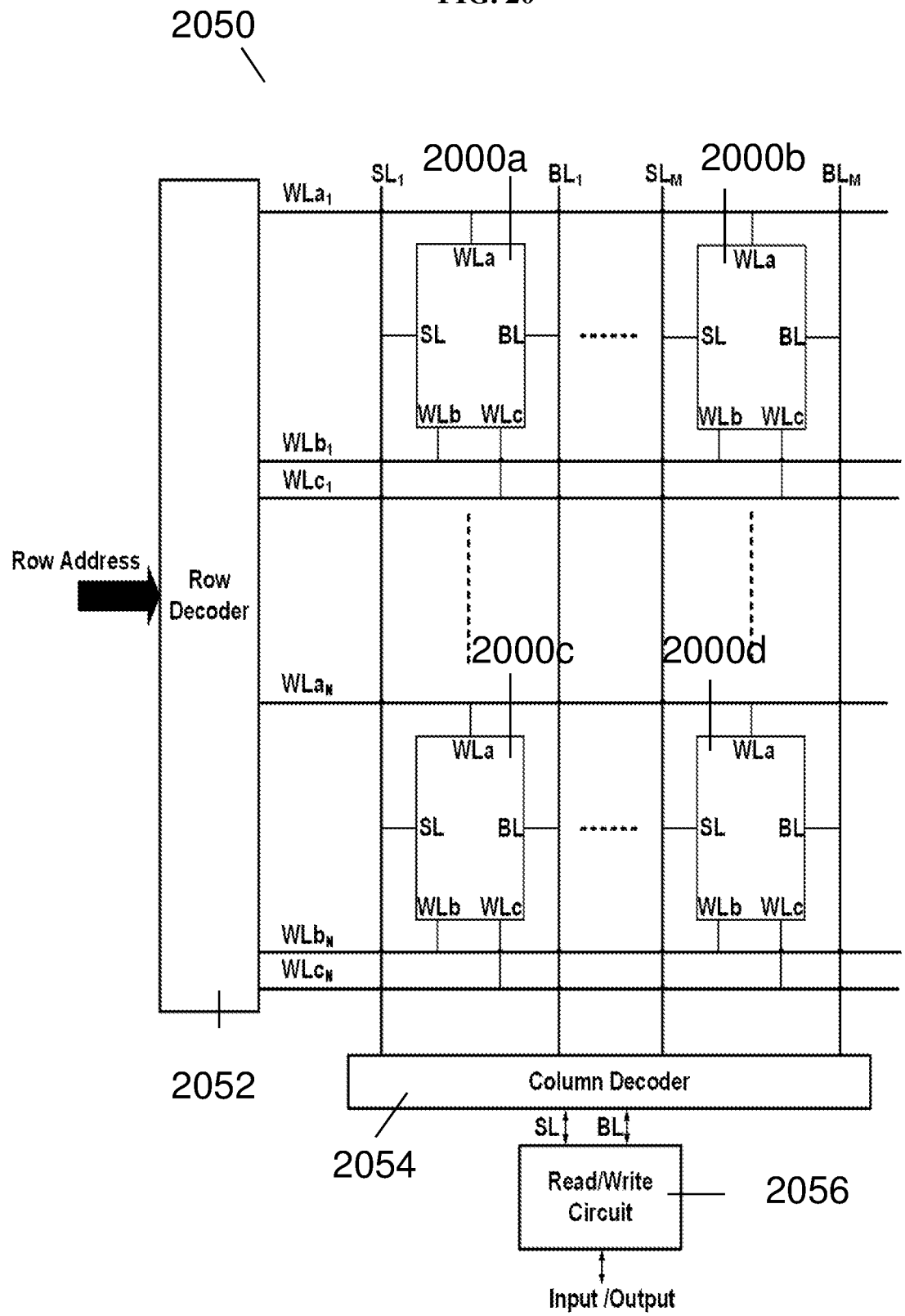
FIG. 20 shows a memory array including a plurality of memory cells according to various embodiments.

FIG. 20 shows a memory array 2050 including a plurality of memory cells 2000a-d according to various embodiments. The memory array 2050 may also include a row decoder 2052. The memory array 2050 may further include a column decoder 2054. The plurality of memory cells 2000a-d may be arranged in N rows and M columns (N×M array). The column decoder 2054 and the row decoder 2052 may be configured to select one memory cell out of the plurality of memory cells 2000a-d for reading and/or writing. The row decoder 2052 may select the row that includes the desired memory cell, while the column decoder 2054 may select the desired cell from the row selected by the row decoder 2052 to either write or read the data.

The memory array 2050 may further include a read/write circuit 2056 for reading and/or writing to the selected memory cell. The memory array 2050 or read/write circuit 2056 may include a write circuit configured to write to the selected memory cell, and a read circuit configured to read from the selected memory cell. For a single port TLC SOT MRAM, only one write driver per data channel and one column decoder may be enough to write each bit (within the cell) in different time spans.

Figure 21A:
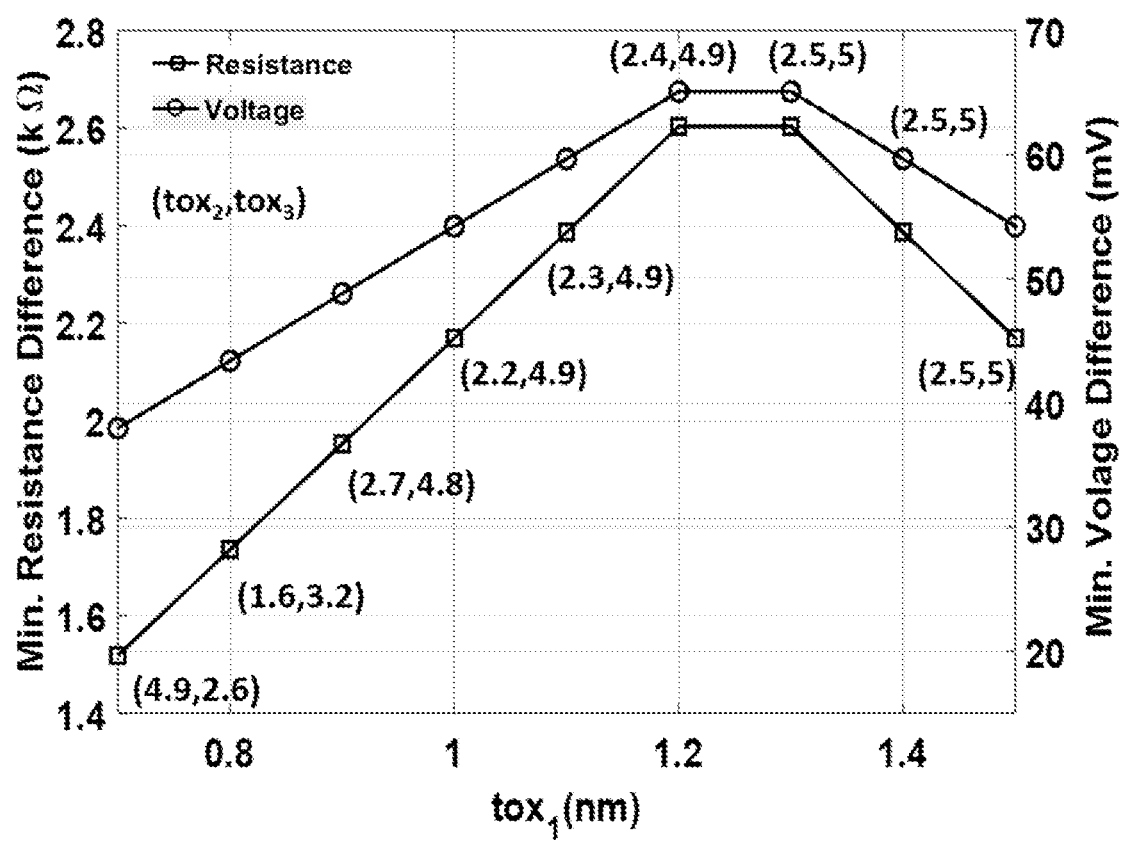
FIG. 21A is a plot of minimum resistance difference $\Delta R_{min}$ (in kilo-ohms or kΩ)/minimum voltage difference (in milli-volts or mV) as a function of oxide thickness $tox_1$ (in nanometers or nm) illustrating the minimum difference in resistance between the eight states of the triple-level spin-orbit torque (TLC SOT) memory cell according to various embodiments based on the respective oxide thickness $tox_1$ as well as oxide thicknesses $tox_2$ and $tox_3$ (in brackets), as well as the corresponding minimum voltage difference $\Delta V_{min}$ for a read current of 25 µA.

FIG. 21A is a plot of minimum resistance difference ΔR$_{min}$ (in kilo-ohms or kΩ)/minimum voltage difference (in milli-volts or mV) as a function of oxide thickness tox$_1$ (in nanometers or nm) illustrating the minimum difference in resistance between the eight states of the triple-level spin-orbit torque (TLC SOT) memory cell according to various embodiments based on the respective oxide thickness tox$_1$ as well as oxide thicknesses tox$_2$ and tox$_3$ (in brackets), as well as the corresponding minimum voltage difference ΔV$_{min}$ for a read current of 25 μA.

The relation between ΔR$_{min}$ and ΔV$_{min}$ may be provided by Equation (1). ΔR$_{min}$ may be proportional to the read margin (RM), as ΔR$_{min}$ may correspond to the worst-case difference between the resistance states. Hence, the larger the ΔR$_{min}$, the broader the worst-case difference between the stack resistance and the used reference resistance, and that may consequently lead to a larger RM. The graph in FIG. 21A is based on the modelling equation for the resistance value of the MTJ for both parallel and anti-parallel configurations. The optimization algorithm used in generating the graph may consider maintaining an overall acceptable largest equivalent series resistance for the three MTJs (<45 kΩ).

The graph may help in selecting the appropriate tunnel barrier thickness of the three MTJs to achieve desired read margin. From the graph, the largest read margin may be when tox$_1$=1.3 nm, tox$_2$=2.5 nm and tox$_3$=5 nm, based on W$_{MTJ}$=70 nm and L$_{MTJ}$=120 nm, which would result in approximately ΔR$_{min}$=2.5 kΩ. tox$_1$ is the thickness of the insulator layer of MTJ$_1$, tox$_2$ is the thickness of the insulator layer of MTJ$_2$, tox$_3$ is the thickness of the insulator layer of MTJ$_3$, W$_{MTJ}$ is the width of the memory stack, and L$_{MTJ}$ is the length of the memory stack.

Figure 21B:
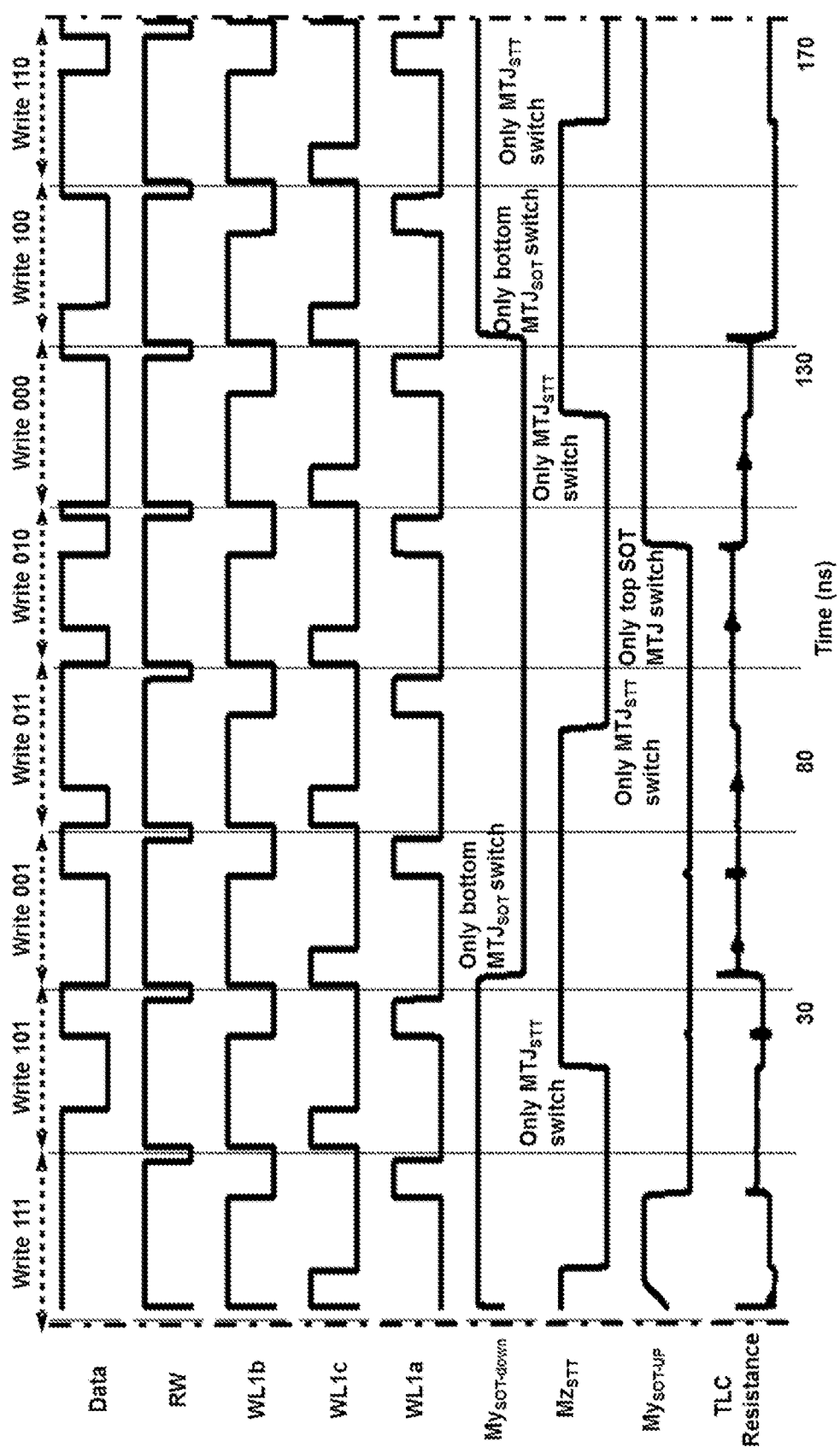
FIG. 21B shows a plot of various voltage signals and resistance as a function of time (in nanoseconds or ns) showing the programming of the three magnetic tunnel junctions of a memory cell in the array shown in FIG. 21 according to various embodiments.

FIG. 21B shows a plot of various voltage signals and resistance as a function of time (in nanoseconds or ns) showing the programming the three magnetic tunnel junctions of a memory cell of the array 2000 shown in FIG. 20 according to various embodiments. The memory cell may be selected by activating the corresponding column select (CS) line. FIG. 21B shows that only one of the three input bits is changed in each writing cycle, which may result in changing the state of only one of the three MTJs in the single port memory array. In this case, the least significant bit (LSB), the middle bit, and the most significant bit (MSB) may be controlled by the top SOT-MTJ$_1$, middle STT-MTJ$_2$ and bottom SOT-MTJ$_3$ respectively. The LSB may be denoted by My$_{SOT-UP}$, the middle bit may be denoted by Mz$_{STT}$, and the MSB may be denoted by My$_{SOT-down}$.

The change of one of these three bits may result in changing the state of the corresponding MTJ to either parallel (P) or anti-parallel (AP) states based on the input data. While programming one of the three MTJs, the state of the other two MTJs may not be affected, which indicates independent writing for each MTJ. The graph also validates that the resistance may change from one state to another in a controlled manner regardless the previous state of the MTJ stack.

The parameters used in the modelling of the memory array may be similar to those shown in FIG. 10C. The current density-switching time characteristics may be similar to that shown in FIG. 10D.

Figure 22A:
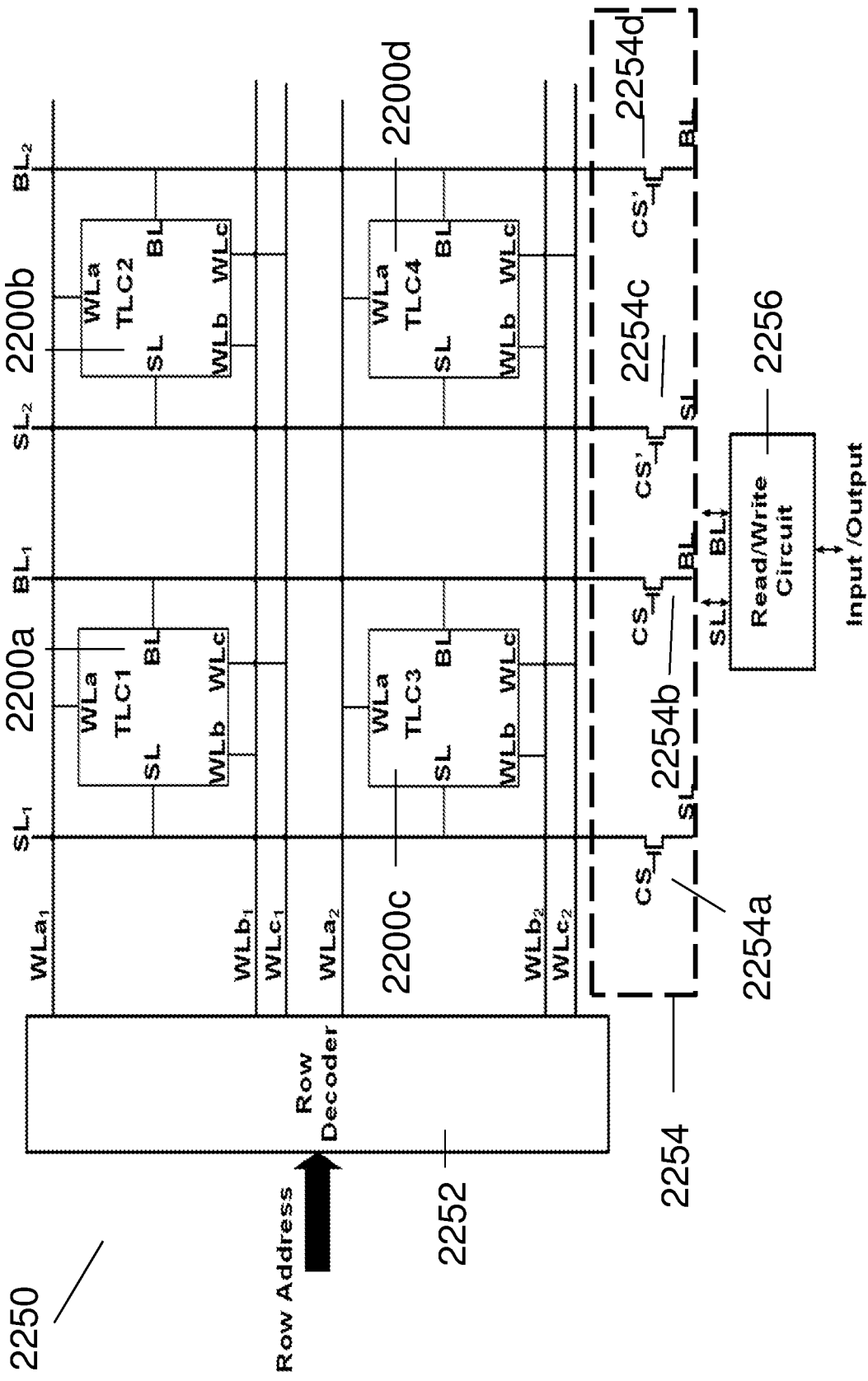
FIG. 22A shows a 2×2 single port spin-orbit torque triple-level cell (SOT-TLC) memory array for validation according to various embodiments.

FIG. 22A shows a 2×2 single port spin-orbit torque triple-level cell (SOT-TLC) memory array 2250 for validation according to various embodiments. The array 2250 may include memory cells 2200*a-d*. The array 2250 may also include a 1-bit row decoder 2252 and a 1-bit column decoder 2254 including column selector transistors 2254*a-d*. The 1-bit row decoder 2252 may be used to select one of two rows, and the 1-bit column decoder may be used to select one of two columns. The array 2250 may additionally include a read/write circuit 2256, which may include a write driver and read circuitry. Only one write driver may be required as the data is programmed serially.

Figure 22B:
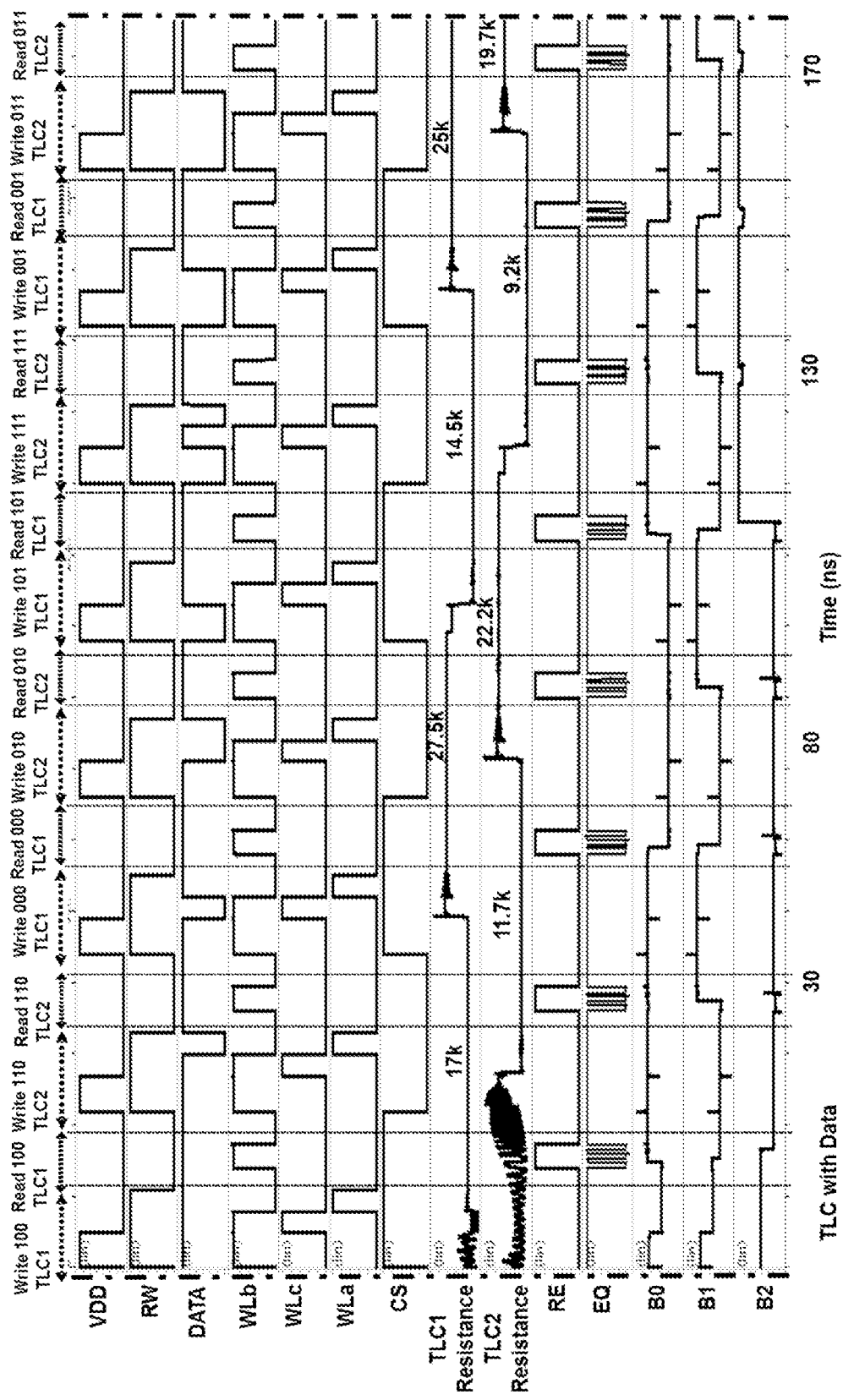
FIG. 22B shows a plot of resistance and various voltage signals as a function of time (in nanoseconds or ns) showing the validation of the programming or reading of the memory array shown in FIG. 22A.

FIG. 22B shows a plot of resistance and various voltage signals as a function of time (in nanoseconds or ns) showing the validation of the programming or reading of the memory array 2250 shown in FIG. 22A. The cells TLC$_1$ and TLC$_2$ may be used to perform the program/read operations. As such, only Row 1 may be activated for read/program operations. The read/program operation for TLC$_1$ may occur when the column selector signal (CS)='1', while the read/program operation for TLC$_2$ may occur when CS='0'. The data may be serially programmed. Hence, MTJ1, MTJ2 and MTJ3 writing may occur at different time spans.

FIG. 22B shows that TLC$_1$ is firstly selected (i.e. CS='1') for programming "100", which is equivalent to a resistance state of 17 kΩ, when the RW signal is raised high while the word line signals are activated to program each MTJ at different time span. Thereafter, the data stored in TLC$_1$ is sensed sequentially by comparing the currents flowing in TLC$_1$ stack and the appropriate reference MTJ through binary search algorithm during a high RE signal. There may be sufficient equalization duration before identifying each bit. FIG. 22B demonstrates that the three bits are read correctly with B0='1', B1='0' and B2='0'.

TLC$_2$ may then be selected (i.e. CS='0') for programming "110" (i.e. resistance state of 11.7 kΩ), which is followed by reading TLC$_2$ stored data, resulting in having B0 as '1', B1 as '1' and B2 as '0'. Subsequently, TLC$_1$ may be selected to program with "000" (i.e. resistance state of 27.5 kΩ), followed by a read of TLC$_1$ that generates B0 as '0', B1 as '0' and B2 as '0'. Thereafter, TLC$_2$ is selected for programming "010" (i.e. resistance state of 22.2 kΩ), which is followed by reading TLC$_2$ stored data, resulting in having B0 as '0', B1 as '1' and B2 as '0'. Then, TLC$_1$ is selected to program "101" (i.e. resistance state of 14.5 kΩ), followed by a read for TLC$_1$ that generates B0 as '1', B1 as '0' and B2 as '1'. Subsequently, TLC$_2$ is selected for programming "111" (i.e. resistance state of 9.2 kΩ), which is followed by reading TLC$_2$ stored data, resulting in having B0 as '1', B1 as '1' and B2 as '1'. TLC$_1$ is then selected to program with "001" (i.e. resistance state of 25 kΩ), followed by a read of TLC$_1$ that generates B0 as '0', B1 as '0' and B2 as '1'. Finally, TLC$_2$ is selected to program '011' (i.e. resistance state of 19.7 kΩ), followed by a read of TLC$_2$ that generates B0 as '0', B1 as '1' and B2 as '1'. In conclusion, FIG. 22B demonstrates that the data can be programmed to or read from the single port TLC-SOT MRAM.

In the dual port architecture for TLC-SOT MRAM, the two SOT-MTJs may be written simultaneously (within same time span) to increase the writing throughput by 1.5×, while the third STT-MTJ$_2$ may be written in a separate time span.

Figure 23A:
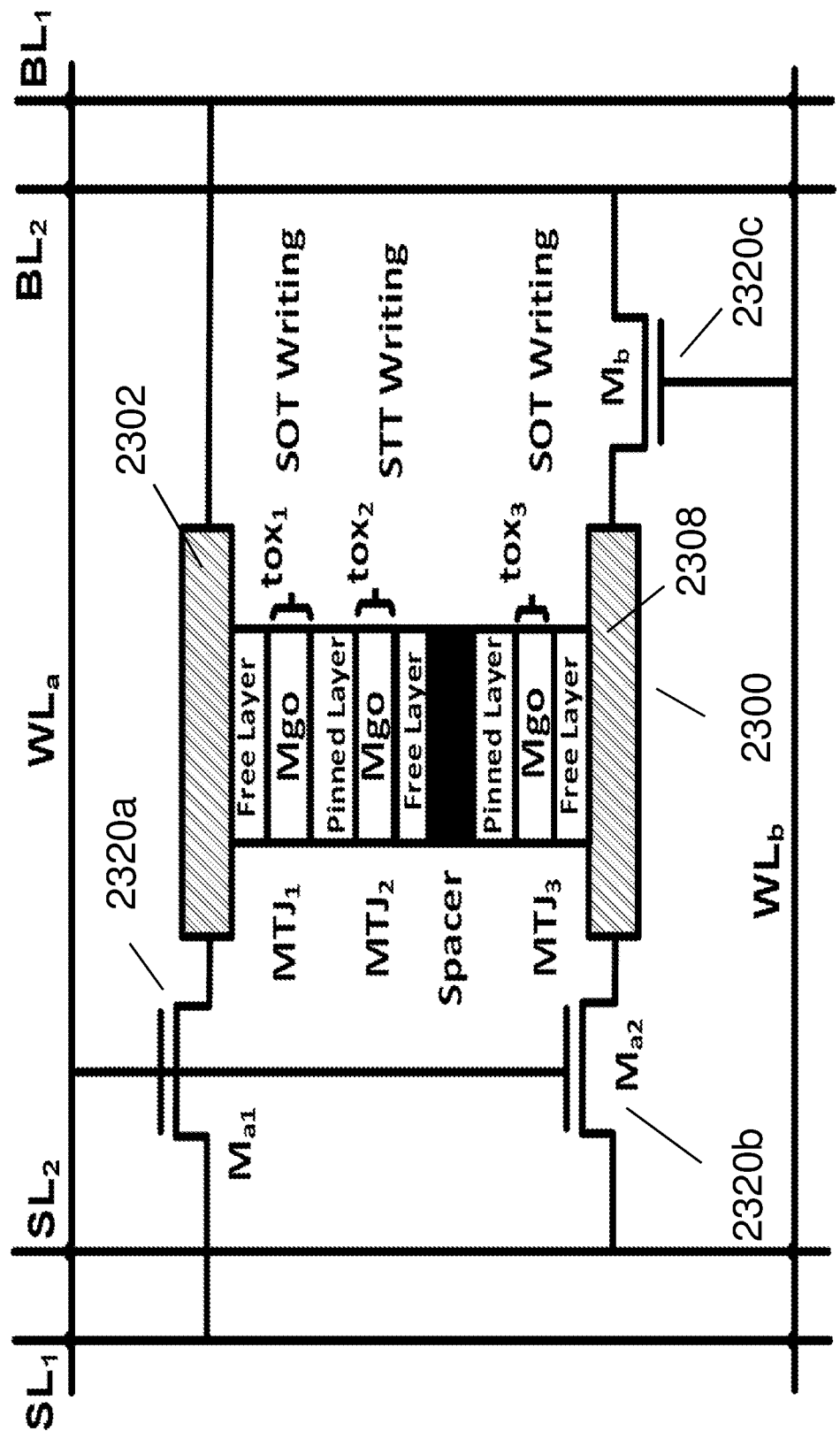
FIG. 23A shows a memory cell configured for dual port programming or writing according to various embodiments.

FIG. 23A shows a memory cell 2300 configured for dual port programming or writing according to various embodiments. In various embodiments, the memory cell 2300 have a similar structure as the memory cell 1600 (as shown in FIG. 23A), while in various other embodiments, the memory cell 2300 may have a similar structure as the memory cell 1700. The memory cell 2300 may be referred to as a dual port TLC-SOT MRAM unit cell or a dual port SOT-TLC. The layers forming a stack between cell electrodes 2302, 2308 are not labelled in FIG. 23A to reduce clutter and improve clarity.

The memory cell 2300 may include three access transistors 2320*a-c*. The memory cell 2300 may include a first transistor 2320*a* in electrical connection with an end portion of the first cell electrode 2302. The memory cell 2300 may also include a second transistor 2320*b* in electrical connection with an end portion of the second cell electrode 2308. The memory cell 2300 may further include a third transistor 2320*c* in electrical connection with a further end portion of the second cell electrode 2308.

The first transistor 2320*a* may include a control electrode, a first controlled electrode, and a second controlled electrode. The second transistor 2320*b* may include a control electrode, a first controlled electrode, and a second controlled electrode. The third transistor 2320*c* may include a control electrode, a first controlled electrode, and a second controlled electrode. The first controlled electrode of the first transistor 2320*a* may be in electrical connection with an end portion of the first cell electrode 2302. The first controlled electrode of the second transistor 2320*b* may be in electrical connection with an end portion of the second cell electrode 2308. The first controlled electrode of the third transistor 2320*c* may be in electrical connection with a further end portion of the second cell electrode 2308.

The second controlled electrode of the first transistor 2320*a* may be in electrical connection with a first source line (SL1). The second controlled electrode of the second transistor 2320*b* may be in electrical connection with a second source line (SL2), the second source line (SL2) different from the first source line (S1).

A further end of the first cell electrode 2302 may be in electrical connection with a first bit line (BL1). The second controlled electrode of the third transistor 2320c may be in electrical connection with a second bit line (BL2), the second bit line different from the first bit line (BL1).

The control electrode of the first transistor 2320a ($M_{a1}$) and the control electrode of the second transistor 2320b ($M_{a2}$) may be in electrical connection with a first word line ($WL_a$). The control electrode of the third transistor 2320c ($M_b$) may be in electrical connection with a second word line ($WL_b$).

The dual port TLC-SOT MRAM unit cell may have two bit lines ($BL_1$, $BL_2$) and two source lines ($SL_1$, $SL_2$) to be able to program $MTJ_3$ via the first cell electrode 2302 and to program $MTJ_3$ via the second cell electrode 2308 in-parallel. The benefit of having two separate HM electrodes 2302, 2308 for the top $MTJ_1$ and bottom $MTJ_3$ may be utilized.

The gates of transistors $M_{a1}$ and $M_{a2}$ may be connected to achieve smaller area, while maintaining the correct functionality. The reason is that $M_{a1}$ and $M_{a2}$ may require the same input signal for both write and read operations.

The middle $MTJ_2$ may be programmed independently in a different time span using STT programming. Thus, the throughput gain from programming two of the three MTJs simultaneously may be about 1.5 times of the single port approach.

Figure 23B:
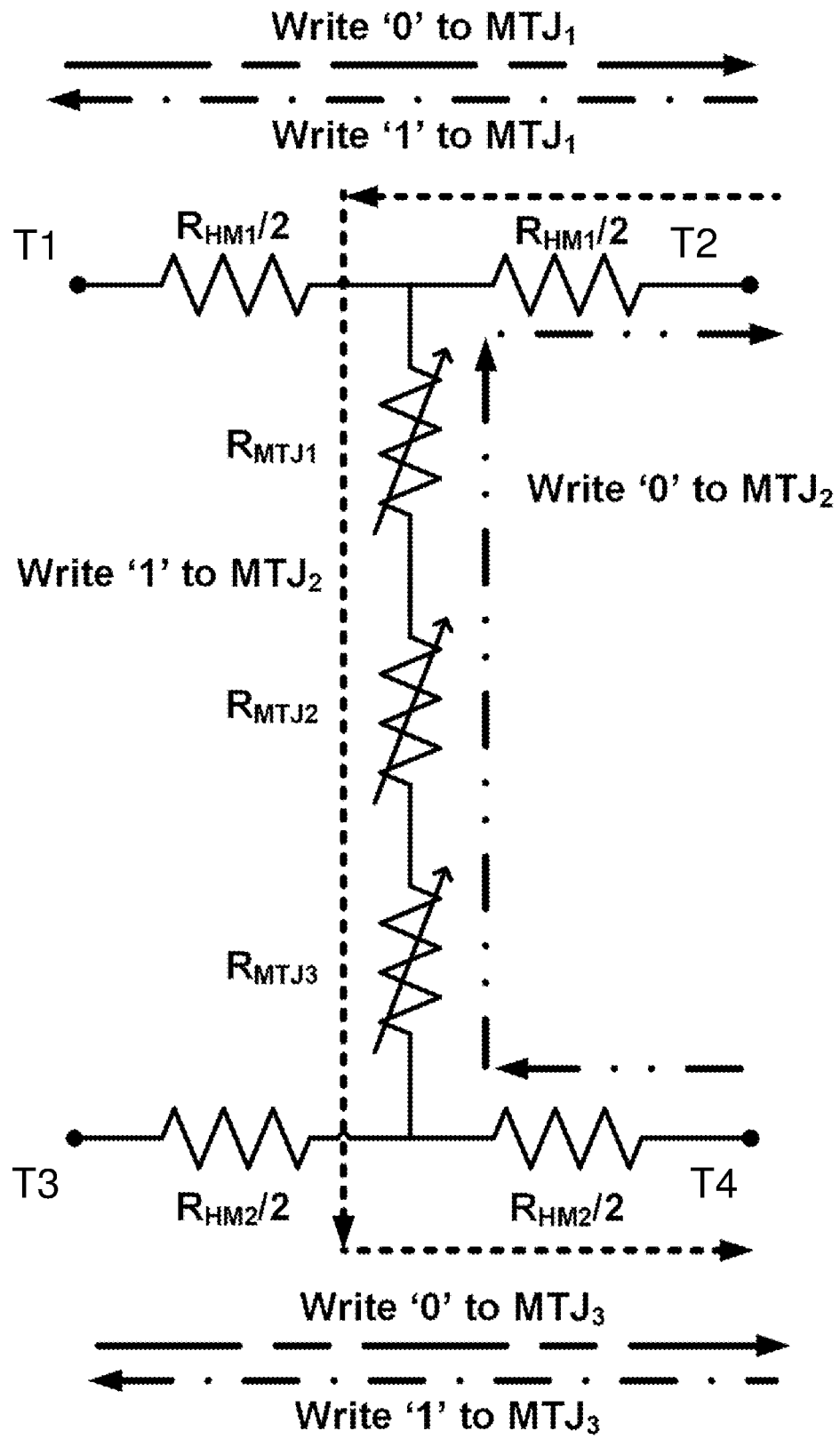
FIG. 23B shows the resistive model of the dual port spin-orbit torque triple-level cell (SOT-TLC) in the writing mode according to various embodiments

FIG. 23B shows the resistive model of the dual port spin-orbit torque triple-level cell (SOT-TLC) in the writing mode according to various embodiments. A resistive T-Model may be used to represent an SOT-MTJ, and a variable resistance may be used to represent the STT-MTJ. The memory cell may have a separate write path for each MTJ. The current paths for writing the three MTJs are shown in FIG. 23B.

For SOT programming, the current may need to flow through $HM_1$ to program $MTJ_1$ and may need to flow through $HM_2$ to program $MTJ_3$. The current may flow from T1 to T2 in order to write '0' for $MTJ_1$, and the current may flow from T3 to T4 in order to write '0' for $MTJ_3$. On the other hand, the current may flow from T2 to T1 in order to write '1' for $MTJ1_1$ and the current may flow from T4 to T3 to write '1' for $MTJ_3$.

Consequently, in order to write '0' to $MTJ_1$ or $MTJ_3$, SL of the MTJ may be pulled high and the BL of the MTJ pulled low. On the other hand, in order to write '1' to $MTJ_1$ or $MTJ_3$, the SL of the MTJ may be pulled low and the BL of the MTJ may be pulled high. SL1 may be pulled high and BL1 may be pulled low to write '0' to $MTJ_1$. Similarly, SL2 may be pulled high and BL2 may be pulled low to write '0' to $MTJ_3$. Conversely, SL1 may be pulled low and BL1 may be pulled high to write '1' to $MTJ_1$. SL2 may be pulled low and BL2 may be pulled high to write '1' to $MTJ_3$.

For the STT-$MTJ_2$, the write current may flow through the MTJ stack from $HM_2$ to $HM_1$ to write '0' and the write current may flow from $HM_1$ to $HM_2$ to write '1'. Hence, writing a '0' may require asserting the SL high and pulling the BL low, whereas writing a '1' may require asserting the BL high and pulling SL low. A writing current of 40 µA may be used for both SOT and STT effects occurrence.

$MTJ_2$ may be independently written via STT in a different time span from the time span of programming the two SOT-MTJs, i.e. $MTJ_1$ and $MTJ_3$. In order to write $MTJ_2$, both $M_{a1}$ and $M_{a2}$ may be deactivated (i.e. $WL_a$='0') while $M_b$ may be tuned on (i.e. $WL_b=V_{DD}$), thus permitting the write current to entirely flow through the MTJ stack with no leakage in order to program $MTJ_2$ only without affecting the states of $MTJ_1$ and $MTJ_3$. This may be due to the significantly large STT critical current ($I_{C,STT}$) required for SOT-$MTJ_1$ and SOT-$MTJ_3$. The large $I_{C,STT}$ for $MTJ_1$ and $MTJ_3$ may permit the write current flowing through the MTJ stack to only affect $MTJ_2$ (which has a small $I_{C,STT}$) without affecting the state of $MTJ_1$ and the state of $MTJ_3$, given that the supplied current to program $MTJ_2$ may be greater than the $I_{C,STT}$ for $MTJ_2$ but smaller than $I_{C,STT}$ for MTJ1 or $I_{C,STT}$ for $MTJ_3$.

In the dual port SOT-TLC MRAM, the two SOT-MTJs ($MTJ_1$ and $MTJ_3$) may be written in-parallel (i.e. within the same time span), with the aid of two bit lines, two source lines, two write drivers and one column decoder per bank. One column decoder may enable both the BL-SL pairs of the required cell and the two write drivers to determine the current flow to program the required data to the corresponding MTJ. Programming the two MTJs in-parallel may require activating all the access transistors of the cell ($M_{a1}$, $M_{a2}$, $M_b$) (i.e. $WL_a=WL_b=V_{DD}$). During the programming, a leakage current may flow through the MTJs stack. The leakage current may be insignificant, as the writing current prefers to flow in the low resistance electrodes ($HM_1$, $HM_2$) than flowing in the high resistance of the MTJ stack.

The resistance value of the electrodes may be in the range of hundreds of ohms and the resistance of the MTJ stack may be in the range of tens of kilo-ohms. The leakage current may be in the range of a few µA (e.g. any value from 1 to 3 µA, depending on the ratio between the values of the HM electrode resistance and the stack resistance) for a writing current of about 40 µA. The magnitude of 3 µA may be much smaller than the critical current of STT switching of any of the MTJs. Therefore, this leakage current may not cause any write-disturb failure via STT-switching and the impact of the leakage current may be insignificant.

Figure 23C:
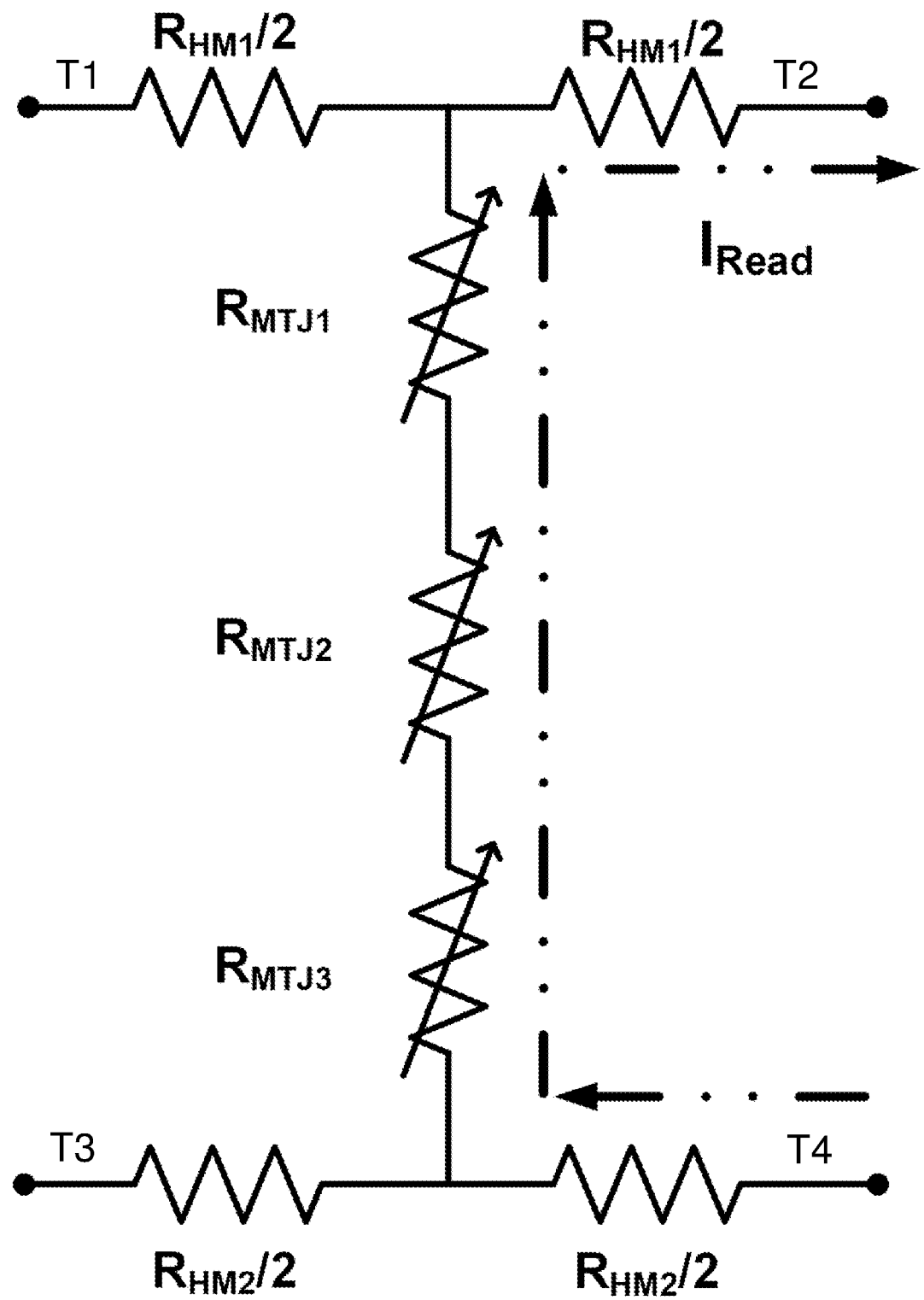
FIG. 23C shows the resistive model of the dual port spin-orbit torque triple-level cell (SOT-TLC) in the reading mode according to various embodiments.

FIG. 23C shows the resistive model of the dual port spin-orbit torque triple-level cell (SOT-TLC) in the reading mode according to various embodiments. The read current may have to pass through the whole TLC MTJ stack to be able to sense the existing resistance level. In order to ensure that only the selected cell is being read, $M_{a1}$ and $M_{a2}$ may be deactivated (i.e. $WL_a$='0') for all the cells, whilst $M_b$ may be activated (i.e. $WL_b=V_{DD}$) for the selected cell only. In addition, the read current may flow through the $BL_2$ terminal, while all the other source lines and the bit lines may be set to '0'. As $BL_2$ may be controlled by $M_b$, deactivating $M_b$ for the non-selected cells may permit the read current to flow through the selected cell only (i.e. cell with activated $M_b$) and successfully reading the stack resistance state.

FIG. 23D is a table summarizing the bias conditions for the two different word lines ($WL_a$, $WL_b$), the two source lines (SL1, SL2) and the two bit lines (BL1, BL2) in order to read and write the memory cell 2300 according to various embodiments. The writing voltage $VWR_1$ and $VWR_2$ may be equal to $V_{DD}$.

Figure 24:
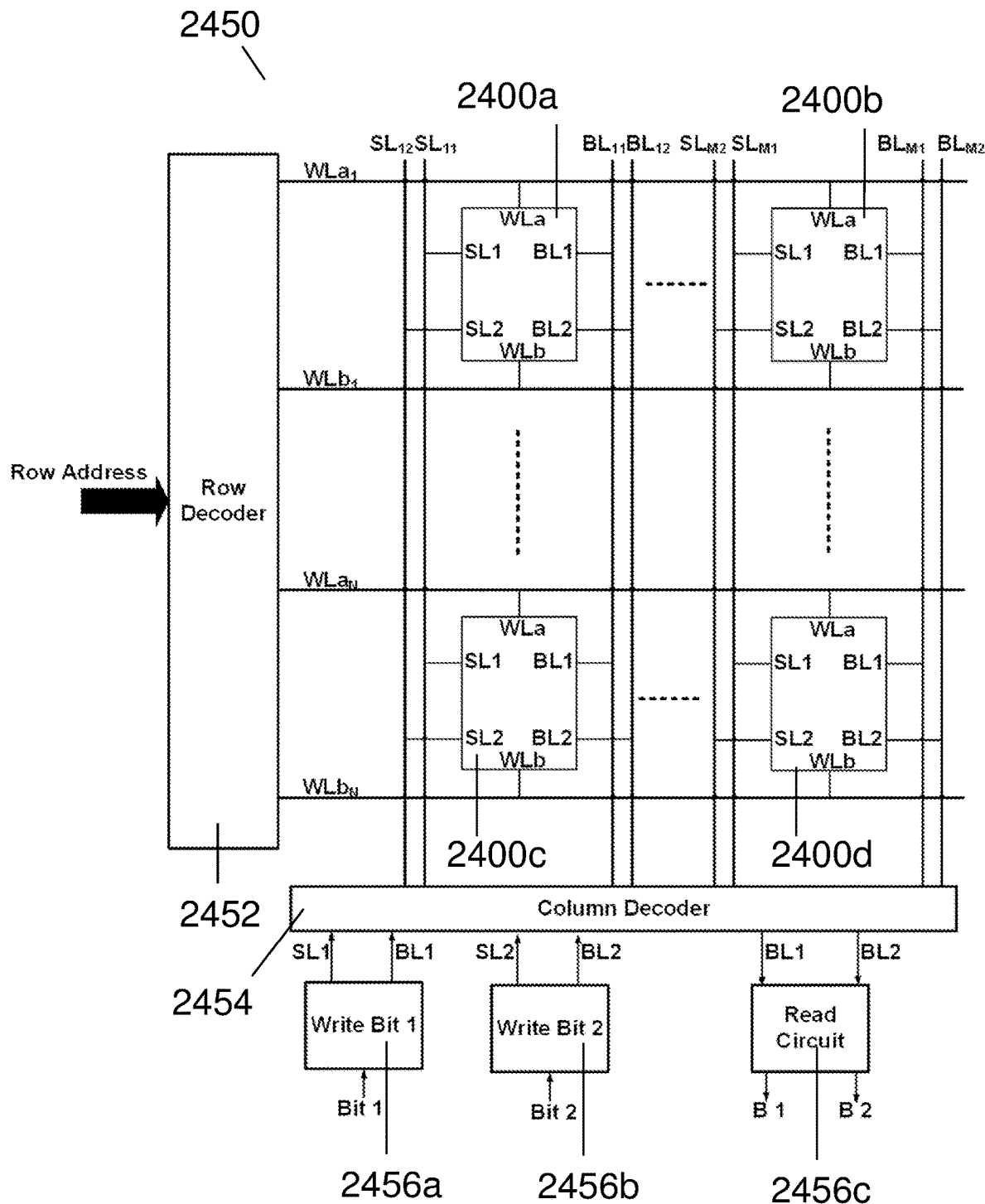
FIG. 24 shows a memory array including a plurality of memory cells according to various embodiments.

FIG. 24 shows a memory array 2450 including a plurality of memory cells 2400a-d according to various embodiments. The memory array 2450 may also include a row decoder 2452. The memory array 2450 may further include a column decoder 2454. The plurality of memory cells 2400a-d may be arranged in N rows and M columns (N×M array). The column decoder 2454 and the row decoder 2452 may be configured to select one memory cell out of the plurality of memory cells 2400a-d for reading and/or writing. The row decoder 2452 may select the row that includes the desired memory cell, while the column decoder 2454 may select the desired cell from the row selected by the row decider to either write or read the data.

The memory array 2450 may also include two write drivers 2456a, 2456b. The two write drivers 2456a 2456b may form a write circuit configured to write to the selected memory cell. For a dual port TLC-SOT MRAM, two write drivers may be required to be able to program the two SOT MTJs (MTJ$_1$ and MTJ$_3$) in-parallel. Moreover, the column select switches that connect BL-SL to write drivers may be doubled, compared to the single port TLC-SOT MRAM, so as to be able to control the second bit line and second source line per column. The memory array 2450 may also include a read circuit or read driver 2456c may be configured to read a selected memory cell. Dual port programming for two of the three MTJs per cell may increase the throughput by about 1.5 times compared to single port approach.

Figure 25A:
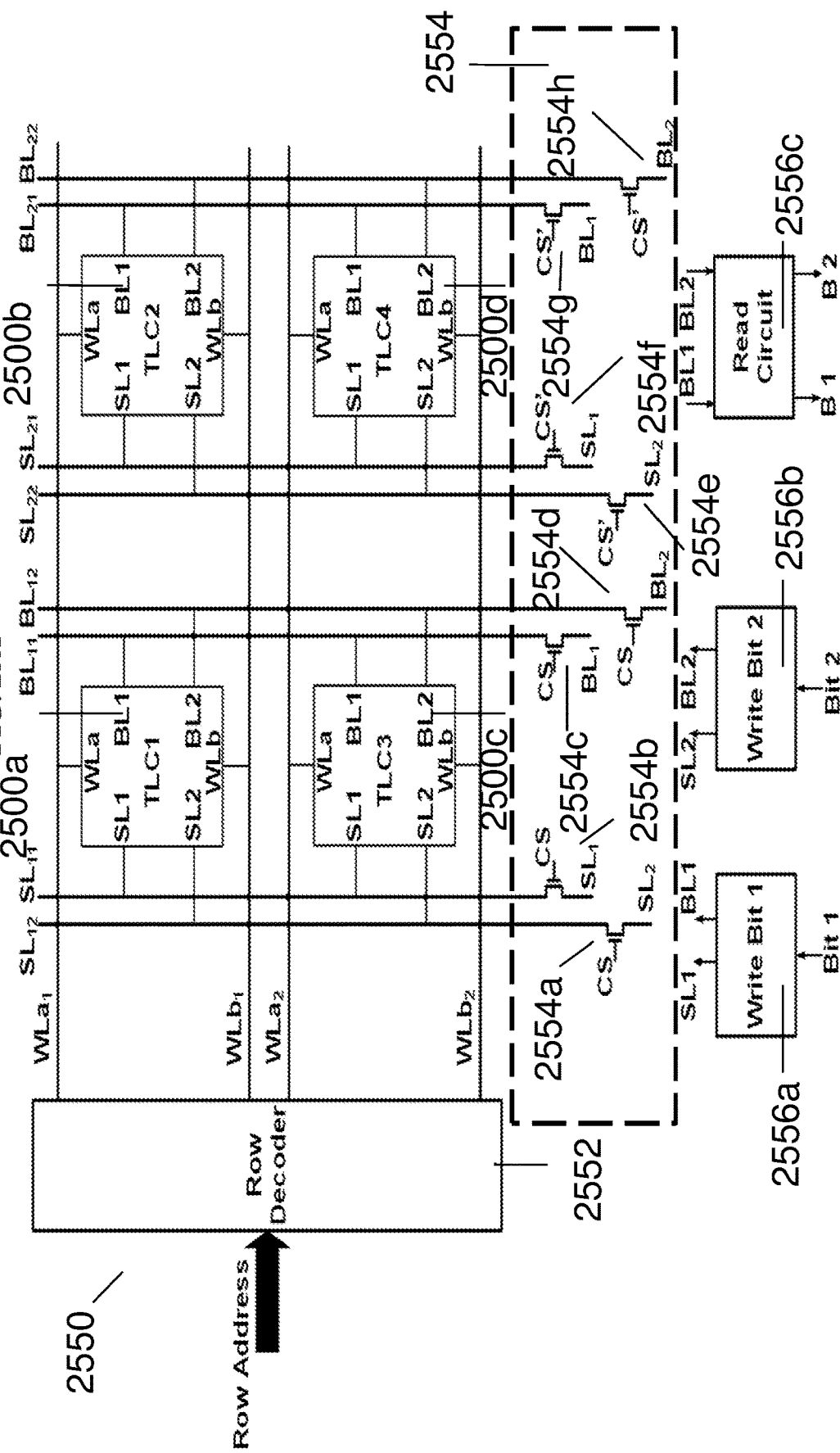
FIG. 25A shows a 2×2 dual port spin-orbit torque triple-level cell (SOT-TLC) memory array for validation according to various embodiments.

FIG. 25A shows a 2×2 dual port spin-orbit torque triple-level cell (SOT-TLC) memory array 2550 for validation according to various embodiments. The memory cell may include a read circuitry 2556c, two write drivers 2556a, 2556b, a 1-bit row decoder 2552 to select one of the two rows and a 1-bit column decoder 2554. A single column decoder 2554 may be enough to select the two bit lines and two source lines for each column as they share the same address. The column select switches 2554a-h may be doubled (compared to the single port TLC-SOT MRAM) so as to be able to control the second BL and second SL. Two write drivers 2556a, 2556b which determine the current flow directions in the HM electrodes, may be required for programming the two SOT-MTJs (i.e. MTJ$_1$ and MTJ$_3$) in parallel (i.e. within the same time span).

Figure 25B:
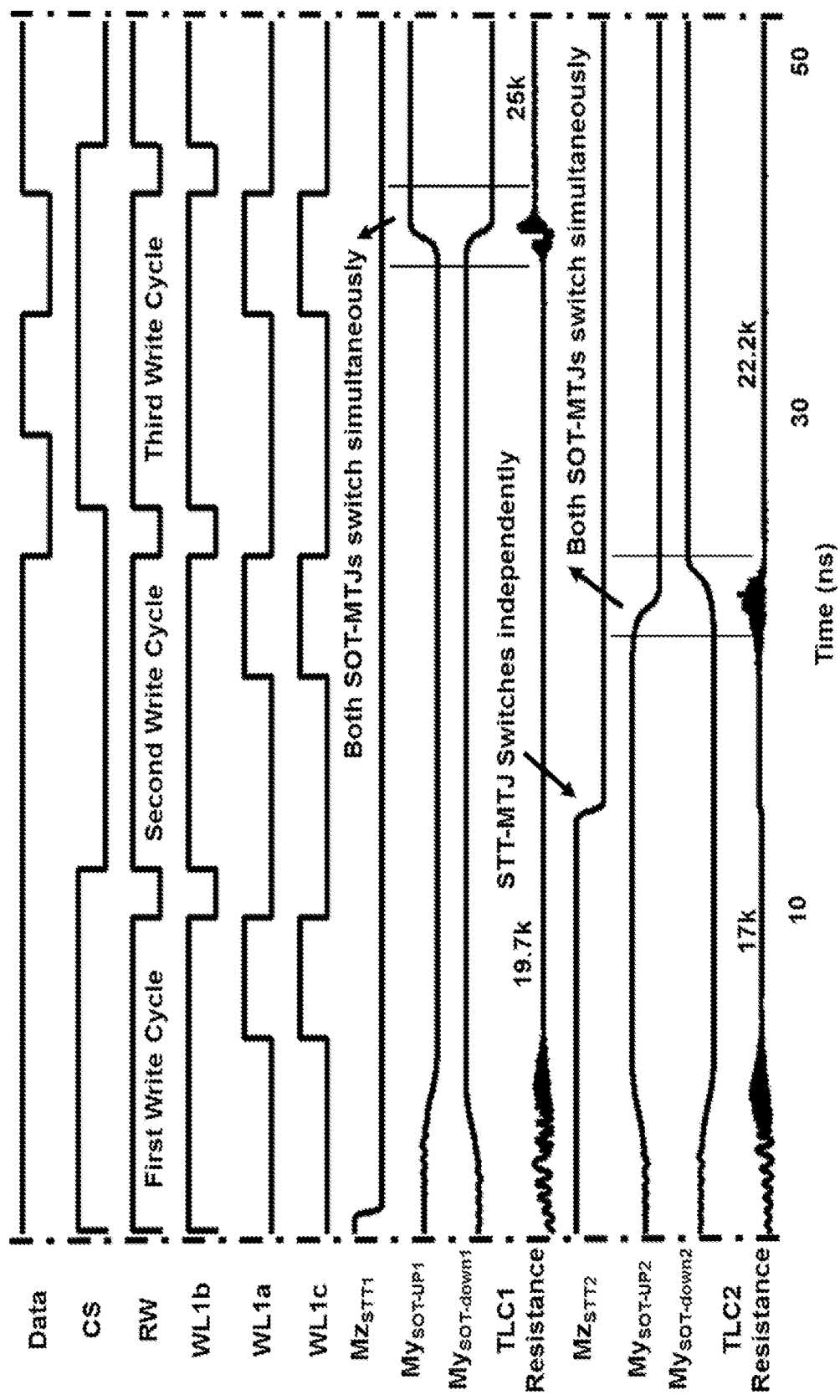
FIG. 25B shows a plot of resistance and various voltage signals as a function of time (in nanoseconds or ns) showing the validation of the programming and reading of the memory array shown in FIG. 25A according to various embodiments.

FIG. 25B shows a plot of resistance and various voltage signals as a function of time (in nanoseconds or ns) showing the validation of the programming and reading of the memory array 2550 shown in FIG. 25A according to various embodiments. FIG. 25B shows the SOT-MTJs in TLC1 and TLC2 in the memory array shown in FIG. 25A being programmed simultaneously, and the STT-MTJ being programmed separately and independently. In the second write cycle, the middle STT-MTJ$_2$ of the TLC2 may be programmed independently without affecting the states of the top and bottom SOT-MTJs. Thereafter, the two SOT-MTJs in TLC2 (SOT-MTJ$_{up2}$ and SOT-MTJ$_{down2}$) may be programmed simultaneously with different data (i.e. both switched within the same time span) without affecting the state of the middle STT-MTJ$_2$. In the third write cycle, the STT-MTJ$_1$ in TLC1 may not switch as it is already in the required state, while the two SOT-MTJs of TLC1 (SOT-MTJ$_{up1}$ and SOT-MTJ$_{down1}$) may be programmed simultaneously with different data. FIG. 25B may demonstrate the capability of the TLC cell to write the two SOT-MTJs simultaneously and the STT-MTJ independently.

Figure 26:
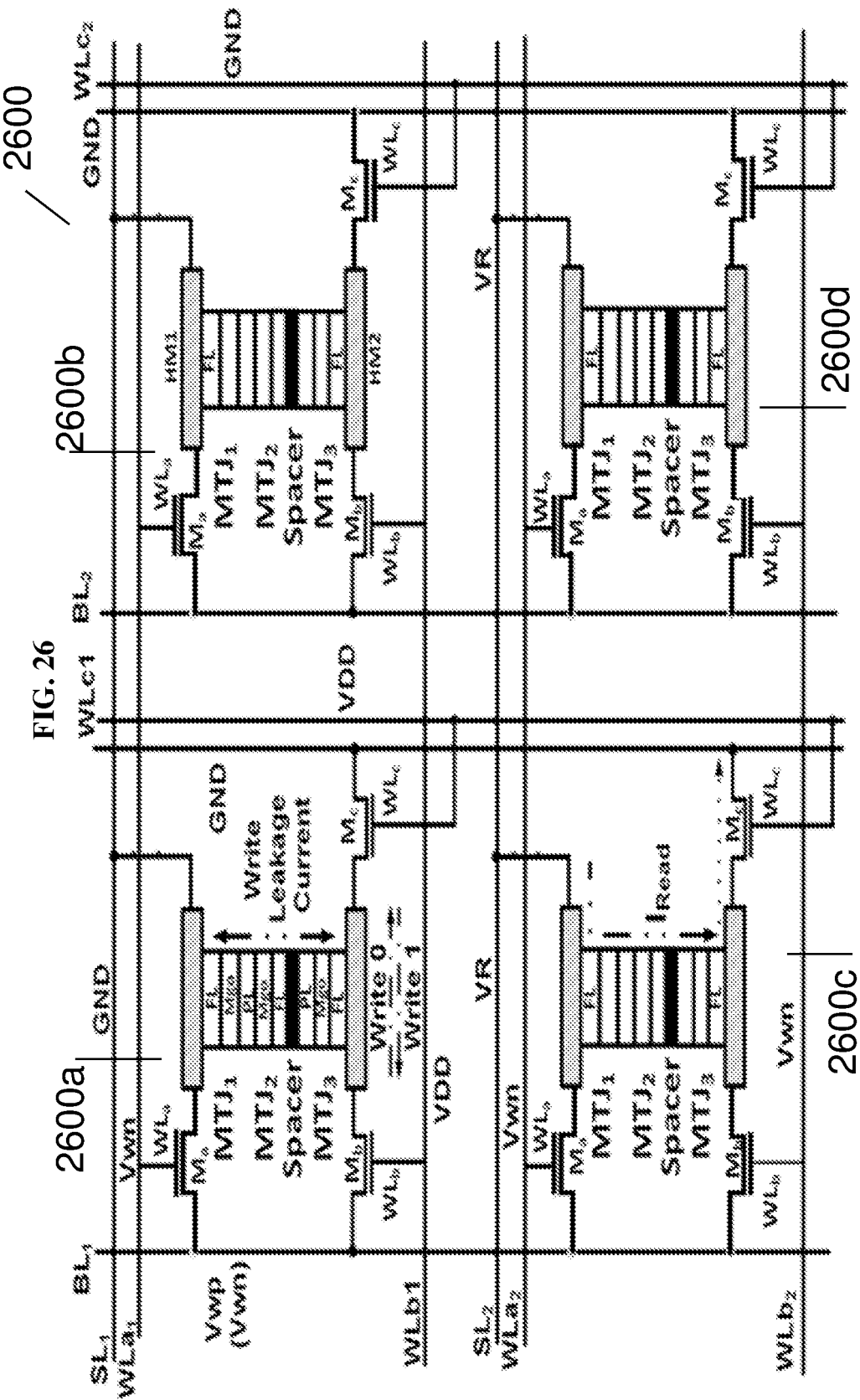
FIG. 26 shows a 2×2 dual port triple-level cell (TLC) architecture memory array configured for dual read/write operation according to various embodiments.

FIG. 26 shows a 2×2 dual port triple-level cell (TLC) architecture memory array 2600 configured for dual read/write operation according to various embodiments. The memory array 2600 may include cells 2600a-d. In the architecture shown in FIG. 26, each of the three bits in one cell, e.g. 2600a, may be accessed to perform a writing operation while within the same time span, other cells in the same column, e.g. 2600c, may be accessed sequentially to perform reading operation. Simultaneous read/write operations for the different cells may aid in increasing the speed to finish certain processes that requires intensive read/write operations.

Figure 27A:
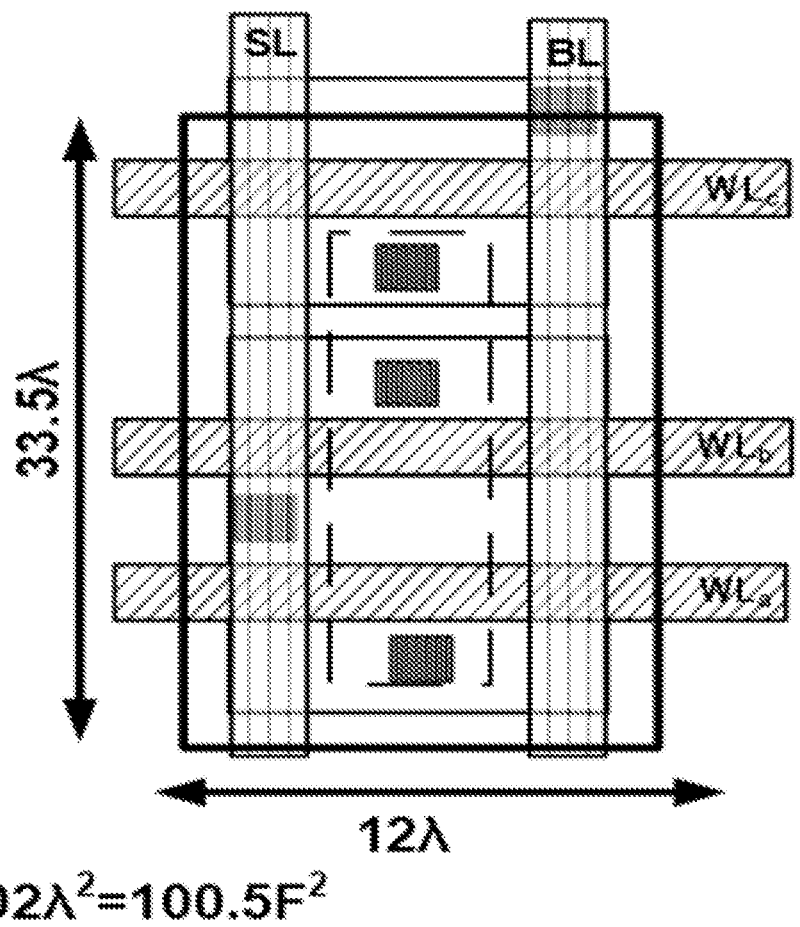
FIG. 27A is a schematic showing the layout of a single port spin-orbit torque triple-level cell (SOT-TLC) memory cell according to various embodiments.
Figure 27A:
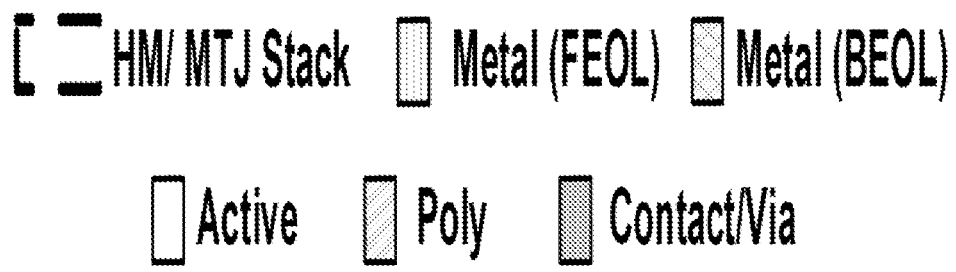

FIG. 27A is a schematic showing the layout of a single port spin-orbit torque triple-level cell (SOT-TLC) memory cell according to various embodiments. The layout shows the access transistors required in a TLC cell, the bit line and source line that exist on different FEOL metal layers and BEOL metal layers. The cell may require three access transistors with three different poly gates. Furthermore, $M_a$ and $M_b$ may have a common terminal (source) (i.e. connected to SL), which may help to decrease the cell overall area to be 100.5F$^2$ (i.e. 33.5F$^2$ 1-bit effective area). The layout may be similar to the layout shown in FIG. 14A.

Figure 27B:
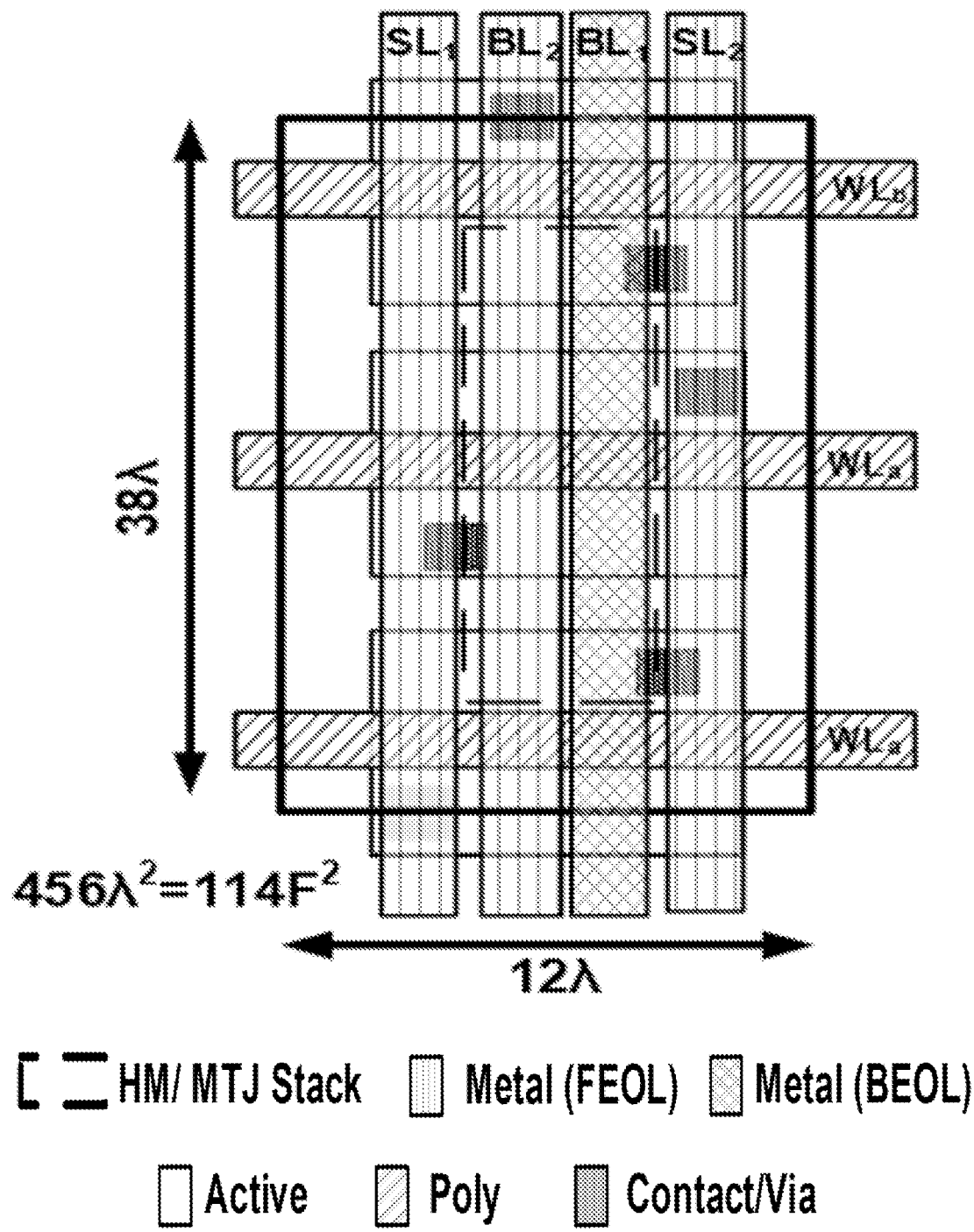
FIG. 27B is a schematic showing the layout of a dual port spin-orbit torque triple-level cell (SOT-TLC) memory cell according to various embodiments.

FIG. 27B is a schematic showing the layout of a dual port spin-orbit torque triple-level cell (SOT-TLC) memory cell according to various embodiments. The layout shows the three access transistors required in a cell, the bit lines and source lines that exist on the different front-end of line (FEOL) metal layers and back-end of line (BEOL) metal layers. As the terminals of transistors $M_{a1}$ and $M_{a2}$ are now connected to different signals (i.e. $M_{a1}$ source connected to SL1, while $M_{a2}$ source connected to SL2), an extra active spacing may be added between $M_{a1}$ and $M_{a2}$ source terminals, which may result in increasing the cell area from 100.5 F$^2$ (single port TLC area) to 114F$^2$ (i.e. 38F$^2$ 1-bit effective area). The layout may be similar to the layout shown in FIG. 14B.

Figure 28:
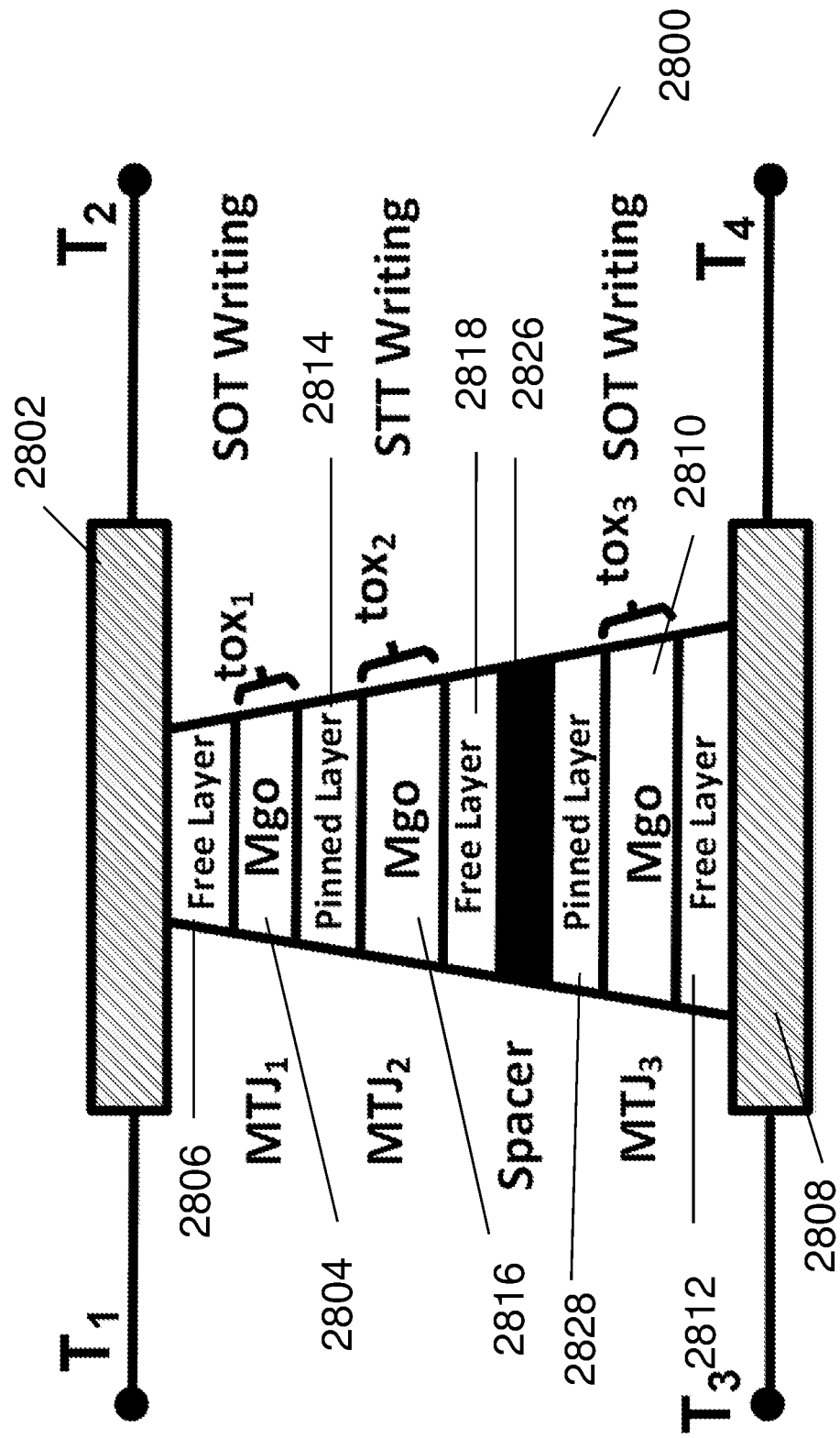
FIG. 28 is a schematic showing a memory cell according to various embodiments.

FIG. 28 is a schematic showing a memory cell 2800 according to various embodiments. The memory cell 2800 may include a first cell electrode 2802. The memory cell 2800 may also include a first insulator layer 2804. The memory cell 2800 may further include a first magnetic free layer 2806 between the first cell electrode 2802 and the first insulator layer 2804. The memory cell 2800 may also include a second cell electrode 2808. The memory cell 2800 may further include a second insulator layer 2810. The memory cell 2800 may additionally include a second magnetic free layer 2812 between the second cell electrode 2808 and the second insulator layer 2810. The memory cell 2800 may also include a magnetic pinned layer 2814 between the first insulator layer 2804 and the second insulator layer 2810.

The memory cell 2800 may also include a third insulator layer 2816, a third magnetic free layer 2818, a spacer layer 2826, and a further magnetic pinned layer 2828 between the magnetic pinned layer 2814 and the second insulator layer 2810.

The third insulator layer 2816 may be between the magnetic pinned layer 2814 and the third magnetic free layer 2818. The further magnetic pinned layer 2828 may be between the spacer layer 2826 and the second insulator layer 2810. The spacer layer 2826 may be between the third magnetic free layer 2818 and the further magnetic pinned layer 2828. The third magnetic free layer 2818 may be between the spacer layer 2826 and the third insulator layer 2816.

A direction of magnetization of the first magnetic free layer 2806 may be changeable in response to a current flowing between a first end and a second end of the first cell electrode 2802. A direction of magnetization of the second magnetic free layer 2812 may be changeable in response to a current flowing between a first end and a second end of the second cell electrode 2808. The magnetic pinned layer 2814 may have a fixed direction of magnetization.

A direction of magnetization of the third magnetic free layer 2818 may be changeable in response to a current flowing through the third magnetic free layer 2818. The further magnetic pinned layer 2828 may have a fixed direction of magnetization.

The direction of magnetization of the first magnetic free layer 2806 may be changeable in response to the current flowing between the first end and the second end of the first cell electrode 2802 due to spin-orbit torque (SOT) effect. The direction of magnetization of the second magnetic free layer 2812 may be changeable in response to the current flowing between the first end and the second end of the second cell electrode 2808 due to spin-orbit torque (SOT) effect.

The direction of magnetization of the third magnetic free layer 2818 may be changeable in response to the current flowing through the third magnetic free layer 2818 due to spin-transfer torque (STT) effect.

The second magnetic free layer 2812 may be on the second cell electrode 2808, the second insulator layer 2810 may be on the second magnetic free layer 2812, the further magnetic pinned layer 2828 may be on the second insulator layer 2810, the spacer layer 2826 may be on the further magnetic pinned layer 2828, the third magnetic free layer 2818 may be on the spacer layer 2826, the third insulator layer 2816 may be on the third magnetic free layer 2818, the magnetic pinned layer 2814 may be on the third insulator layer 2816, the first insulator layer 2804 may be on the magnetic pinned layer 2814, the first magnetic free layer 2806 may be on the first insulator layer 2804, and the first cell electrode 2802 may be on the first magnetic free layer 2806. The first magnetic free layer 2806, the first insulating layer 2804, and the magnetic pinned layer 2814 may form the first MTJ ($MTJ_1$). The magnetic pinned layer 2814, the third insulating layer 2816, and the third magnetic free layer 2818 may form the second MTJ ($MTJ_2$). The further magnetic pinned layer 2828, the second insulating layer 2810, and the second magnetic free layer 2812 may form the third MTJ ($MTJ_3$). The memory or MTJ stack may have a cone shape.

The three MTJs with distinct resistances may be realized by processing the stack in a cone shape, such that the serially connected MTJs have tapered cross sectional dimensions. A cross-sectional area of a layer of $MTJ_2$, such as third insulator layer 2816, may be smaller than a cross-sectional area of a layer of $MTJ_3$, such as second insulator layer 2810. A cross-sectional area of a layer of $MTJ_1$, such as first insulator layer 2804, may be smaller than a cross-sectional area of a layer of $MTJ_2$, such as third insulator layer 2816. The different cross-sectional dimensions of the three MTJs may result in different MTJ resistances. An additional change in the MTJs resistance may be obtained by additionally changing or varying the thickness of the insulator layers 2804, 2816, 2810. The memory cell 2800 may be used for single port programming as shown in FIG. 18A or dual port programming as shown in FIG. 23A.

Figure 29:
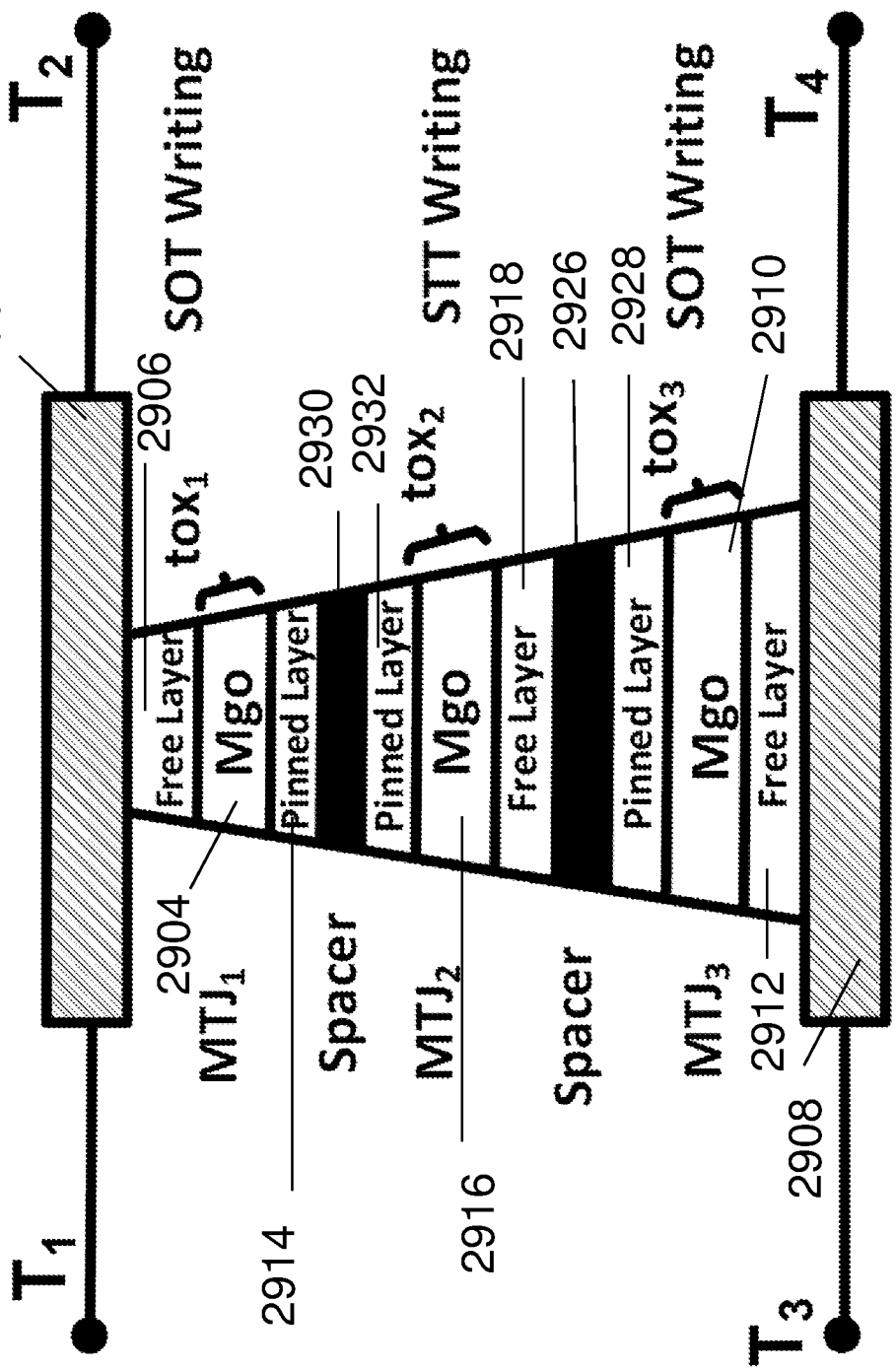
FIG. 29 is a schematic showing a memory cell according to various embodiments.

FIG. 29 is a schematic showing a memory cell 2900 according to various embodiments. The memory cell 2900 may include a first cell electrode 2902. The memory cell 2900 may also include a first insulator layer 2904. The memory cell 2900 may further include a first magnetic free layer 2906 between the first cell electrode 2902 and the first insulator layer 2904. The memory cell 2900 may also include a second cell electrode 2908. The memory cell 2900 may further include a second insulator layer 2910. The memory cell 2900 may additionally include a second magnetic free layer 2912 between the second cell electrode 2908 and the second insulator layer 2910. The memory cell 2900 may also include a magnetic pinned layer 2914 between the first insulator layer 2904 and the second insulator layer 2910.

The memory cell 2900 may also include a third insulator layer 2916, a third magnetic free layer 2918, a spacer layer 2926, and a further magnetic pinned layer 2928 between the magnetic pinned layer 2914 and the second insulator layer 2910.

The third insulator layer 2916 may be between the magnetic pinned layer 2914 and the third magnetic free layer 2918. The further magnetic pinned layer 2928 may be between the spacer layer 2926 and the second insulator layer 2910. The spacer layer 2926 may be between the third magnetic free layer 2918 and the further magnetic pinned layer 2928. The third magnetic free layer 2918 may be between the spacer layer 2926 and the third insulator layer 2916.

The memory cell 2900 may further include a further spacer layer 2930 and another pinned layer 2932 between the magnetic pinned layer 2914 and the third insulator layer 2916.

The further spacer layer 2930 may be between the magnetic pinned layer 2914 and the other magnetic pinned layer 2932. The other magnetic pinned layer 2932 may be between the further spacer layer 2930 and the third insulator layer 2916.

A direction of magnetization of the first magnetic free layer 2906 may be changeable in response to a current flowing between a first end and a second end of the first cell electrode 2902. A direction of magnetization of the second magnetic free layer 2912 may be changeable in response to a current flowing between a first end and a second end of the second cell electrode 2908. The magnetic pinned layer 2914 may have a fixed direction of magnetization.

A direction of magnetization of the third magnetic free layer 2918 may be changeable in response to a current flowing through the third magnetic free layer 2918. The further magnetic pinned layer 2928 may have a fixed direction of magnetization. The other magnetic pinned layer 2932 may have a fixed direction of magnetization.

The direction of magnetization of the first magnetic free layer 2906 may be changeable in response to the current flowing between the first end and the second end of the first cell electrode 2902 due to spin-orbit torque (SOT) effect. The direction of magnetization of the second magnetic free layer 2912 may be changeable in response to the current flowing between the first end and the second end of the second cell electrode 2908 due to spin-orbit torque (SOT) effect.

The direction of magnetization of the third magnetic free layer 2918 may be changeable in response to the current flowing through the third magnetic free layer 2918 due to spin-transfer torque (STT) effect.

The second magnetic free layer 2912 may be on the second cell electrode 2908, the second insulator layer 2910 may be on the second magnetic free layer 2912, the further magnetic pinned layer 2928 may be on the second insulator layer 2910, the spacer layer 2926 may be on the further magnetic pinned layer 2928, the third magnetic free layer 2918 may be on the spacer layer 2926, the third insulator layer 2916 may be on the third magnetic free layer 2918, the other magnetic pinned layer 2932 may be on the third insulator layer 2916, the further spacer layer 2930 may be on the other magnetic pinned layer 2932, the magnetic pinned layer 2914 may be on the further spacer layer 2930, the first insulator layer 2904 may be on the magnetic pinned layer 2914, the first magnetic free layer 2906 may be on the first insulator layer 2904, and the first cell electrode 2902 may be on the first magnetic free layer 2906.

The first magnetic free layer 2906, the first insulator layer 2904, and the magnetic pinned layer 2914 may form the first MTJ ($MTJ_1$). The other magnetic pinned layer 2932, the third insulator layer 2916, and the third magnetic free layer 2918 may form the second MTJ ($MTJ_2$). The further magnetic pinned layer 2928, the second insulating layer 2910, and the second magnetic free layer 2912 may form the third MTJ ($MTJ_3$). The memory or MTJ stack may have a cone shape. The further spacer layer 2930 may separate MTJ$_1$ and MTJ$_2$, while the spacer layer 2926 may separate MTJ$_2$ and MTJ$_3$.

The tapered cross sectional dimensions of the three MTJs aids in realizing the MTJs with distinct resistances. A cross-sectional area of a layer of MTJ$_2$, such as third insulator layer 2916, may be smaller than a cross-sectional area of a layer of MTJ$_3$, such as second insulator layer 2910. A cross-sectional area of a layer of MTJ$_1$, such as first insulator layer 2904, may be smaller than a cross-sectional area of a layer of MTJ$_2$, such as third insulator layer 2916. Additionally, the thickness of the insulator layer of each MTJ may be varied for further tuning of the MTJs' resistance values. The memory cell 2900 may be used for single port programming as shown in FIG. 18A or dual port programming as shown in FIG. 23A.

Various embodiments may relate to a four-terminal SOT-TLC structure with three separate write paths. Various embodiments may relate to a memory cell including three access transistor to access three bits (i.e. equivalent to a 3T2R cell). Various embodiments may relate to a cell which uses SOT writing for two out of the three MTJs. Various embodiments may relate to a memory cell with dual write ports for dual port programming. Various embodiments may relate to a memory cell with a uniform MTJ stack cross-section.

Figure 30:
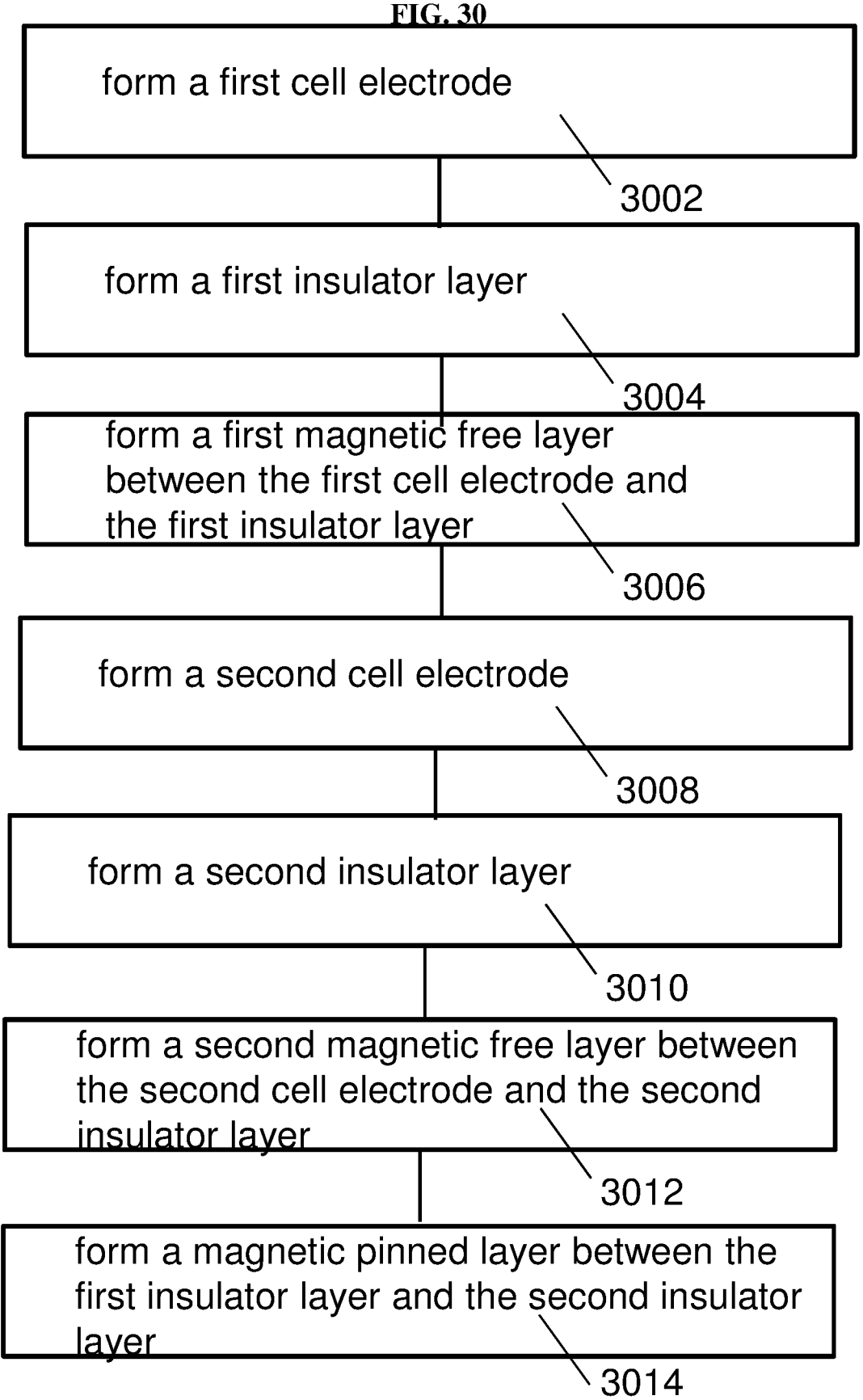
FIG. 30 is a schematic showing a method of forming a memory cell according to various embodiments.

FIG. 30 is a schematic showing a method of forming a memory cell according to various embodiments. The method may include, in 3102, forming a first cell electrode. The method may also include, in 3004, forming a first insulator layer. The method may further include, in 3006, forming a first magnetic free layer between the first cell electrode and the first insulator layer. The method may additionally include, in 3008, forming a second cell electrode. The method may also include, in 3010, forming a second insulator layer. The method may further include, in 3012, forming a second magnetic free layer between the second cell electrode and the second insulator layer. The method may additionally include, in 3014, forming a magnetic pinned layer between the first insulator layer and the second insulator layer. A direction of magnetization of the first magnetic free layer may be changeable in response to a current flowing between the first end and the second end of the first cell electrode. A direction of magnetization of the second magnetic free layer may be changeable in response to a current flowing between the first end and the second end of the second cell electrode. The magnetic pinned layer may have a fixed direction of magnetization.

The steps shown in FIG. 30 may not be in sequence. For instance, forming the magnetic pinned layer (step 3014) may be before forming the second cell electrode (step 3008). It may also be envisioned that the steps shown in FIG. 30 are simultaneous.

In various embodiments, step 3002 may occur first, followed by steps 3006, 3004, 3014, 3010, 3012, and 3008. In various other embodiments, step 3008 may occur first, followed by steps 3012, 3010, 3014, 3004, 3006, and 3002.

In various embodiments, the method may also include forming a further magnetic pinned layer between the first insulator layer and the second insulator layer. The method may also include a spacer layer between the magnetic pinned layer and the further magnetic pinned layer. The magnetic pinned layer may be between the first insulator layer and the spacer layer, and the further magnetic pinned layer may be between the second insulator layer and the spacer layer. The further magnetic pinned layer may have a fixed direction of magnetization.

The method may also include forming a first transistor in electrical connection with an end portion of the first cell electrode. The method may further include forming a second transistor in electrical connection with an end portion of the second cell electrode. The method may additionally include forming a third transistor in electrical connection with a further end portion of the second cell electrode.

The first transistor may include a control electrode, a first controlled electrode, and a second controlled electrode. The second transistor may include a control electrode, a first controlled electrode, and a second controlled electrode. The third transistor may include a control electrode, a first controlled electrode, and a second controlled electrode.

The first controlled electrode of the first transistor may be in electrical connection with an end portion of the first cell electrode. The first controlled electrode of the second transistor may be in electrical connection with an end portion of the second cell electrode. The first controlled electrode of the third transistor may be in electrical connection with a further end portion of the second cell electrode.

In various embodiments, the second controlled electrode of the first transistor and the second controlled electrode of the second transistor may be in electrical connection with a source line. The second controlled electrode of the third transistor may be in electrical connection with a bit line. A further end portion of the first cell electrode may be in electrical connection with the bit line. The control electrode of the first transistor may be in electrical connection with a first word line. The control electrode of the second transistor may be in electrical connection with a second word line. The control electrode of the third transistor may be in electrical connection with a third word line.

In various other embodiments, the second controlled electrode of the first transistor may be in electrical connection with a first source line. The second controlled electrode of the second transistor may be in electrical connection with a second source line. A further end of the first cell electrode may be in electrical connection with a first bit line. The second controlled electrode of the third transistor may be in electrical connection with a second bit line. The control electrode of the first transistor and the control electrode of the second transistor may be in electrical connection with a first word line. The control electrode of the third transistor may be in electrical connection with a second word line.

In various embodiments, the method may further include forming a third insulator layer, a third magnetic free layer, a spacer layer and a further magnetic pinned layer between the magnetic pinned layer and the second insulator layer. The third insulator layer may be between the magnetic pinned layer and the third magnetic free layer. The further magnetic pinned layer may be between the spacer layer and the second insulator layer. The spacer layer may be between the third magnetic free layer and the further magnetic pinned layer. A direction of magnetization of the third magnetic free layer may be changeable in response to a current flowing through the third magnetic free layer. The further magnetic pinned layer may have a fixed direction of magnetization.

In various embodiments, the method may further include forming a further spacer layer and another magnetic pinned layer between the magnetic pinned layer and the third insulator layer. The further spacer layer may be between the magnetic pinned layer and the other magnetic pinned layer. The other magnetic pinned layer may be between the further spacer layer and the third insulator layer. The other magnetic pinned layer may have a fixed direction of magnetization.

Various embodiments may relate to a method of forming a memory array including a plurality of memory cells. The method may include forming a row decoder and a column decoder configured to select one memory cell out of the plurality of memory cells. The method may include forming a write circuit configured to write to the selected memory cell. The method may also include forming a read circuit configured to read from the selected memory cell.

Various embodiments may relate to a memory cell or memory array which is easier to fabricate compared to conventional memory cells or memory arrays. Various embodiments may relate to a simpler manufacturing process.

FIG. 31 is a schematic showing a method of operating a memory cell according to various embodiments. The method may include, in 3102, flowing a current between a first end and a second end of a first cell electrode to change a direction of magnetization of a first magnetic free layer between the first cell electrode and a first insulator layer. The method may also include, in 3104, flowing a current between a first end and a second end of a second cell electrode to change a direction of magnetization of a second magnetic free layer between the second cell electrode and a second insulator layer. The memory cell also may include a magnetic pinned layer between the first insulator layer and the second insulator layer. The magnetic pinned layer may have a fixed direction of magnetization.

The steps shown in FIG. 31 may not be in sequence. For instance, step 3104 may be before step 3102, or may occur simultaneously with step 3102.

The current flowing between the first end and the second end of the first cell electrode may be distinct from the current flowing between the first end and the second end of the second cell electrode.

The memory cell may include a first magnetic tunnel junction and a second magnetic tunnel junction. The first magnetic tunnel junction and the second magnetic tunnel junction may be SOT MTJs.

The current may flow from the first end of the first cell electrode to the second end of the first cell electrode to write a first state to the first free magnetic layer. The current may flow from the second end of the first cell electrode to the first end of the first cell electrode to write a second state to the first free magnetic layer. The second state may be different from the first state.

The current may flow from the first end of the second cell electrode to the second end of the second cell electrode to write a first state to the second free magnetic layer. The current may flow from the second end of the second cell electrode to the first end of the second cell electrode to write a second state to the second free magnetic layer. For example, the direction of magnetization when the first magnetic free layer is in the first state may be parallel to the fixed direction of magnetization of the magnetic pinned layer of the first magnetic tunnel junction, while the direction of magnetization when the first magnetic free layer is in the second state may be anti-parallel to the fixed direction of magnetization of the magnetic pinned layer of the first magnetic tunnel junction. Similarly, the direction of magnetization when the second magnetic free layer is in the first state may be parallel to the fixed direction of magnetization of the magnetic pinned layer of the second magnetic tunnel junction, while the direction of magnetization when the second magnetic free layer is in the second state may be anti-parallel to the fixed direction of magnetization of the magnetic pinned layer of the second magnetic tunnel junction.

The first magnetic tunnel junction may switch between a first resistance state (alternatively referred to as a first logic state) and a second resistance state (alternatively referred to as a second logic state), which may be based on the direction of magnetization or the state of the first magnetic layer. For instance, the first magnetic tunnel junction may be in the first resistance state when the direction of magnetization of the first magnetic free layer is parallel to the direction of magnetization of the magnetic pinned layer of the first magnetic tunnel junction, and may be in the second resistance state when the direction of magnetization of the first magnetic free layer is anti-parallel to the direction of magnetization of the magnetic pinned layer of the first magnetic tunnel junction. Similarly, the second magnetic tunnel junction may be in the first resistance state when the direction of magnetization of the second magnetic free layer is parallel to the direction of magnetization of the magnetic pinned layer of the second magnetic tunnel junction, and may be in the second resistance state when the direction of magnetization of the second magnetic free layer is anti-parallel to the direction of magnetization of the magnetic pinned layer of the second magnetic tunnel junction. As a result, the memory cell according to various embodiments (may be referred to as a multi-level cell or MLC) may have four different states, based on the resistance state of the first magnetic tunnel junction and the resistance state of the second magnetic tunnel junction.

The direction of magnetization of the first magnetic free layer may be changeable in response to the current flowing between the first end and the second end of the first cell electrode due to spin-orbit torque (SOT) effect. The direction of magnetization of the second magnetic free layer may be changeable in response to the current flowing between the first end and the second end of the second cell electrode due to spin-orbit torque (SOT) effect.

In various embodiments, flowing the current between the first end and the second end of the first cell electrode and flowing the current between the first end and the second end of the second cell electrode may be carried out at different time periods, e.g. for single port or serial writing. In other words, flowing the current between the first end and the second end of the first cell electrode and flowing the current between the first end and the second end of the second cell electrode may occur serially or sequentially, i.e. one after another.

In various other embodiments, flowing the current between the first end and the second end of the first cell electrode and flowing the current between the first end and the second end of the second cell electrode may be carried out at a same time period, e.g. for dual port or simultaneous writing. In other words, flowing the current between the first end and the second end of the first cell electrode and flowing the current between the first end and the second end of the second cell electrode may be carried out may occur simultaneously.

In various embodiments, the memory cell may include a first transistor in electrical connection with an end portion of the first cell electrode. The memory cell may also include a second transistor in electrical connection with an end portion of the second cell electrode. The memory cell may additionally include a third transistor in electrical connection with a further end portion of the second cell electrode.

The first transistor may include a control electrode, a first controlled electrode, and a second controlled electrode. The second transistor may include a control electrode, a first controlled electrode, and a second controlled electrode. The third transistor may include a control electrode, a first controlled electrode, and a second controlled electrode. The first controlled electrode of the first transistor may be in electrical connection with an end portion of the first cell electrode. The first controlled electrode of the second transistor may be in electrical connection with an end portion of the second cell electrode. The first controlled electrode of the third transistor may be in electrical connection with a further end portion of the second cell electrode.

In various embodiments, such as in a memory cell, e.g. MLC, employing the single port writing scheme, the second controlled electrode of the first transistor and the second controlled electrode of the second transistor may be in electrical connection with a source line. The second controlled electrode of the third transistor may be in electrical connection with a bit line. A further end portion of the first cell electrode may be in electrical connection with the bit line. The control electrode of the first transistor may be in electrical connection with a first word line. The control electrode of the second transistor may be in electrical connection with a second word line. The control electrode of the third transistor may be in electrical connection with a third word line.

Writing to the first magnetic free layer may include activating, i.e. turning on, the first transistor (via the first word line). The second transistor and the third transistor may be deactivated, i.e. turned off. The write current may flow through the first transistor and the first cell electrode.

Writing to the second magnetic free layer may include activating the second transistor (via the second word line) and the third transistor (via the third word line). The first transistor may be turned off. The write current may flow through the second transistor, the second cell electrode and the third transistor.

Reading a state of the memory cell may include determining the resistance state of the first magnetic tunnel junction and the resistance state of the second magnetic tunnel junction. The second transistor may be turned on to allow a read current to flow through the memory stack, i.e. flow through the second transistor, the first magnetic tunnel junction, and the second magnetic tunnel junction. The first transistor and the third transistor may be deactivated. The resistance state of the first magnetic tunnel junction and the resistance state of the second magnetic tunnel junction may be determined by determining a read voltage of the read current. The resistance state of the first magnetic tunnel junction and the resistance state of the second magnetic tunnel junction may be determined by determining a combined resistance of the first magnetic tunnel junction, and the second magnetic tunnel junction.

In various embodiments, the resistance of the first magnetic tunnel junction and the resistance of the second magnetic tunnel junction when they are in the same resistance state may be different. For instance, the resistance of the first magnetic tunnel junction may be different from the resistance of the second magnetic tunnel junction when both the first magnetic tunnel junction and the second magnetic tunnel junction are in the first resistance state, or when both the first magnetic tunnel junction and the second magnetic tunnel junction are in the second resistance state. The difference in resistance may be made possible by the first magnetic tunnel junction and the second magnetic tunnel junction having different thicknesses of insulating layers. The difference in resistance may allow the memory cell to distinguish from a state when the first magnetic tunnel junction is in the first resistance state and the second magnetic tunnel junction is in the second resistance state, from a state when the first magnetic tunnel junction is in the second resistance state and the second magnetic tunnel junction is in the first resistance state.

In various embodiments, such as in a memory cell, e.g. MLC, employing the dual port writing scheme, the second controlled electrode of the first transistor may be in electrical connection with a first source line. The second controlled electrode of the second transistor may be in electrical connection with a second source line. A further end of the first cell electrode may be in electrical connection with a first bit line. The second controlled electrode of the third transistor may be in electrical connection with a second bit line. The control electrode of the first transistor and the control electrode of the second transistor may be in electrical connection with a first word line. The control electrode of the third transistor may be in electrical connection with a second word line.

Writing to the first magnetic free layer may include activating the first transistor (via the first word line). Writing to the second magnetic free layer may include activating the second transistor (via the first word line) and the third transistor (via the second word line). Since the first magnetic free layer and the second magnetic free layer are written simultaneously, the first transistor and the second transistor may be turned on by the first word line, and the third transistor may be turned on by the second word line at the same time. A first write current may flow through the first transistor and the first cell electrode, while a second write current may flow through the second transistor, the second cell electrode, and the third transistor.

Reading a state of the memory cell may include determining the resistance state of the first magnetic tunnel junction and the resistance state of the second magnetic tunnel junction. The third transistor may be activated or turned on to allow a read current to flow through the memory stack, i.e. flow through the first magnetic tunnel junction and the second magnetic tunnel junction. The first transistor and the second transistor may be deactivated. A read current may flow through the second magnetic tunnel junction, the first magnetic tunnel junction, and the third transistor. The resistance state of the first magnetic tunnel junction and the resistance state of the second magnetic tunnel junction may be determined by determining a read voltage of the read current. The resistance state of the first magnetic tunnel junction and the resistance state of the second magnetic tunnel junction may be determined by determining a combined resistance of the first magnetic tunnel junction, and the second magnetic tunnel junction.

In various embodiments, the resistance of the first magnetic tunnel junction and the resistance of the second magnetic tunnel junction when they are in the same resistance state may be different. For instance, the resistance of the first magnetic tunnel junction may be different from the resistance of the second magnetic tunnel junction when both the first magnetic tunnel junction and the second magnetic tunnel junction are in the first resistance state, or when both the first magnetic tunnel junction and the second magnetic tunnel junction are in the second resistance state. The difference in resistance may be made possible by the first magnetic tunnel junction and the second magnetic tunnel junction having different thicknesses of insulating layers.

In various embodiments, the memory cell may include a STT magnetic tunnel junction between the first magnetic tunnel junction, i.e. the first SOT MTJ, and the second magnetic tunnel junction, i.e. the second SOT MTJ. The magnetic free layer of the STT MTJ, i.e. the third magnetic free layer may be changeable in response to a current flowing through the third magnetic free layer due to the STT effect. The memory cell including two SOT MTJs and one STT MTJ may be referred to as a triple level cell (TLC). The STT magnetic tunnel junction may be written independently from the writing of the first SOT MTJ and/or the second SOT MTJ. The first SOT MTJ may be written at a same time or at a different time from a time in which the second SOT MTJ is written. The STT magnetic tunnel junction may be written without affecting the first SOT MTJ and the second SOT MTJ. The magnetic free layer of the STT MTJ may have a Gilbert damping coefficient different from that of the first SOT MTJ and the second SOT MTJ. The free layer of the STT MTJ may be configured to promote the STT effect, while the free layers of the SOT MTJs may be configured to degrade the STT effect. The STT magnetic free layer, i.e. a magnetic free layer of the STT MTJ, may have a STT coefficient larger or greater than a SOT magnetic free layer, i.e. a magnetic free layer of the first SOT MTJ or a magnetic free layer of the second SOT MTJ, which may be due to control of the free layer damping factor. Accordingly, the STT MTJ may be programmed without affecting the states of the first SOT MTJ and the second SOT MTJ.

The STT MTJ may be written at a time period or time periods different from writing the first SOT MTJ and the second SOT MTJ. The first SOT MTJ and the second SOT MTJ may be written at different time periods (as in a single port triple level cell) or in the same time period (as in a dual port triple level cell).

The STT MTJ may switch between a first resistance state (alternatively referred to as a first logic state) and a second resistance state (alternatively referred to as a second logic state), which may be based on the direction of magnetization or the state of the magnetic layer of the STT MTJ, i.e. the third magnetic free layer. For instance, the STT MTJ may be in the first resistance state when the direction of magnetization of the third magnetic free layer is parallel to the direction of magnetization of the magnetic pinned layer of the third magnetic tunnel junction, and may be in the second resistance state when the direction of magnetization of the third magnetic free layer is anti-parallel to the direction of magnetization of the magnetic pinned layer of the third magnetic tunnel junction. Each of the SOT MTJ may also switched between a first resistance state and a second resistance state as highlighted above. As a result, the memory cell, i.e. the TLC, according to various embodiments, may have eight different states, based on the resistance state of the first SOT MTJ, the second SOT MTJ, and the STT MTJ.

The write current may flow from a first end of the second cell electrode, through the second SOT MTJ, through the STT MTJ, through the first SOT MTJ, and to the second end of the first cell electrode to write a first state to the STT MTJ. Conversely, the write current may flow from the second end of the first cell electrode, through the first SOT MTJ, through the STT MTJ, through the second SOT MTJ and to the first end of the second cell electrode to write a second state to the STT MTJ.

Writing to the first SOT MTJ and the second SOT MTJ of the TLC may be similar to writing to a memory cell including two SOT MTJs without the STT MTJ, e.g. the MLC as described above.

In various embodiments, the memory cell may include a first transistor in electrical connection with an end portion of the first cell electrode. The memory cell may also include a second transistor in electrical connection with an end portion of the second cell electrode. The memory cell may additionally include a third transistor in electrical connection with a further end portion of the second cell electrode.

The first transistor may include a control electrode, a first controlled electrode, and a second controlled electrode. The second transistor may include a control electrode, a first controlled electrode, and a second controlled electrode. The third transistor may include a control electrode, a first controlled electrode, and a second controlled electrode. The first controlled electrode of the first transistor may be in electrical connection with an end portion of the first cell electrode. The first controlled electrode of the second transistor may be in electrical connection with an end portion of the second cell electrode. The first controlled electrode of the third transistor may be in electrical connection with a further end portion of the second cell electrode.

In various embodiments, such as in a TLC employing the single port writing scheme, the second controlled electrode of the first transistor and the second controlled electrode of the second transistor may be in electrical connection with a source line. The second controlled electrode of the third transistor may be in electrical connection with a bit line. A further end portion of the first cell electrode may be in electrical connection with the bit line. The control electrode of the first transistor may be in electrical connection with a first word line. The control electrode of the second transistor may be in electrical connection with a second word line. The control electrode of the third transistor may be in electrical connection with a third word line.

Writing to the first magnetic free layer (of the first SOT MTJ) may include activating, i.e. turning on, the first transistor (via the first word line). The second transistor and the third transistor may be deactivated, i.e. turned off. The write current may flow through the first transistor and the first cell electrode.

Writing to the second magnetic free layer (of the second SOT MTJ) may include activating the second transistor (via the second word line) and the third transistor (via the third word line). The first transistor may be turned off. The write current may flow through the second transistor, the second cell electrode and the third transistor.

Writing to the third magnetic free layer (of the STT MTJ) may include activating the second transistor (via the second word line), and deactivating the first transistor and the third transistor.

Reading a state of the memory cell may include determining the resistance state of the first SOT MTJ, the resistance state of the second SOT MTJ, and the resistance state of the STT MTJ. The second transistor may be turned on to allow a read current to flow through the memory stack, i.e. flow through the second transistor, the first SOT MTJ, the second SOT MTJ, and the STT MTJ. The first transistor and the third transistor may be deactivated. The resistance state of the first SOT MTJ, the second SOT MTJ, and the STT MTJ may be determined by determining a read voltage of the read current. The resistance state of the first SOT MTJ, the resistance state of the STT MTJ and the resistance state SOT MTJ may be determined by determining a combined resistance of the first SOT MTJ, the STT MTJ, and the second SOT MTJ.

In various embodiments, the resistance of the first SOT MTJ, the resistance of the second SOT MTJ, and the resistance of the STT MTJ when they are in the same resistance state may be different. For instance, the resistance of the STT MTJ may be different from the resistance of the first SOT MTJ when both the STT MTJ and the first SOT MTJ are in the first resistance state, or when both the STT MTJ and the first SOT MTJ are in the second resistance state. The resistance of the STT MTJ may be different from the resistance of the second SOT MTJ when both the STT MTJ and the second SOT MTJ are in the first resistance state, or when both the STT MTJ and the second SOT MTJ are in the second resistance state. The difference in resistance may be made possible by the first SOT MTJ, the STT MTJ, and the second SOT MTJ having different thicknesses of insulating layers.

In various embodiments, such as in a memory cell, e.g. TLC, employing the dual port writing scheme, the second controlled electrode of the first transistor may be in electrical connection with a first source line. The second controlled electrode of the second transistor may be in electrical connection with a second source line. A further end of the first cell electrode may be in electrical connection with a first bit line. The second controlled electrode of the third transistor may be in electrical connection with a second bit line. The control electrode of the first transistor and the control electrode of the second transistor may be in electrical connection with a first word line. The control electrode of the third transistor may be in electrical connection with a second word line.

Writing to the first magnetic free layer (of the first SOT MTJ) may include activating the first transistor (via the first word line). Writing to the second magnetic free layer (of the second SOT MTJ) may include activating the second transistor (via the first word line) and the third transistor (via the second word line). Since the first magnetic free layer and the second magnetic free layer are written simultaneously, the first transistor and the second transistor may be turned on by the first word line, and the third transistor may be turned on by the second word line at the same time. A first write current may flow through the first transistor and the first cell electrode, while a second write current may flow through the second transistor, the second cell electrode, and the third transistor.

The third magnetic free layer (of the STT MTJ) may be written separately. The third transistor may be turned on by the second word line, but the first transistor and the second transistor may be turned off by the first word line. An STT write current may flow through the first SOT MTJ, the STT MTJ, the second SOT MTJ, and the third transistor to write to the third magnetic free layer.

Reading a state of the TLC may include determining the resistance state of the first SOT MTJ, the resistance state of the second SOT MTJ, and the resistance state of the STT MTJ. The third transistor may be activated or turned on to allow a read current to flow through the memory stack, i.e. flow through the first SOT MTJ, the STT MTJ, and the second SOT MTJ. The first transistor and the second transistor may be deactivated. A read current may flow through the first SOT MTJ, the STT MTJ, the second SOT MTJ, and the third transistor. The resistance state of the first SOT MTJ, the resistance state of the STT MTJ and the resistance state SOT MTJ may be determined by determining a read voltage of the read current. The resistance state of the first SOT MTJ, the resistance state of the STT MTJ and the resistance state SOT MTJ may be determined by determining a combined resistance of the first SOT MTJ, the STT MTJ, and the second SOT MTJ.

In various embodiments, the resistance of the first SOT MTJ, the resistance of the second SOT MTJ, and the resistance of the STT MTJ when they are in the same resistance state may be different. For instance, the resistance of the STT MTJ may be different from the resistance of the first SOT MTJ when both the STT MTJ and the first SOT MTJ are in the first resistance state, or when both the STT MTJ and the first SOT MTJ are in the second resistance state. The resistance of the STT MTJ may be different from the resistance of the second SOT MTJ when both the STT MTJ and the second SOT MTJ are in the first resistance state, or when both the STT MTJ and the second SOT MTJ are in the second resistance state. The difference in resistance may be made possible by the first SOT MTJ, the STT MTJ, and the second SOT MTJ having different thicknesses of insulating layers.

Various embodiments may relate to a method of operating a memory array including a plurality of memory cells.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

The invention claimed is:

1. A memory cell comprising:
a first cell electrode;
a first insulator layer;
a first magnetic free layer between the first cell electrode and the first insulator layer;
a second cell electrode;
a second insulator layer;
a second magnetic free layer between the second cell electrode and the second insulator layer;
a magnetic pinned layer between the first insulator layer and the second insulator layer;
a first transistor in electrical connection with a first end of the first cell electrode;
a second transistor in electrical connection with a first end of the second cell electrode; and
a third transistor in electrical connection with a second end of the second cell electrode;
wherein a direction of magnetization of the first magnetic free layer is changeable in response to a current flowing between the first end and a second end of the first cell electrode due to spin-orbit torque (SOT) effect;
wherein a direction of magnetization of the second magnetic free layer is changeable in response to a current flowing between the first end and the second end of the second cell electrode due to spin-orbit torque (SOT) effect; and
wherein the magnetic pinned layer has a fixed direction of magnetization.

2. The memory cell according to claim 1, further comprising:
a further magnetic pinned layer between the first insulator layer and the second insulator layer; and
a spacer layer between the magnetic pinned layer and the further magnetic pinned layer;
wherein the magnetic pinned layer is between the first insulator layer and the spacer layer, and the further magnetic pinned layer is between the second insulator layer and the spacer layer; and
wherein the further magnetic pinned layer has a fixed direction of magnetization.

3. The memory cell according to claim 1,
wherein the first transistor comprises a control electrode, a first controlled electrode, and a second controlled electrode;
wherein the second transistor comprises a control electrode, a first controlled electrode, and a second controlled electrode;
wherein the third transistor comprises a control electrode, a first controlled electrode, and a second controlled electrode;

wherein the first controlled electrode of the first transistor is in electrical connection with the first end of the first cell electrode;
wherein the first controlled electrode of the second transistor is in electrical connection with the first end of the second cell electrode; and
wherein the first controlled electrode of the third transistor is in electrical connection with the second end of the second cell electrode.

4. The memory cell according to claim 3,
wherein the second controlled electrode of the first transistor and the second controlled electrode of the second transistor are in electrical connection with a source line;
wherein the second controlled electrode of the third transistor is in electrical connection with a bit line;
wherein the second end of the first cell electrode is in electrical connection with the bit line;
wherein the control electrode of the first transistor is in electrical connection with a first word line;
wherein the control electrode of the second transistor is in electrical connection with a second word line; and
wherein the control electrode of the third transistor is in electrical connection with a third word line.

5. The memory cell according to claim 3,
wherein the second controlled electrode of the first transistor is in electrical connection with a first source line;
wherein the second controlled electrode of the second transistor is in electrical connection with a second source line;
wherein the second end of the first cell electrode is in electrical connection with a first bit line;
wherein the second controlled electrode of the third transistor is in electrical connection with a second bit line;
wherein the control electrode of the first transistor and the control electrode of the second transistor are in electrical connection with a first word line; and
wherein the control electrode of the third transistor is in electrical connection with a second word line.

6. The memory cell according to claim 1, further comprising:
a third insulator layer, a third magnetic free layer, a spacer layer and a further magnetic pinned layer between the magnetic pinned layer and the second insulator layer;
wherein the third insulator layer is between the magnetic pinned layer and the third magnetic free layer;
wherein the further magnetic pinned layer is between the spacer layer and the second insulator layer;
wherein the spacer layer is between the third magnetic free layer and the further magnetic pinned layer;
wherein a direction of magnetization of the third magnetic free layer is changeable in response to a current flowing through the third magnetic free layer; and
wherein the further magnetic pinned layer has a fixed direction of magnetization.

7. The memory cell according to claim 6,
wherein the direction of magnetization of the third magnetic free layer is independently changeable in response to the current flowing through the third magnetic free layer due to spin-transfer torque (STT) effect.

8. The memory cell according to claim 6, further comprising:
a further spacer layer and another magnetic pinned layer between the magnetic pinned layer and the third insulator layer;
wherein the further spacer layer is between the magnetic pinned layer and the other magnetic pinned layer;
wherein the other magnetic pinned layer is between the further spacer layer and the third insulator layer; and
wherein the other magnetic pinned layer has a fixed direction of magnetization.

9. The memory cell according to claim 6,
wherein the first transistor comprises a control electrode, a first controlled electrode, and a second controlled electrode;
wherein the second transistor comprises a control electrode, a first controlled electrode, and a second controlled electrode;
wherein the third transistor comprises a control electrode, a first controlled electrode, and a second controlled electrode;
wherein the first controlled electrode of the first transistor is in electrical connection with the first end of the first cell electrode;
wherein the first controlled electrode of the second transistor is in electrical connection with the first end of the second cell electrode; and
wherein the first controlled electrode of the third transistor is in electrical connection with the second end of the second cell electrode.

10. The memory cell according to claim 9,
wherein the second controlled electrode of the first transistor and the second controlled electrode of the second transistor are in electrical connection with a source line;
wherein the second controlled electrode of the third transistor is in electrical connection with a bit line;
wherein the second end of the first cell electrode is in electrical connection with the bit line;
wherein the control electrode of the first transistor is in electrical connection with a first word line;
wherein the control electrode of the second transistor is in electrical connection with a second word line; and
wherein the control electrode of the third transistor is in electrical connection with a third word line.

11. The memory cell according to claim 9,
wherein the second controlled electrode of the first transistor is in electrical connection with a first source line;
wherein the second controlled electrode of the second transistor is in electrical connection with a second source line;
wherein the second end of the first cell electrode is in electrical connection with a first bit line;
wherein the second controlled electrode of the third transistor is in electrical connection with a second bit line;
wherein the control electrode of the first transistor and the control electrode of the second transistor are in electrical connection with a first word line; and
wherein the control electrode of the third transistor is in electrical connection with a second word line.

12. A memory array comprising a plurality of memory cells, each memory cell of the plurality of memory cell comprising:
a first cell electrode;
a first insulator layer;
a first magnetic free layer between the first cell electrode and the first insulator layer;
a second cell electrode;
a second insulator layer;
a second magnetic free layer between the second cell electrode and the second insulator layer;
a magnetic pinned layer between the first insulator layer and the second insulator layer;

a first transistor in electrical connection with a first end of the first cell electrode;

a second transistor in electrical connection with a first end of the second cell electrode; and a third transistor in electrical connection with a second end of the second cell electrode;

wherein a direction of magnetization of the first magnetic free layer is changeable in response to a current flowing between the first end and a second end of the first cell electrode due to spin-orbit torque (SOT) effect;

wherein a direction of magnetization of the second magnetic free layer is changeable in response to a current flowing between the first end and the second end of the second cell electrode due to spin-orbit torque (SOT) effect; and wherein the magnetic pinned layer has a fixed direction of magnetization.

13. The memory array according to claim 12, further comprising:

a row decoder and a column decoder configured to select one memory cell out of the plurality of memory cells.

14. The memory array according to claim 13, further comprising:

a write circuit configured to write to the selected memory cell; and a read circuit configured to read from the selected memory cell.

15. A method of forming a memory cell, the method comprising:

forming a first cell electrode;

forming a first insulator layer;

forming a first magnetic free layer between the first cell electrode and the first insulator layer;

forming a second cell electrode;

forming a second insulator layer;

forming a second magnetic free layer between the second cell electrode and the second insulator layer;

forming a magnetic pinned layer between the first insulator layer and the second insulator layer;

forming a first transistor in electrical connection with a first end of the first cell electrode;

forming a second transistor in electrical connection with a first end of the second cell electrode; and forming a third transistor in electrical connection with a second end of the second cell electrode;

wherein a direction of magnetization of the first magnetic free layer is changeable in response to a current flowing between the first end and the second end of the first cell electrode due to spin-orbit torque (SOT) effect;

wherein a direction of magnetization of the second magnetic free layer is changeable in response to a current flowing between the first end and the second end of the second cell electrode due to spin-orbit torque (SOT) effect; and wherein the magnetic pinned layer has a fixed direction of magnetization.

16. A method of operating a memory cell, the method comprising:

flowing a current between a first end and a second end of a first cell electrode to change a direction of magnetization of a first magnetic free layer between the first cell electrode and a first insulator layer due to spin-orbit torque (SOT) effect; and flowing a current between a first end and a second end of a second cell electrode to change a direction of magnetization of a second magnetic free layer between the second cell electrode and a second insulator layer due to spin-orbit torque (SOT) effect;

wherein the memory cell also comprises a magnetic pinned layer between the first insulator layer and the second insulator layer;

wherein the magnetic pinned layer has a fixed direction of magnetization; and wherein the memory cell also comprises:

a first transistor in electrical connection with a first end of the first cell electrode;

a second transistor in electrical connection with a first end of the second cell electrode; and a third transistor in electrical connection with a second end of the second cell electrode.

17. The method according to claim 16, wherein flowing the current between the first end and the second end of the first cell electrode and flowing the current between the first end and the second end of the second cell electrode are carried out at different time periods.

* * * * *